United States Patent
Tsuchimura et al.

(10) Patent No.: US 8,614,033 B2
(45) Date of Patent: Dec. 24, 2013

(54) RESIST FILM, RESIST COATED MASK BLANKS AND METHOD OF FORMING RESIST PATTERN USING THE RESIST FILM, AND CHEMICAL AMPLIFICATION TYPE RESIST COMPOSITION

(75) Inventors: Tomotaka Tsuchimura, Haibara-gun (JP); Takeshi Inasaki, Haibara-gun (JP); Hiroo Takizawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 32 days.

(21) Appl. No.: 13/367,512

(22) Filed: Feb. 7, 2012

(65) Prior Publication Data

US 2012/0214091 A1 Aug. 23, 2012

(30) Foreign Application Priority Data

Feb. 21, 2011 (JP) ................................ 2011-035229

(51) Int. Cl.
*G03F 1/20* (2012.01)
*G03C 5/00* (2006.01)

(52) U.S. Cl.
USPC ............ 430/5; 430/270.1; 430/296; 430/942

(58) Field of Classification Search
USPC .................................. 430/5, 270.1, 296, 942
See application file for complete search history.

(56) References Cited

U.S. PATENT DOCUMENTS

| | | | |
|---|---|---|---|
| 2007/0117043 | A1 | 5/2007 | Gonsalves |
| 2008/0090179 | A1 | 4/2008 | Takeda et al. |
| 2010/0227273 | A1 | 9/2010 | Hatakeyama et al. |
| 2010/0227274 | A1 | 9/2010 | Hatakeyama et al. |
| 2011/0159433 | A1 | 6/2011 | Takahashi et al. |

FOREIGN PATENT DOCUMENTS

| | | |
|---|---|---|
| JP | 5-307262 A | 11/1993 |
| JP | 8-015863 A | 1/1996 |
| JP | 2000-171977 A | 6/2000 |
| JP | 2002-156762 A | 5/2002 |
| JP | 2005-099558 A | 4/2005 |
| JP | 2006506480 A | 2/2006 |
| JP | 2007140289 A | 6/2007 |
| JP | 2008-095009 A | 4/2008 |
| JP | 2008102509 A | 5/2008 |
| JP | 2008-162101 A | 7/2008 |
| JP | 2009-086354 A | 4/2009 |
| JP | 2010-085971 A | 4/2010 |
| JP | 2010237661 A | 10/2010 |
| JP | 2010237662 A | 10/2010 |
| WO | 2004044017 A1 | 5/2004 |

OTHER PUBLICATIONS

Office Action dated May 6, 2013 from the Taiwanese Patent Office in a Taiwanese Application No. 101102071.

*Primary Examiner* — Christopher Young

(74) *Attorney, Agent, or Firm* — Sughrue Mion, PLLC

(57) ABSTRACT

A resist film formed by using a chemical amplification type resist composition containing (A) a high molecular compound having a structure wherein a hydrogen atom of a phenolic hydroxyl group is substituted by a group represented by the following general formula (I), (B) a compound generating an acid upon irradiation with actinic rays or radiation, and an organic solvent, and the film thickness is 10 to 200 nm.

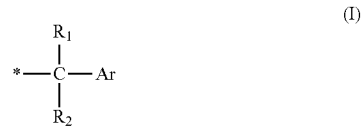

(I)

wherein, $R_1$ represents a hydrocarbon group, $R_2$ represents a hydrogen atom or a hydrocarbon group, and Ar represents an aryl group. $R_1$ may also bind to Ar to form a ring which may also contain a heteroatom. * represents a binding position with an oxygen atom of the phenolic hydroxyl group.

20 Claims, No Drawings

RESIST FILM, RESIST COATED MASK BLANKS AND METHOD OF FORMING RESIST PATTERN USING THE RESIST FILM, AND CHEMICAL AMPLIFICATION TYPE RESIST COMPOSITION

BACKGROUND OF THE INVENTION

1. Field of the Invention

The present invention relates to a resist film capable of forming a high precision pattern using an electron beam (EB) or extreme ultraviolet rays (EUV) and the like, which is very suitably used in ultramicrolithography or other fabrication processes such as the production of super LSI or high capacity microchips, resist coated mask blanks and a method of forming a resist pattern using the resist film, and a chemical amplification type resist composition. In particular, the present invention relates to a resist film used in a process using a substrate having a particular underlying layer, resist coated mask blanks and a method of forming a resist pattern using the resist film, and a chemical amplification type resist composition.

2. Description of the Related Art

Microfabrication using a resist composition requires, due to increasing integration of integrated circuits, the formation of ultrafine patterns. Hence, the exposure wavelength also tends to become shorter, for example, from g-rays to i-rays or further to excimer laser light, and for example, the development of the lithography technology using an electron beam is currently proceeding. In addition, due to the miniaturization of patterns to be formed, the thinning of resist films is also proceeding to prevent such a problem that the patterns collapse. In addition, as a resin which is used in a resist composition which forms a resist film of conventional thickness (0.5 µm to 1.0 µm), JP2000-171977A, JP1996-15863A (JP-H8-15863A), JP1993-307262A (JP-H5-307262A), and JP2002-156762A disclose resins having a structure wherein a hydrogen atom of a phenolic hydroxyl group is, for example, substituted with an arylmethyl group.

In order to form ultrafine patterns, the thinning of the resist is required, but which results in lowering of dry etching resistance. In addition, in electron beam lithography, in recent years, the acceleration voltage of an election beam (EB) is allowed to increase to reduce the effects of electron scattering in the resist film (forward scattering). In this case, the electron energy capture rate of the resist film decreases, and the sensitivity thereof decreases. In addition, the effect of the scattering of electrons reflected in the resist substance (back scattering) increases. In particular, in a case of forming isolated patterns with large exposure area, the effect of the back scattering increases, and the resolution of the isolated patterns decreases.

In particular, in a case of patterning onto photomask blanks which are used in semiconductor exposure, since there is a light-shielding film containing heavy atoms in the resist lower layer, the effect of the back scattering caused by the light-shielding film is more remarkable. Accordingly, in the case of forming the isolated patterns on the photomask blanks, in particular, there is a high possibility for the resolution to decrease.

As one way to solve these problems, the use of a resin having a polycyclic aromatic skeleton such as naphthalene has been studied (for example, JP2008-95009A, and JP2009-86354A), but the problems with regard to resolution of the isolated patterns have not been solved. JP2005-99558A uses, as one method for increasing the resolution of the isolated patterns, a resin which contains groups capable of adjusting solubility; however, the resolution has not reached a satisfactory level.

In addition, not only is the microfabrication by the resist composition used directly in the production of integrated circuits, but, in recent years, it has been applied to the preparation of a so-called imprint mold structure, and the like (for example, JP2008-162101A, and The Basis and the Technological Development and the Deployment of Application of Nanoimprint—the Fundamental Technology and the Latest Deployment of Technology of Nanoimprint—Editor: Yoshi-hiko HIRAI, Publisher: Frontier (published on June, 2006)). Therefore, the important problems to be solved by the invention should satisfy at the same time all of high sensitivity, high resolution (for example, high resolving power, excellent pattern profile, small line edge roughness (LER)), and good dry etching resistance, and a solution is needed to these problems.

SUMMARY OF THE INVENTION

An object of in the present invention is to provide a resist film, resist coated mask blanks and a method of forming a resist pattern using the resist film, and a chemical amplification type resist composition, which are capable of forming a pattern which satisfies at the same time all of high sensitivity, high resolution (for example, high resolving power, excellent pattern profile, small line edge roughness (LER)), and good dry etching resistance.

The object of the present invention is, in particular to provide a resist film, resist coated mask blanks and a method of forming a resist pattern using the resist film, and a chemical amplification type resist composition, which are capable of forming a pattern which satisfies all of the high sensitivity, high resolution (for example, high resolving power, excellent pattern profile, small line edge roughness (LER)), and good dry etching resistance at the same time, in the formation of fine patterns by the exposure using an electron beam or extreme ultraviolet rays.

As a result of intensive studies to solve these problems, the present inventors have found out that the above-described object can be attained by forming a thin resist film of a specific film thickness from a chemical amplification type resist composition which uses a high molecular compound having a specific structure.

That is, the resist film of the present invention obtained by solving the aforementioned problems is characterized by a resist film formed by using a chemical amplification type resist composition containing (A) a high molecular compound having a structure wherein a hydrogen atom of a phenolic hydroxyl group is substituted by a group represented by the following general formula (I), (B) a compound generating an acid upon irradiation with actinic rays or radiation, and (C) an organic solvent, and the film thickness is 10 to 200 nm.

wherein $R_1$ represents a hydrocarbon group, $R_2$ represents a hydrogen atom or a hydrocarbon group, and Ar represents an aryl group. $R_1$ may also bind to Ar to form a ring which may also contain a heteroatom. * represents a binding position with an oxygen atom of the phenolic hydroxyl group.

The preferred embodiments in the present invention are that the resist film used for an exposure to an electron beam or extreme ultraviolet rays, and that the high molecular compound (A) contains a repeating unit represented by the following general formula (II).

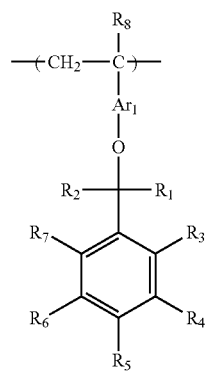

(II)

wherein, $Ar_1$ represents an arylene group, $R_1$ represents a hydrocarbon group, $R_2$ represents a hydrogen atom or a hydrocarbon group, each of $R_3$ to $R_7$ independently represents a hydrogen atom or a monovalent substituent, and $R_8$ represents a hydrogen atom or a hydrocarbon group. $R_1$ may also bind to any of $R_3$ to $R_7$ to form a ring which may also contain a heteroatom.

The particularly preferred embodiment is that the repeating unit represented by the general formula (II) is a repeating unit represented by the following general formula (V).

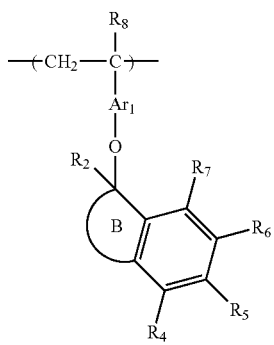

(V)

wherein, $Ar_1$ represents an arylene group, $R_2$ represents a hydrogen atom or a hydrocarbon group, each of $R_4$ to $R_7$ independently represents a hydrogen atom or a monovalent substituent, and $R_8$ represents a hydrogen atom or a hydrocarbon group. B represents an aliphatic hydrocarbon ring or an aliphatic hetero ring, which may be fused with an aromatic ring other than the benzene ring in the general formula (V).

The preferred embodiments in the present invention are also that the high molecular compound (A) further contains a repeating unit represented by the following general formula (III), that the acid generated from the compound (B) upon irradiation with actinic rays or radiation is an acid having a size of 130 Å³ or more in volume, and that the high molecular compound (A) further contains a repeating unit which has a group generating an acid upon irradiation with actinic rays or radiation in a side chain thereof, and a compound which provides the repeating unit is the same as the compound (B).

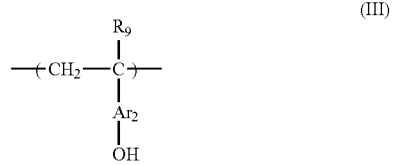

(III)

wherein $Ar_2$ represents an arylene group, and $R_9$ represents a hydrogen atom or a hydrocarbon group.

The preferred embodiments in the present invention are also that the dispersity of the high molecular compound (A) is from 1.0 to 1.2, and that the resist film further contain (D) a basic compound.

The present invention includes a resist coated mask blanks having the resist film.

In addition, the present invention also includes a resist pattern forming method, including: exposing and developing the resist film, and a resist pattern forming method, including: exposing and developing the resist coated mask blanks.

The preferred embodiment in the present invention is that the exposure is performed by using an electron beam or extreme ultraviolet rays.

The present invention also includes a chemical amplification type resist composition used in the resist pattern forming method.

The present invention can provide a resist film, resist coated mask blanks and a method of forming a resist pattern using the resist film, and a chemical amplification type resist composition, which are capable of forming a pattern which satisfies all of the high sensitivity, high resolution (for example, high resolving power, excellent pattern profile, small line edge roughness (LER)), and good dry etching resistance at the same time.

DESCRIPTION OF THE PREFERRED EMBODIMENTS

Hereinafter, the embodiments of the present invention will be further described in detail.

Furthermore, in the present specification, when a group (atomic group) is denoted without specifying whether substituted or unsubstituted, the group includes not only a group having no substituent but also a group having a substituent. For example, the term "an alkyl group" includes not only an alkyl group having no substituent (an unsubstituted alkyl group) but also an alkyl group having a substituent (a substituted alkyl group).

In the present invention, the term "actinic rays" or "radiation" means, for example, a bright line spectrum of mercury lamp, far ultraviolet rays typified by excimer laser, extreme ultraviolet rays (EUV light), an X-ray or an electron beam, and the like. Also, in the present invention, the term "light" means actinic rays or radiation. Furthermore, in the present specification, unless otherwise specified, the term "exposure" includes not only an exposure to a mercury lamp, a far ultraviolet ray typified by excimer laser, an X-ray, EUV light, and the like but also a lithography with a particle beam such as electron beam and an ion beam. In the following specification, "(from) xx to yy" means that it includes numerical values designated by "xx" and "yy" as a lower limit and an upper limit, respectively.

The resist film according to the present invention is a resist film which is formed by using a chemical amplification type resist composition containing (A) a high molecular compound having a structure wherein a hydrogen atom of a phenolic hydroxyl group is substituted by a group of the following general formula (I), (B) a compound generating an acid upon irradiation with actinic rays or radiation, and an organic solvent, wherein the film thickness is 10 to 200 nm.

The resist film according to the present invention has a film thickness of 10 nm or more, thereby obtaining a sufficient dry etching resistance, and has a film thickness of 200 nm or less, which enables the prevention of the problem that patterns collapse even in a case of forming a fine pattern with the irradiation of actinic rays or radiation (in particular, an electron beam (EB) or extreme ultraviolet ray (EUV)).

The resist film and the chemical amplification type resist composition according to the present invention are preferably used for the exposure to an electron beam or extreme ultraviolet rays.

The resist film and the chemical amplification type resist composition according to the present invention may be a negative resist film and a negative type chemical amplification resist composition or may be a positive resist film and a positive type chemical amplification resist composition.

Hereinafter, the resist film of the present invention, and a chemical amplification type resist composition forming the resist film will be described in detail.

[1] (A) High Molecular Compound

The chemical amplification type resist composition forming the resist film according to the present invention contains (A) a high molecular compound having a structure wherein a hydrogen atom of a phenolic hydroxyl group is substituted by a group represented by the following formula (I).

The present invention uses, as a main component a high molecular compound having a phenolic hydroxyl group, wherein a part of the phenolic hydroxyl group is substituted by a group represented by the following general formula (I).

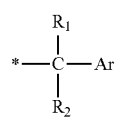

wherein, $R_1$ represents a hydrocarbon group, $R_2$ represents a hydrogen atom or a hydrocarbon group, and Ar represents an aryl group. $R_1$ may also bind to Ar to form a ring which may also contain a heteroatom. * represents a binding position with an oxygen atom of the phenolic hydroxyl group.

The general formula (I) is a site which has a function of controlling an alkali developing property of the high molecular compound which contains the repeating unit having a phenolic hydroxyl group. The structure wherein the hydrogen atom of the phenolic hydroxyl group is substituted by the group represented by the general formula (I) is decomposed by the action of an acid to generate the phenolic hydroxyl group.

The reason that the formation of a resist film having a specific thin film thickness by the chemical amplification type resist composition containing the high molecular compound (A) having a specific structure described above enables the formation of a pattern which satisfies all of the high sensitivity, high resolution (for example, high resolving power, excellent pattern profile, small line edge roughness (LER)), and good dry etching resistance at the same time is uncertain, but is presumed as follows. It is considered that since the group represented by the general formula (I) has an aryl group, it enables even thin resist film to have high dry etching resistance. In addition, while the details are not certain, the group represented by the general formula (I) is considered to contribute to increase the generation efficiency of an acid which generates upon irradiation with actinic rays or radiation, and thus it is presumed that high sensitivity and high resolution are obtained. In particular, in the exposure to the electron beam or extreme ultraviolet ray, it is considered that the group represented by the general formula (I) contributes to efficiently acquire secondary electrons which generate in the system, and thus it is presumed that high sensitivity and high resolution are attained.

Hereinafter, the group represented by the general formula (I) will be described.

In the general formula (I), $R_1$ represents a hydrocarbon group. The carbon number of the hydrocarbon group represented by $R_1$ is preferably 1 to 12, more preferably 1 to 6. The hydrocarbon group represented by $R_1$ is preferably an alkyl group, an aryl group, more preferably an alkyl group having a carbon number of 1 to 4, and phenyl group, which may have a substituent. The examples of the substituent include an alkyl group (preferably having a carbon number of 1 to 6), a halogen atom, a hydroxyl group, an alkoxy group (preferably having a carbon number of 1 to 6), a carboxyl group, a carbonyl group, and an alkoxycarbonyl group (preferably having a carbon number of 2 to 7), and the like, preferably an alkyl group, and alkoxy group, more preferably an alkyl group having a carbon number of 1 to 4, and an alkoxy group having a carbon number of 1 to 4. $R_1$ may also bind to Ar to form a ring which may also contain a heteroatom (an oxygen atom, or a sulfur atom). The example of the ring which is formed by binding of $R_1$ and Ar includes a ring as the B described below, and the preferred range is also the same as each other.

$R_2$ represents a hydrogen atom or a hydrocarbon group. The carbon number of the hydrocarbon group represented by $R_2$ is preferably 1 to 12, more preferably 1 to 6. $R_2$ is preferably a hydrogen atom, an alkyl group, and an aryl group, more preferably a hydrogen atom, an alkyl group having a carbon number of 1 to 4, and a phenyl group, which may be substituted or unsubstituted. The specific examples and the preferred ranges of the substituent which $R_2$ may have, are the same as those of the substituent which $R_1$ may have $R_2$ may bind to $R_1$ to form a ring.

Ar represents an aryl group. The carbon number of the aryl group represented by Ar is preferably 6 to 20, more preferably 6 to 15. Ar is preferably a phenyl group, a naphthyl group, an anthracenyl group, more preferably a phenyl group and naphthyl group, which may have a substituent. The specific examples and the preferred ranges of the substituent which Ar may have, are the same as those of the substituent which $R_1$ may have.

The structure wherein the phenolic hydroxyl group is substituted by the group represented by the general formula (I) is preferably included as a side chain of the repeating unit represented by the following general formula (II). That is to say, it is preferable that the high molecular compound (A) of the present invention contain the repeating unit represented by the following general formula (II).

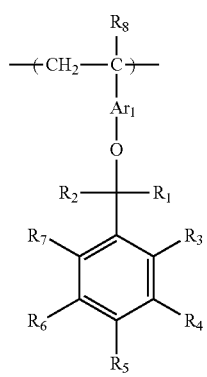

(II)

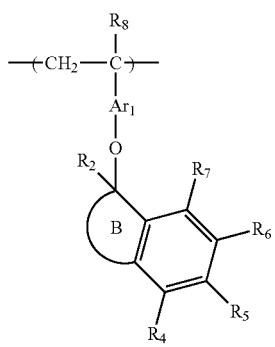

(V)

wherein, $Ar_1$ represents an arylene group, $R_1$ represents a hydrocarbon group, $R_2$ represents a hydrogen atom or a hydrocarbon group, each of $R_3$ to $R_7$ independently represents a hydrogen atom or a monovalent substituent, and $R_8$ represents a hydrogen atom or a hydrocarbon group. $R_1$ may also bind to any of $R_3$ to $R_7$ to form a ring which may also contain a heteroatom.

In the general formula (II), the specific examples and the preferred ranges of $R_1$ and $R_2$ are the same as those of $R_1$ and $R_2$ in the general formula (I).

$Ar_1$ represents an arylene group. $Ar_1$ is preferably an arylene group having a carbon number of 6 to 18, more preferably, a phenylene group, and a naphthylene group, and most preferably a phenylene group.

The arylene group represented by $Ar_1$, may have a substituent, in addition to the group represented by the above-described —OC($R_1$)($R_2$)-Ph($R_3$)($R_4$)($R_5$)($R_6$)($R_7$), and the examples of the substituent include the same substituent as the specific examples and the preferred ranges of the aforementioned substituent which $R_1$ may have.

Each of $R_3$ to $R_7$ independently represents a hydrogen atom or a monovalent substituent. Each of $R_3$ to $R_7$ is independently preferably, a hydrogen atom, an alkyl group (preferably having a carbon number of 1 to 30, more preferably a carbon number of 1 to 6, still more preferably a methyl group), an alkyl group wherein a part or all of the alkyl group are substituted with a halogen atom (preferably having a carbon number of 1 to 30, more preferably a carbon number of 1 to 6), an alkoxy group (preferably having a carbon number of 1 to 30, more preferably a carbon number of 1 to 6, still more preferably a methoxy group), an acyl group (preferably having a carbon number of 2 to 30, more preferably a carbon number of 2 to 6), an alkoxycarbonyl group (preferably having a carbon number of 2 to 30, more preferably a carbon number of 2 to 6), an aryl group (preferably having a carbon number of 6 to 10), and a halogen atom, more preferably a hydrogen atom, an alkyl group, an alkoxy group, and still more preferably a hydrogen atom.

In addition, any of $R_3$ to $R_7$ may also bind to $R_1$ to form a ring which may also contain a heteroatom (an oxygen atom, or a sulfur atom, and the like). The example of the ring which is formed by binding of $R_1$ and any of $R_3$ to $R_7$ includes a ring as the B described below, and the preferred range is also the same as each other. When $R_1$ may bind to any of $R_3$ to $R_7$ to form a ring, it is preferable that $R_1$ bind to $R_3$ or $R_7$.

$R_8$ represents a hydrogen atom or a hydrocarbon group. $R_8$ represents preferably a hydrogen atom, or an alkyl group (preferably having a carbon number of 1 to 6, more preferably a carbon number of 1 to 3), and more preferably a hydrogen atom or a methyl group, and most preferably a hydrogen atom.

It is preferable that the repeating unit represented by the general formula (II) be a repeating unit represented by the following general formula (V) in view of dry etching resistance.

wherein, $Ar_1$ represents an arylene group, $R_2$ represents a hydrogen atom or a hydrocarbon group, each of $R_4$ to $R_7$ independently represents a hydrogen atom or a monovalent substituent, and $R_8$ represents a hydrogen atom or a hydrocarbon group. B represents an aliphatic hydrocarbon ring or an aliphatic hetero ring, which may be fused with an aromatic ring other than the benzene ring in the general formula (V).

$Ar_1$, $R_2$, $R_4$ to $R_7$, and $R_8$ in the general formula (V), are the same as $Ar_1$, $R_2$, $R_4$ to $R_7$, and $R_8$ in the general formula (II), and the preferred ranges thereof are also the same as each other.

B represents an aliphatic hydrocarbon ring or an aliphatic hetero ring, which may be fused with an aromatic ring other than the benzene ring in the general formula (V). The examples of the aromatic ring other than the benzene ring in the general formula (V), which may be fused with the aliphatic hydrocarbon ring or the aliphatic hetero ring of B include an aromatic hydrocarbon ring having a carbon number of 6 to 18, such as a benzene ring, a naphthalene ring, an anthracene ring, a florene ring and a phenanthrene ring, or an aromatic hetero ring containing a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, a benzene ring and a naphthalene ring are preferable in view of resolution, and a benzene ring is most preferable. These aromatic rings may have a substituent, and the examples of the substituent thereof are the same as the specific examples and the preferred ranges of substituent which the aforementioned $R_1$ may have.

The aliphatic hydrocarbon ring or the aliphatic hetero ring of B is preferably a 4- to 8-membered ring, more preferably a 5- or 6-membered ring.

The specific examples of B include the following (B-1) to (B-19). In addition, the carbon atoms of *1 to *3 in the specific examples correspond to the carbon atoms of *1 to *3 denoted in the following general formula (V).

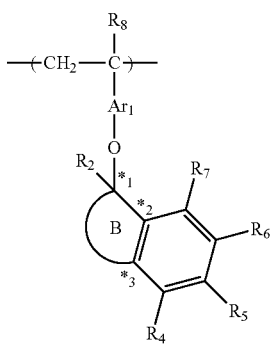

(V)

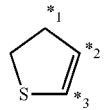
(B-10)

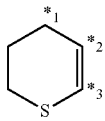
(B-11)

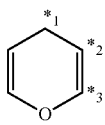
(B-12)

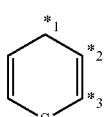
(B-13)

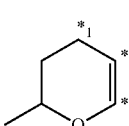
(B-14)

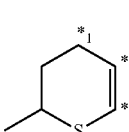
(B-15)

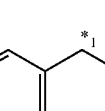
(B-16)

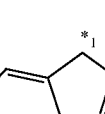
(B-17)

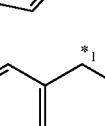
(B-18)

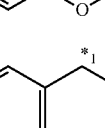
(B-19)

As the examples of B, among the above-described (B-1) to (B-19), in view of the dry etching resistance, (B-1) to (B-5), (B-8), (B-9), and (B-17) are preferable, and (B-1), (B-2), (B-8), (B-9), and (B-17) are more preferable.

In the repeating units represented by the general formulae (II) and (V), when $Ar_1$ is a benzene ring, the substitution position of the phenolic hydroxyl group of which the hydrogen atom is substituted by the group represented by the general formula (I) may be a para, meta or ortho position, relative to the binding position of the benzene ring with the polymer main chain, but the para or meta position is preferable, and the para position is more preferable.

The specific examples of the repeating unit having a structure wherein the hydrogen atom of the phenolic hydroxyl group is substituted by the group represented by the general formula (I), the repeating unit represented by the general formula (II) or (V) are illustrated below.

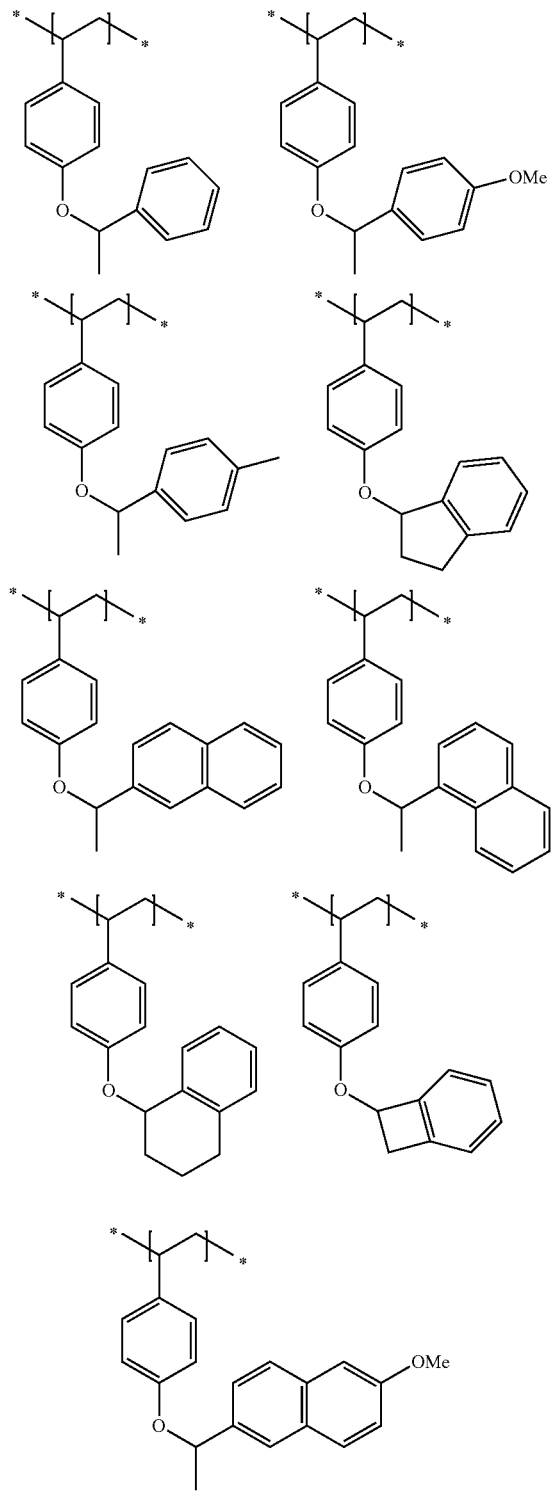
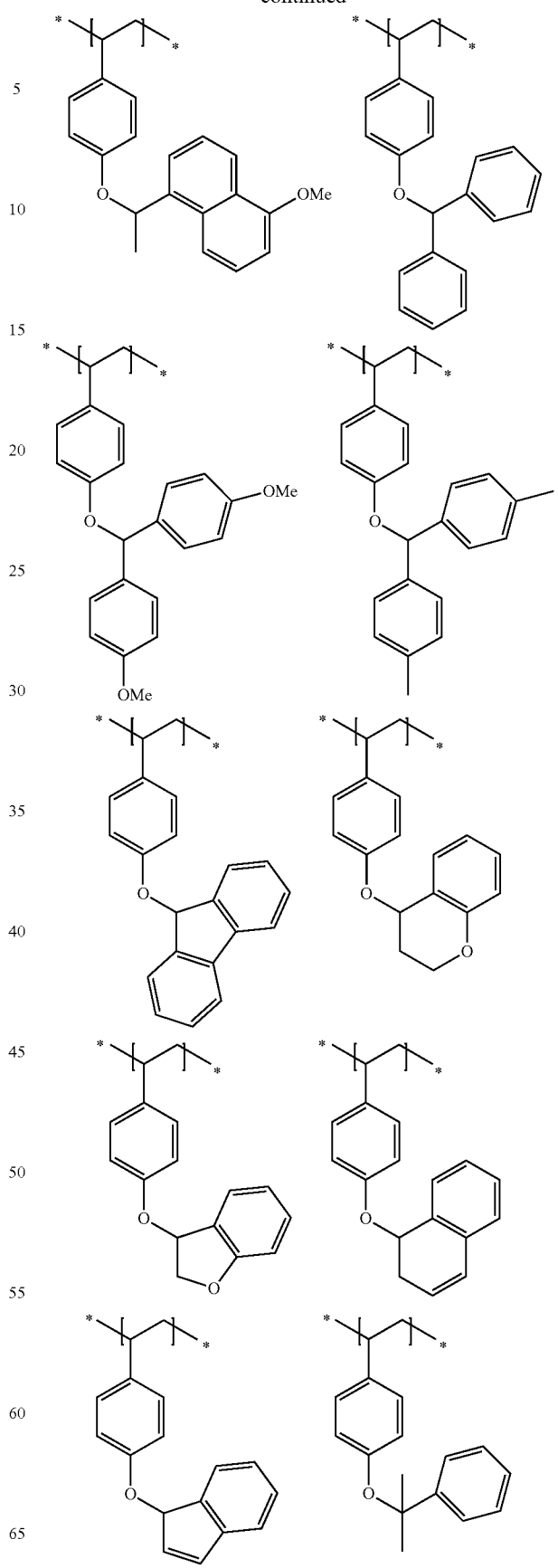

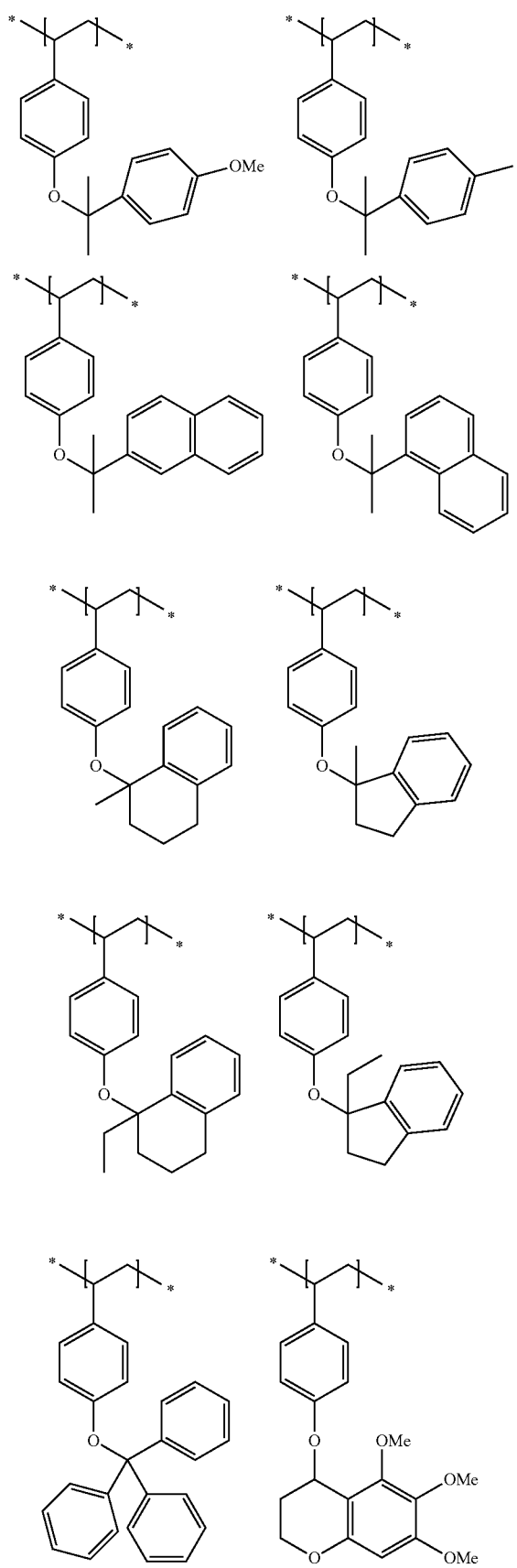
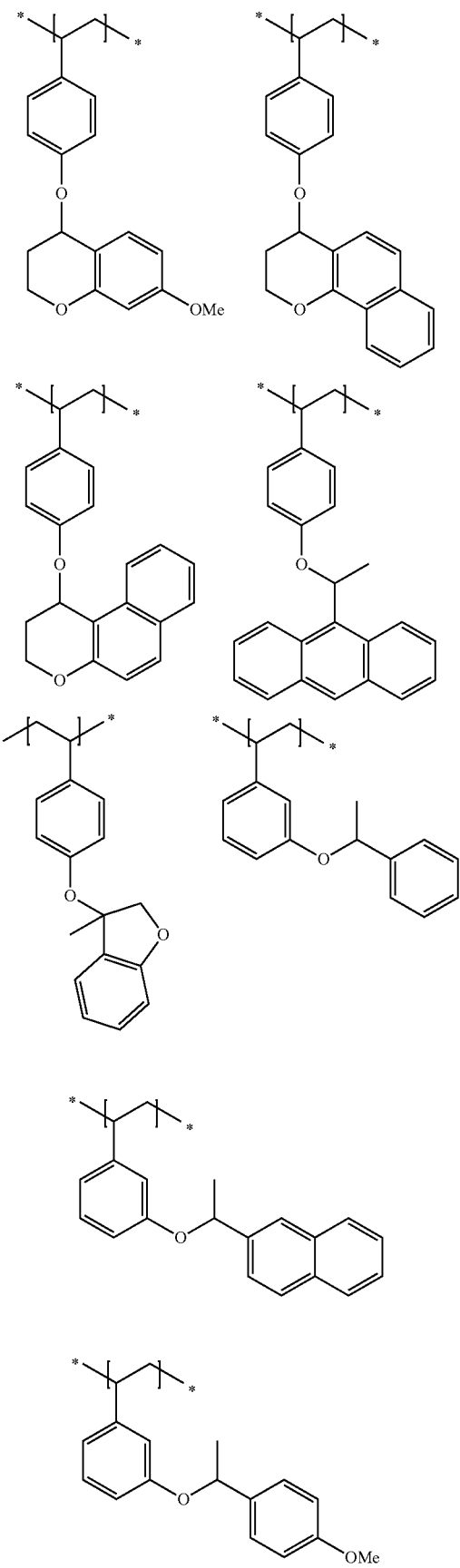

-continued

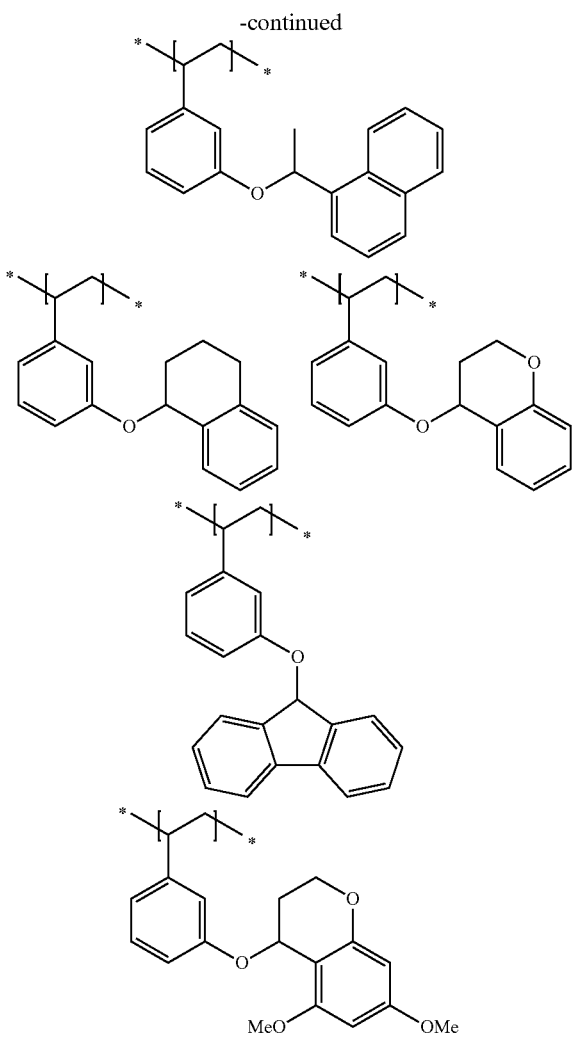

The content of the repeating unit having a structure wherein the hydrogen atom of the phenolic hydroxyl group is substituted by the group represented by the general formula (I) (for example, the repeating unit represented by the general formula (II) or (V)) is generally the range of from 1 to 50 mol %, preferably the range of from 3 to 40 mol %, based on all repeating units in the high molecular compound (A).

It is preferable that the high molecular compound (A) of the present invention further contain a repeating unit represented by the following general formula (III).

Next, the repeating unit represented by the general formula (III) will be described.

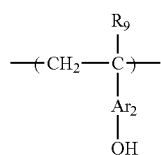

(III)

wherein $Ar_2$ represents an arylene group, and $R_9$ represents a hydrogen atom or a hydrocarbon group.

$R_9$ in the repeating unit represented by the general formula (III) represents a hydrogen atom or a hydrocarbon group. $R_9$ is preferably a hydrogen atom or an alkyl group (preferably having a carbon number of 1 to 6, more preferably a carbon number of 1 to 3), more preferably a hydrogen atom or a methyl group, and particularly preferably a hydrogen atom.

$Ar_2$ in the repeating unit represented by the general formula (III) represents an arylene group, and may have a substituent other than —OH. The arylene group of $Ar_2$ is preferably an arylene group having a carbon number of 6 to 18, which may have a substituent, more preferably a phenylene group or a naphthylene group which may have a substituent, and still more preferably a phenylene group which may have a substituent. While the examples of the substituent which $Ar_2$ may have include the same substitute as the specific examples and the preferred ranges of the substituent which the aforementioned $R_1$ may have, it is preferable that the arylene group represented by $Ar_2$ do not have a substituent other than —OH.

In the repeating unit represented by the general formula (III), when $Ar_2$ is a phenylene group, the binding position of —OH to the benzene ring of $Ar_2$ may be any of para, meta and ortho positions, relative to the binding position of the benzene ring with the polymer main chain, but the para or meta position is preferable.

The repeating unit represented by the general formula (III) has a function of controlling the alkali developing property of the resist with a repeating unit having an alkali-soluble group.

The preferred examples of the repeating unit represented by the general formula (III) will be illustrated below.

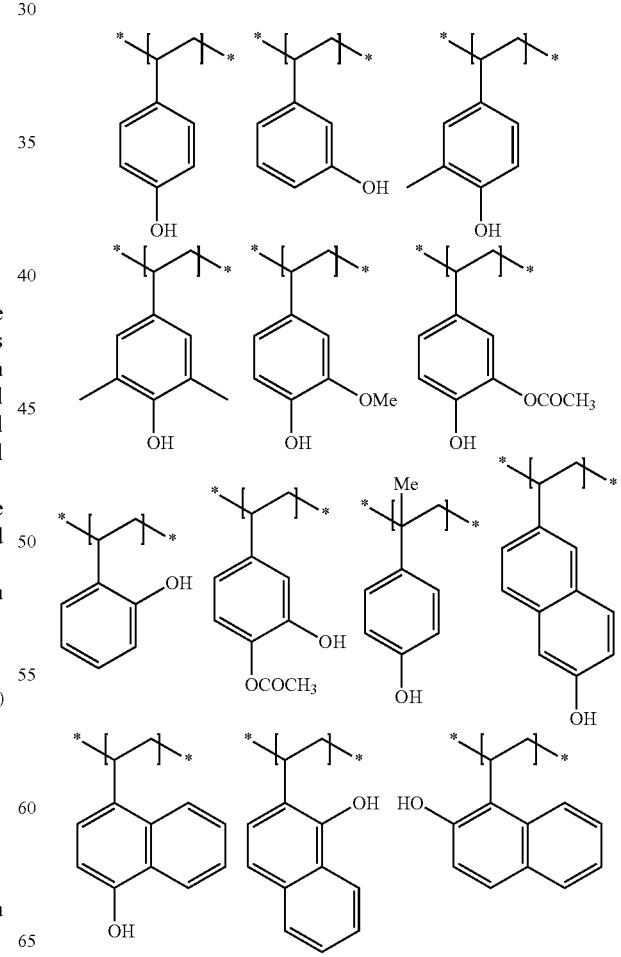

Among these, the preferred examples of the repeating unit represented by the general formula (III) is a repeating unit wherein $Ar_2$ is an unsubstituted phenylene group, and include those illustrated below.

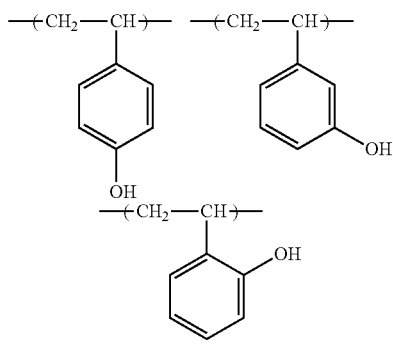

In a case where the composition of the present invention is a positive resist composition, the content of the repeating unit represented by the general formula (III) is preferably 3 to 90 mol %, more preferably 5 to 80 mol %, and still more preferably 7 to 70 mol %, based on all repeating units in the high molecular compound (A). In a case where the composition of the present invention is a negative resist composition, the content of the repeating unit represented by the general formula (III) is preferably 60 to 99 mol %, more preferably 70 to 98 mol %, and still more preferably 75 to 98 mol %, based on all repeating units in the high molecular compound (A).

It is also preferable that the high molecular compound (A) used in the present invention further have, as a repeating unit other than the repeating unit having a structure wherein the hydrogen atom of the phenolic hydroxyl group is substituted by the group represented by the general formula (I) (for example, the repeating unit represented by the general formula (II) or (V)), and the repeating unit represented by the general formula (III), the repeating unit as described below. In addition, needless to say, a total content of the repeating units contained in the high molecular compound (A) does not exceed 100 mol %.

For example, in a case where the chemical amplification type resist composition of the present invention is used as a positive resist composition, it is preferable that the high molecular compound (A) further contain, in addition to the repeating unit having a structure wherein the hydrogen atom of the phenolic hydroxyl group is substituted by the group represented by the general formula (I) (for example, the repeating unit represented by the general formula (II) or (V)), a repeating unit having a group which decomposes by the action of an acid to generate an alkali-soluble group (hereinafter, sometimes referred to as a "a repeating unit having an acid-decomposable group").

The examples of the alkali-soluble group include a phenolic hydroxyl group, a carboxyl group, a fluorinated alcohol group, a sulfon acid group, a sulfonamide group, a sulfonimide group, (alkyl sulfonyl) (alkylcarbonyl) methyl group, (alkyl sulfonyl) (alkylcarbonyl) imide group, bis(alkylcarbonyl) methyl group, bis(alkylcarbonyl) imide group, bis(alkylsulfonyl) methyl group, bis(alkylsulfonyl) imide group, tris (alkylcarbonyl) methylene group, and tris(alkylsulfonyl) methylene group.

The examples of the preferred alkali-soluble group include a phenolic hydroxyl group, a carboxyl group, a fluorinated alcohol group (preferably hexafluoroisopropanol), and sulfonic acid group.

The preferred group of the acid-decomposable group is a group where a hydrogen atom of the alkali-soluble group thereof is replaced by a group leaving by the action of an acid.

The examples of the group leaving by the action of an acid include $-C(R_{36})(R_{37})(R_{38})$, $-C(R_{36})(R_{37})(OR_{39})$, and $-C(R_{01})(R_{02})(OR_{39})$.

In the above formulae, each of $R_{36}$ to $R_{39}$ represents independently an alkyl group, a cycloalkyl group, a monovalent aromatic ring group, a group from the combination of an alkylene group with a monovalent aromatic ring group, or alkenyl group. $R_{36}$ and $R_{37}$ may bind together to form a ring.

Each of $R_{01}$ to $R_{02}$ represents independently a hydrogen atom, an alkyl group, a cycloalkyl group, a monovalent aromatic ring group, a group from the combination of an alkylene group with a monovalent aromatic ring group, or alkenyl group.

As the repeating unit having a group which decomposes by the action of an acid to generate an alkali-soluble group, a repeating unit represented by the following general formula (IV) has a high reactivity, and a low sensitivity variation in a post bake and manufacturing process variability, and therefore is preferable. The repeating unit represented by the general formula (IV) is a repeating unit having an acetal group or a ketal group which decomposes by the action of an acid to form an alkali-soluble group on the side chain thereof. The composition having the repeating unit represented by the general formula (IV) can be suitably used as a positive resist composition.

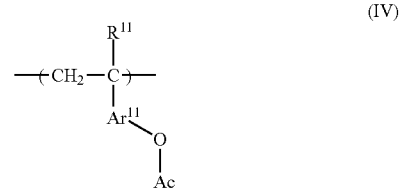

wherein $R^{11}$ represents a hydrogen atom or a methyl group, $Ar^{11}$ represents an arylene group, Ac is a group leaving by the action of an acid, and —OAc is an acetal group or a ketal group which decomposes by the action of an acid to generate an alkali-soluble group.

As the repeating unit represented by the general formula (IV), the preferred compound which is used in the present invention will be described below.

$R^{11}$ in the general formula (IV) represents a hydrogen atom or a methyl group, but is particularly preferably a hydrogen atom.

$Ar^{11}$ in the general formula (IV) represents an arylene group, and may have a substituent. The arylene group of $Ar^{11}$ is preferably an arylene group having a carbon number of 6 to 18, which may have a substituent, more preferably a phenylene group or a naphthylene group which may have a substituent, and most preferably a phenylene group which may have a substituent. The examples of the substituent which $Ar^{11}$ may have include alkyl group, a halogen atom, a hydroxyl group, an alkoxy group, a carboxyl group, and an alkoxycarbonyl group.

In the repeating unit represented by the general formula (IV), when $Ar^{11}$ is a phenylene group, the binding position of —OAc to the benzene ring of $Ar^{11}$ may be any of para, meta and ortho positions, relative to the binding position of the benzene ring with the polymer main chain, but the para or meta position is preferable.

In the general formula (IV), Ac is a group leaving by the action of an acid, and —OAc represents an acetal group or a ketal group which decomposes by the action of an acid to generate an alkali-soluble group. It is preferable that Ac be, specifically, a group represented by the following general formula (VI).

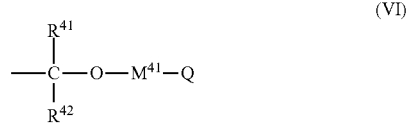

(VI)

In the general formula (VI), each of $R^{41}$ and $R^{42}$ represent independently a hydrogen atom, an alkyl group, a cycloalkyl group, an aryl group or an aralkyl group.

$M^{41}$ represents a single bond or a divalent linking group.

Q represents an alkyl group, an alicyclic group which may have a heteroatom, or an aromatic ring group which may have a heteroatom.

In addition, at least two of $R^{41}$, $R^{42}$, $M^{41}$ and Q may bind together to form a ring. It is preferable that this ring be a 5- or 6-membered ring.

The examples of alkyl group of $R^{41}$ and $R^{42}$ include an alkyl group having a carbon number of 1 to 8. The preferred examples thereof include a methyl group, an ethyl group, a propyl group, an isopropyl group, n-butyl group, sec-butyl group, tert-butyl group, a hexyl group and an octyl group.

The examples of the cycloalkyl group of $R^{41}$ and $R^{42}$ include a cycloalkyl group having a carbon number of 3 to 15. The preferred examples thereof include a cyclohexyl group, a norbornyl group and an adamantyl group.

The examples of the aryl group of $R^{41}$ and $R^{42}$ include an aryl group having a carbon number of 6 to 15. The preferred examples thereof include a phenyl group, a tolyl group, naphthyl group and anthryl group.

The examples of the aralkyl group of $R^{41}$ and $R^{42}$ include an aralkyl group having a carbon number of 6 to 20. Preferably, the examples thereof include a benzyl group and a phenethyl group.

As $R^{41}$ and $R^{42}$, particularly preferred are a hydrogen atom, a methyl group, a phenyl group and a benzyl group. In addition, it is preferable that at least one of $R^{41}$ and $R^{42}$ be a hydrogen atom (That is to say, —OAc is an acetal group which decomposes by the action of an acid to generate an alkali-soluble group).

The divalent linking group of $M^{41}$ is, for example an alkylene group (preferably an alkylene group having a carbon number of 1 to 8, for example a methylene group, an ethylene group, a propylene group, a butylene group, a hexylene group or an octylene group), a cycloalkylene group (preferably a cycloalkylene group having a carbon number of 3 to 15, for example a cyclopentylene group or a cyclohexylene group), —S—, —O—, —CO—, —CS—, —SO$_2$—, —N(R$_0$)—, or a combination of two or more thereof, and those having the total carbon number of 20 or less are preferred. Herein, $R_0$ is a hydrogen atom or an alkyl group (for example, an alkyl group having carbon number of 1 to 8, specifically, a methyl group, an ethyl group, a propyl group, n-butyl group, sec-butyl group, a hexyl group and an octyl group, and the like).

$M^{41}$ is preferably a single bond, an alkylene group, or a divalent linking group consisting of a combination of an alkylene group with at least one of —O—, —CO—, —CS— and —N(R$_0$)—, and more preferably a single bond, an alkylene group, or a divalent linking group consisting of a combination of an alkylene group with —O—. Here, the definition of $R_0$ is the same as the aforementioned $R_0$.

The alkyl group of Q is, for example the same as the alkyl group in $R^{41}$ and $R^{42}$ described above.

The examples of the alicyclic group and the aromatic ring group of Q include the cycloalkyl group and the aryl group as $R^{41}$ and $R^{42}$ described above. The carbon number thereof is preferably 3 to 15. In addition, in the present invention, a group in which plural aromatic rings are linked via a single bond (for example, a biphenyl group, or a terphenyl group) is also included in the aromatic group as Q.

The examples of the alicyclic group having a heteroatom and the aromatic ring group having a heteroatom include thiirane, cyclothiorane, thiophene, furan, pyrrole, benzothiophen, benzofuran, benzopyrrole, triazine, imidazole, benzoimidazole, triazole, thiadiazole, thiazole and pyrrolidone. In addition, in the present invention, a group in which plural "aromatic rings having a hetero atom" are linked via a single bond (for example, a viologen group) is also included in the aromatic group as Q.

The alicyclic group and the aromatic ring group of Q may have a substituent, and the examples thereof include an alkyl group, a cycloalkyl group, a cyano group, a halogen atom, a hydroxyl group, an alkoxy group, a carboxyl group and an alkoxycarbonyl group.

As (-$M^{41}$-Q), particularly preferred are a methyl group, an aryloxyethyl group, a cyclohexylethyl group or an arylethyl group.

The examples of the case where at least two of $R^{41}$, $R^{42}$, $M^{41}$ and Q bind together to form a ring include a case where any one of $M^{41}$ and Q binds to $R^{41}$ to form a propylene group or a butylene group and to form a 5- or 6-membered ring containing an oxygen atom.

When the sum of the carbon number of $R^{41}$, $R^{42}$, $M^{41}$ and Q are referred to as $N_C$, in a case where $N_C$ is large, since the change of the alkali dissolution rate of the high molecular compound (A) before and after the group represented by the general formula (VI) leaves, increases and the contrast of the dissolution improves, and thus this case is preferable. The range of $N_C$ is preferably 4 to 30, further preferably 7 to 25, and particularly preferably 7 to 20. When $N_C$ is 30 or less, the decrease of the glass transition temperature of the high molecular compound (A) is suppressed, and the decrease of the exposure latitude (EL) of the resist is suppressed, or the remaining defects on the resist pattern due to the residue after the leaving of the group represented by the general formula (VI) is suppressed, and there this case is preferable.

In addition, it is preferable that at least one of $R^{41}$, $R^{42}$, $M^{41}$ and Q contain an alicyclic or aromatic ring in view of dry etching resistance. The alicyclic group and the aromatic ring group herein are, for example the same as the alicyclic group and the aromatic ring group as Q described above.

As the repeating unit having a group which decomposes by the action of an acid to generate an alkali-soluble group, a repeating unit represented by the following general formula (VII) is also preferable. The repeating unit represented by the general formula (VII) is a repeating unit which decomposes by the action of an acid to generate a carboxyl group as an alkali-soluble group on the side chain thereof. The composition having the repeating unit represented by the general formula (VII) can be suitably used as a positive resist composition.

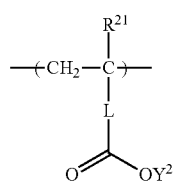

(VII)

wherein $R^{21}$ represents a hydrogen atom or a methyl group, L is a single bond or a divalent linking group, and $Y^2$ represents a group leaving by the action of an acid.

As the repeating unit represented by the general formula (VII), the preferred compound which is used in the present invention will be described below.

$R^{21}$ in the general formula (VII) represents a hydrogen atom or a methyl group, but is particularly preferably a hydrogen atom.

In a case where L is a divalent linking group, the example thereof include alkylene group, a cycloalkylene group, an arylene group, —O—, —SO$_2$—, —CO—, —N(R$_N$)—, and a combination of a plurality of them, and the like. Herein, $R_N$ represents an aryl group, an alkyl group or a cycloalkyl group.

The alkylene group of L has preferably a carbon number of 1 to 10. The examples thereof include preferably, a methylene group, an ethylene group, a propylene group, a butylene group, a hexylene group and an octylene group.

The cycloalkylene group of L has preferably a carbon number of 5 to 10, and the examples thereof include a cyclopentylene group and a cyclohexylene group.

The arylene group of L has preferably a carbon number of 4 to 20, and the examples thereof include a phenylene group and naphthylene group, and the like.

The aryl group of $R_N$ has preferably a carbon number of 4 to 20, and more preferably a carbon number of 6 to 14. The examples of this aryl group include a phenyl group and naphthyl group.

The alkyl group of $R_N$ has preferably a carbon number of 1 to 8. The examples of this alkyl group include a methyl group, an ethyl group, a propyl group, a butyl group, a hexyl group and an octyl group.

The cycloalkyl group of $R_N$ has preferably a carbon number of 5 to 8. The examples of this cycloalkyl group include a cyclopentyl group and a cyclohexyl group.

Each group of L may further have a substituent, and the specific examples of this substituent can include the same as those described as the substituent which the arylene group as the aforementioned $Ar^{11}$ may further have.

$Y^2$ represents a group leaving by the action of an acid, and specifically, a group represented by the following general formula is preferable.

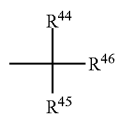

Each of $R^{44}$ to $R^{46}$ represents independently an alkyl group or a cycloalkyl group. The two of $R^{44}$ to $R^{46}$ may bind together to form a cycloalkyl group.

The alkyl group of $R^{44}$ to $R^{46}$ is preferably a linear or branched alkyl group having a carbon number of 1 to 4.

The cycloalkyl group of $R^{44}$ to $R^{46}$ is preferably a monocyclic cycloalkyl group having a carbon number of 3 to 8 or a polycyclic cycloalkyl group having a carbon number of 7 to 20.

The cycloalkyl group which may be formed by binding two of $R^{44}$ to $R^{46}$ together is preferably a monocyclic cycloalkyl group having a carbon number of 3 to 8 or a polycyclic cycloalkyl group having a carbon number of 7 to 20. Among them, a cycloalkyl group having a carbon number of 5 to 6 is particularly preferable. Further preferred is an embodiment that $R^{46}$ is a methyl group or an ethyl group, and $R^{44}$ and $R^{45}$ bind together to form the aforementioned cycloalkyl group.

It is also preferable that $Y^2$ be a group represented by the following general formula.

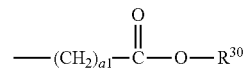

Wherein, $R^{30}$ represents a tertiary alkyl group having a carbon number of 4 to 20, preferably 4 to 15, a trialkylsilyl group having a carbon number of 1 to 6, an oxoalkyl group having a carbon number of 4 to 20 or a group represented by the above-described —C($R^{44}$)($R^{45}$)($R^{46}$). The specific examples of the tertiary alkyl group include tert-butyl group, tert-amyl group, 1,1-diethylpropyl group, 1-ethylcyclopentyl group, 1-butylcyclopentyl group, 1-ethylcyclohexyl group, 1-butylcyclohexyl group, 1-ethyl-2-cyclopentenyl group, 1-ethyl-2-cyclohexenyl group and 2-methyl-2-adamantyl group, and the like. The specific examples of trialkylsilyl group include a trimethylsilyl group, a triethylsilyl group, dimethyl-tert-butylsilyl group, and the like. The specific examples of oxoalkyl group include 3-oxocyclohexyl group, 4-methyl-2-oxooxan-4-yl group, and 5-methyl-2-oxooxolan-5-yl, and the like. a1 is an integer of 1 to 6.

Next, while specific examples of the repeating unit having a group which decomposes by the action of an acid to generate an alkali-soluble group will be illustrated, the present invention is not limited thereto.

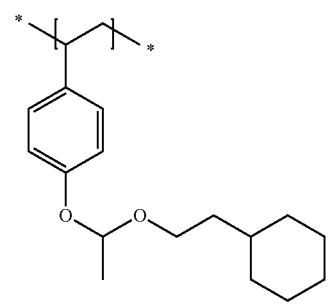

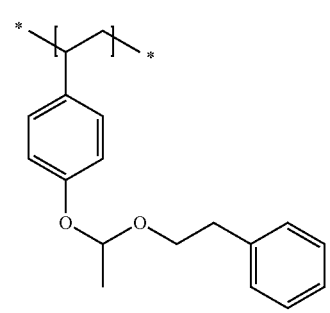

23
-continued
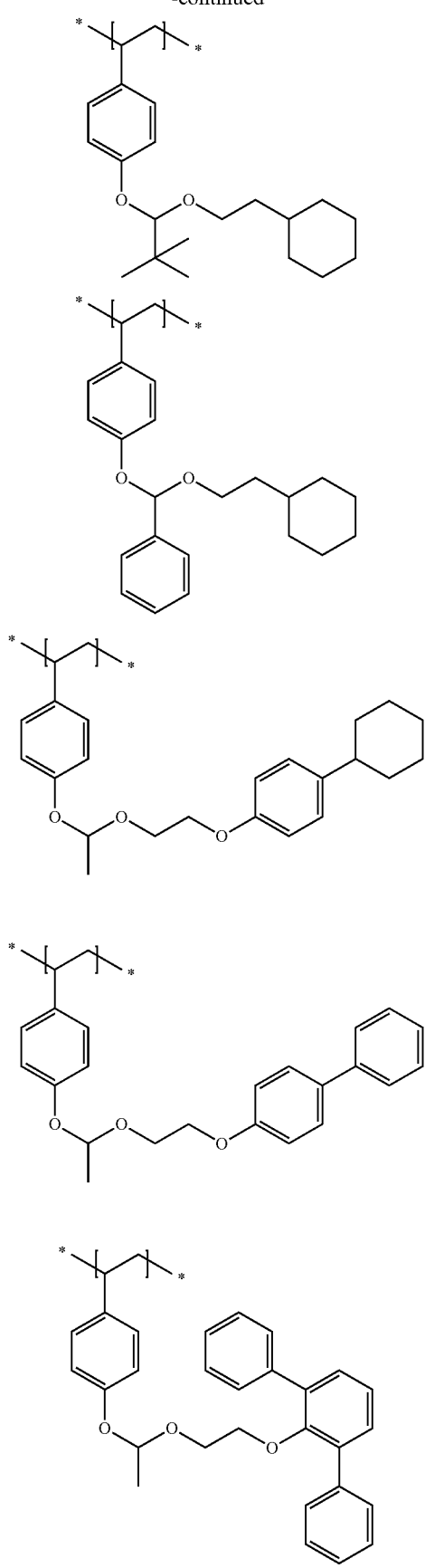
24
-continued
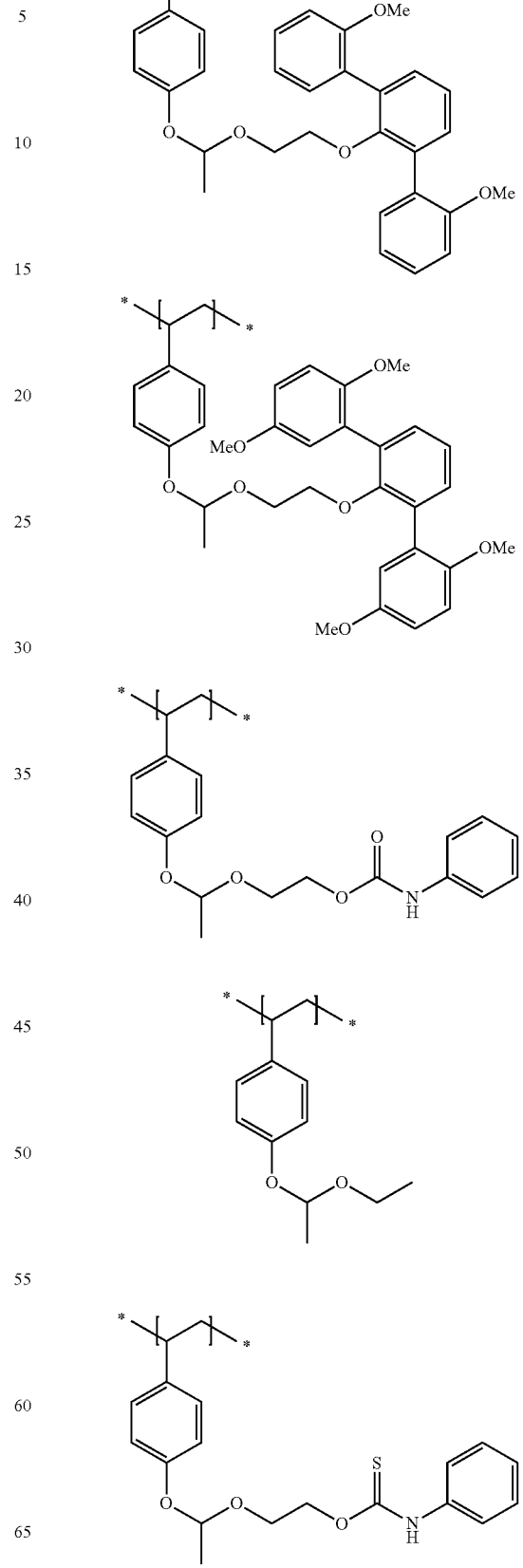

25
-continued
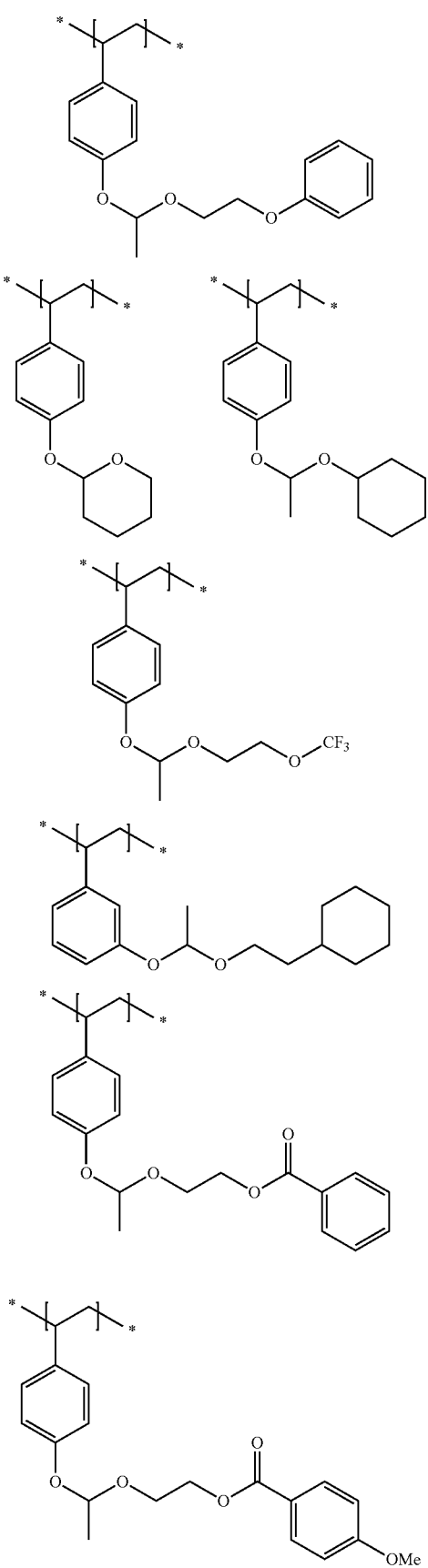
26
-continued
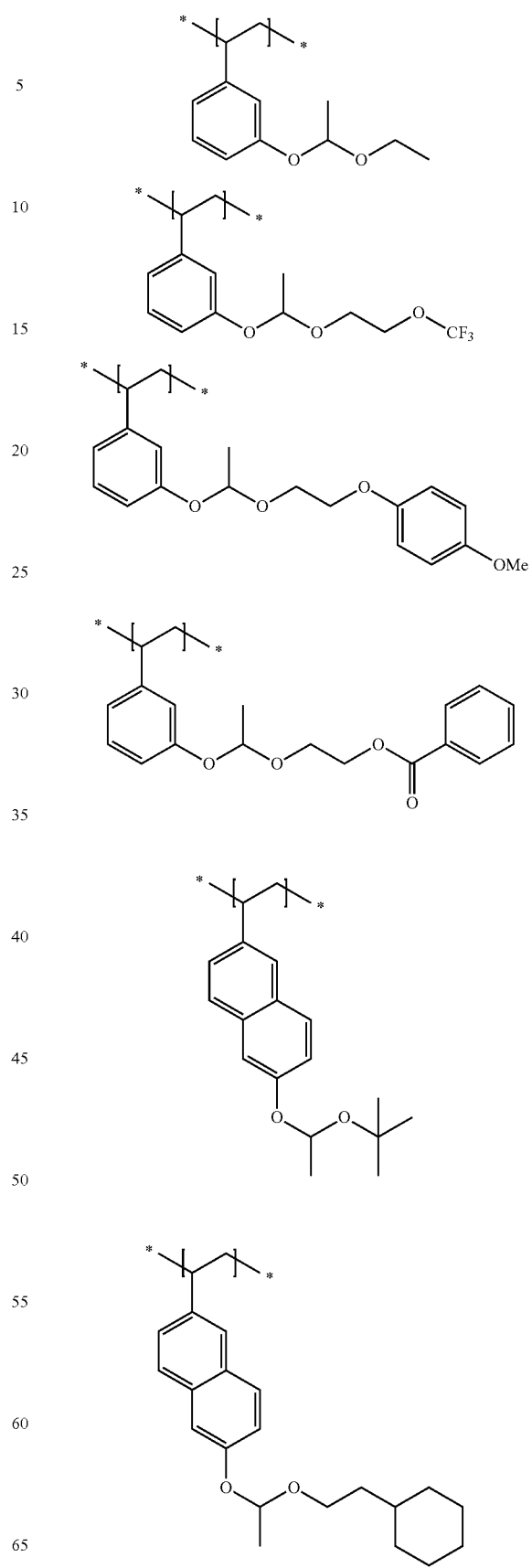

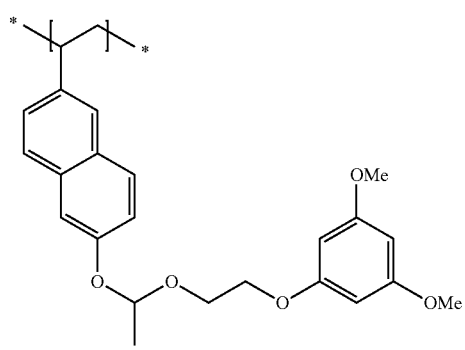
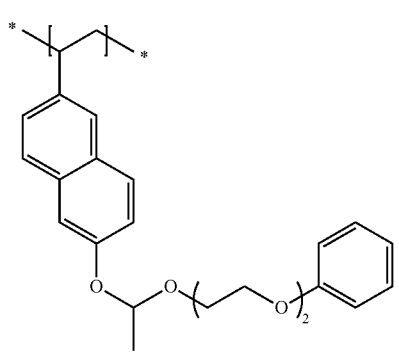
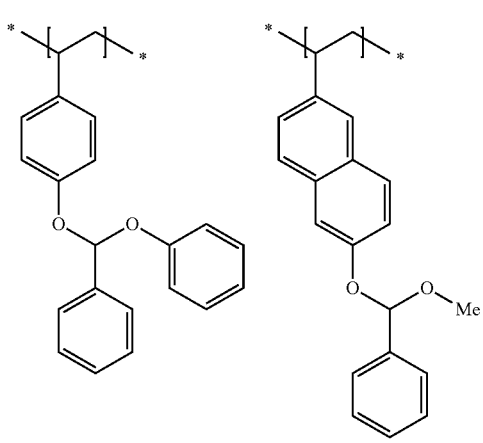
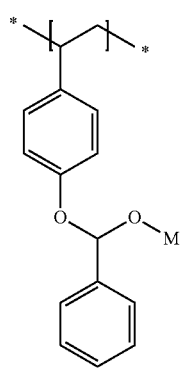
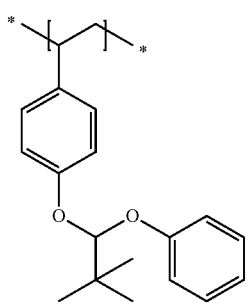
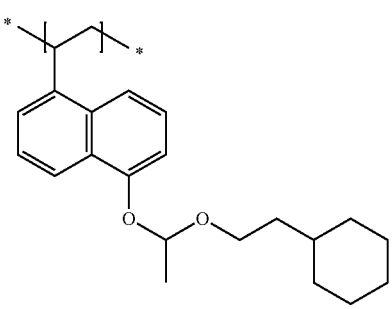
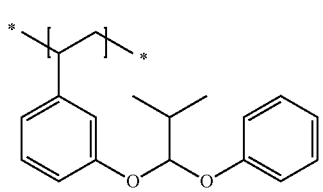
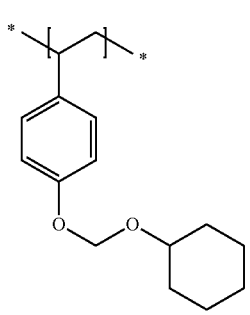
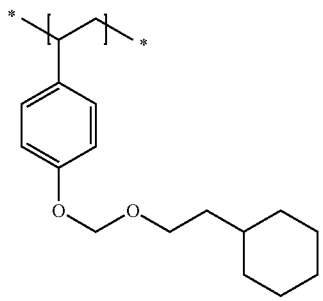

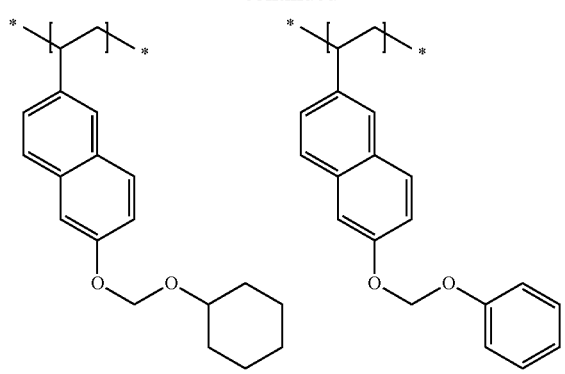
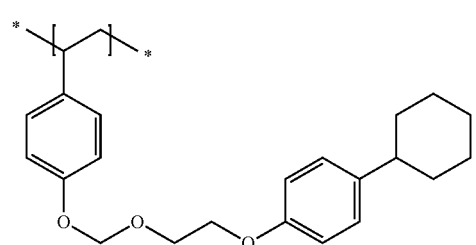
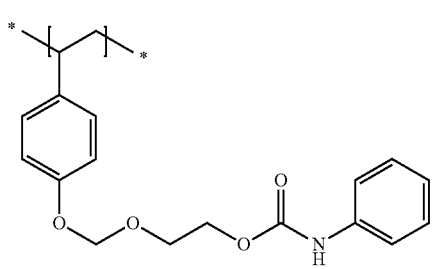
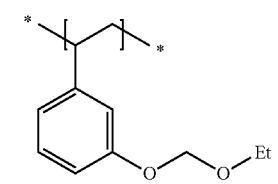
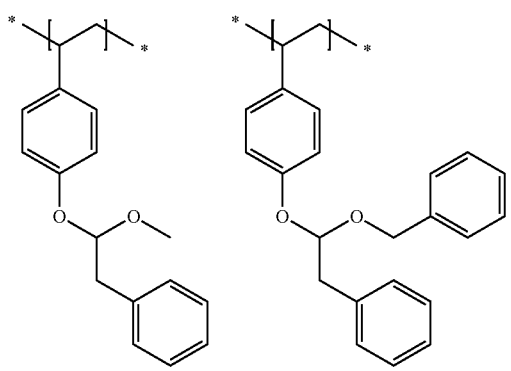

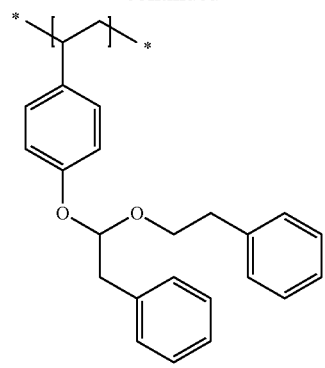
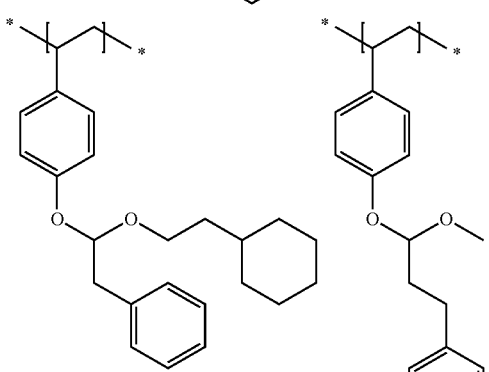
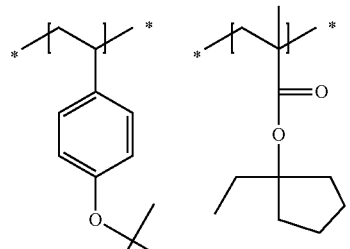
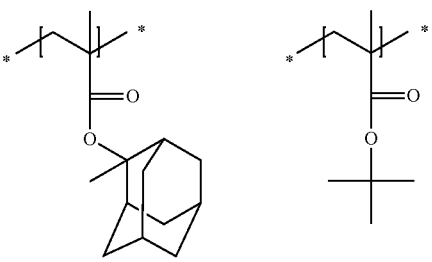

In the high molecular compound (A) in a case where the chemical amplification type resist composition of the present invention is used as a positive resist composition, in addition to the repeating unit having a structure wherein the hydrogen atom of the phenolic hydroxyl group is substituted by the group represented by the general formula (I) (for example, repeating unit represented by the general formula (II) or (V)), the content of a repeating unit which decomposes by the action of an acid to generate an alkali-soluble group, is preferably 3 to 90 mol %, more preferably 5 to 80 mol %, and still more preferably 7 to 70 mol %, based on all repeating units in the high molecular compound (A).

It is also preferable that the high molecular compound (A) used in the present invention further have, as a repeating unit other than the aforementioned repeating unit, a repeating unit as described below.

For example, in a case where the chemical amplification type resist composition of the present invention is used as a positive resist composition, further, a repeating unit having a group which decomposes by the action of an alkali developing solution to increase dissolution rate into the alkali developing solution is included. The examples of this group include a group having a lactone structure and a group having a phenyl ester structure, and the like. As the repeating unit having a group which decomposes by the action of an alkali developing solution to increase the dissolution rate into the alkali developing solution, the repeating unit represented by the following general formula (AII) is more preferable.

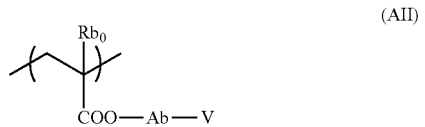

(AII)

In the general formula (AII), V represents a group which decomposes by the action of an alkali developing solution to increase the dissolution rate into the alkali developing solution, $Rb_0$ represents a hydrogen atom or a methyl group, and Ab represents a single bond or a divalent organic group.

V, as a group which decomposes by the action of an akali developing solution, is a group having an ester bond, and among them, the group having a lactone structure is more preferable. While any group which has a lactone structure can be used as the group having the lactone structure, a 5- to 7-membered lactone structure is preferable, and a structure wherein other ring structure is fused with a 5- to 7-membered lactone structure in a form of forming a bicyclo structure, or Spiro structure, is preferable.

Preferable Ab represents a single bond or a divalent linking group represented by -AZ-$CO_2$— (AZ is an alkylene group or an aliphatic ring group). Preferable AZ is a methylene group, an ethylene group, a cyclohexylene group, an adamantly group and norbornyl group.

Next, the specific examples are illustrated below. In the formulae, Rx represents H or $CH_3$.

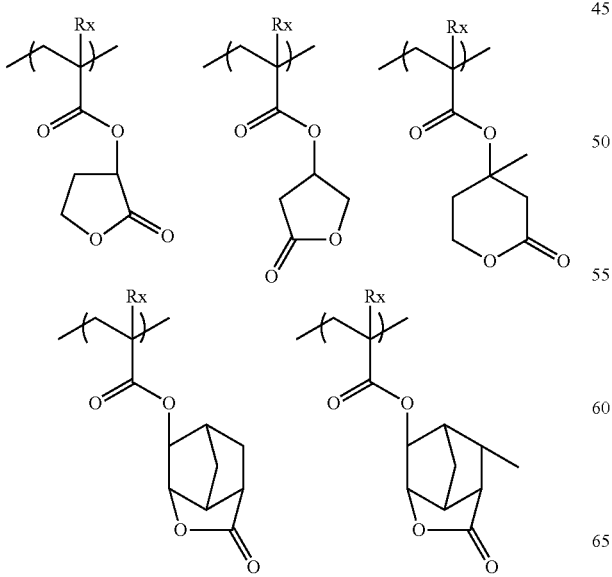

-continued

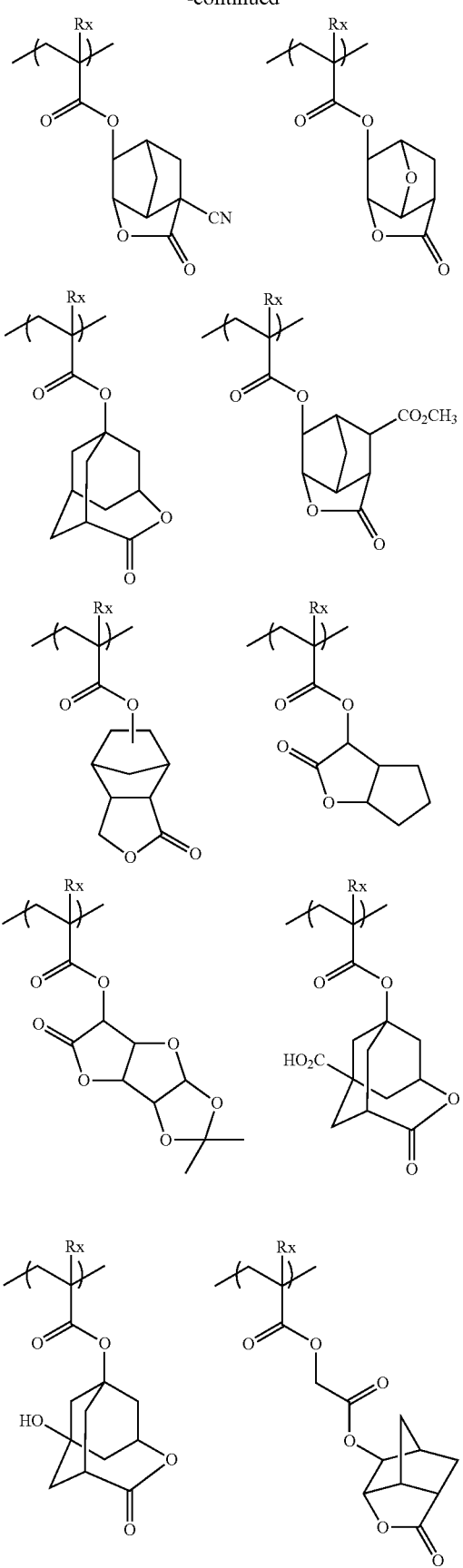

-continued
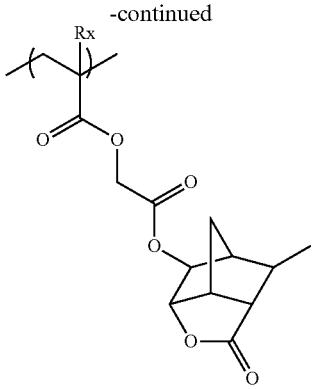
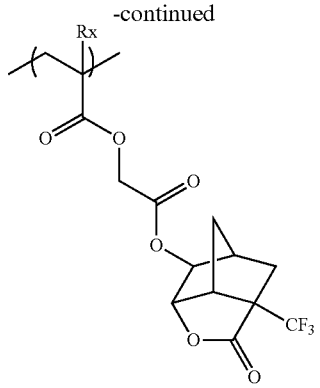
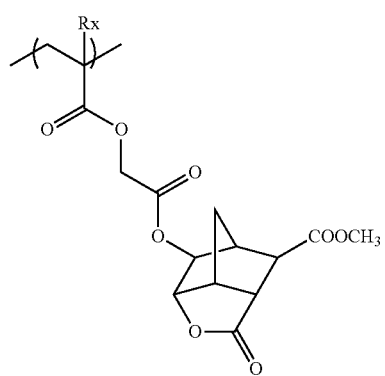
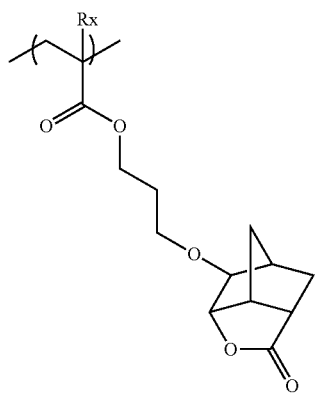
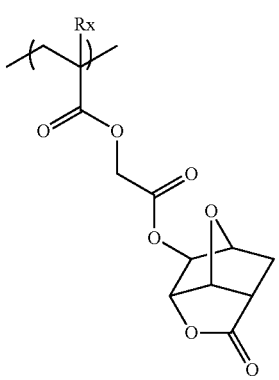
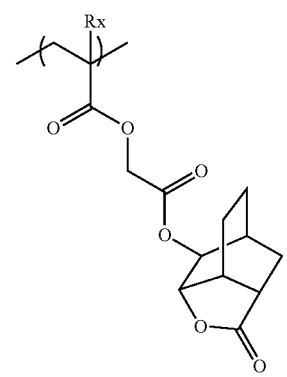
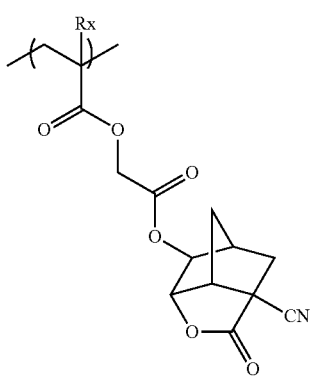
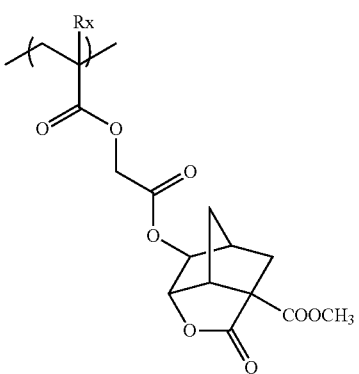

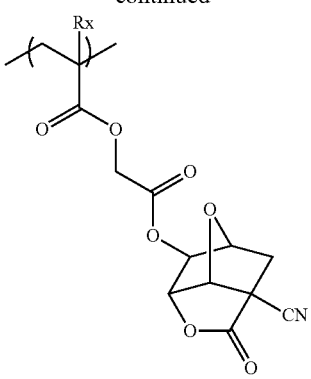

While the high molecular compound (A) of the present invention in a case where the chemical amplification type resist composition of the present invention is used as a positive resist composition, may contain or may not contain a repeating unit having a group which decomposes by the action of an alkali developing solution to increase dissolution rate into the alkali developing solution, the case of having the group, the content of the repeating unit having the above group is preferably 5 to 60 mol %, more preferably 10 to 50 mol %, and still more preferably 10 to 40 mol %, based on all repeating units in the high molecular compound (A).

It is also preferable that the high molecular compound (A) used in the present invention, apart from the aforementioned group, further have a repeating unit having a group generating an acid upon irradiation with the actinic rays or radiation (hereinafter, also referred to as a "photoacid generating group" on the side chain thereof. In this case, the a compound (B) generating an acid upon irradiation with actinic rays or radiation, which is an essential component of the present invention, is not an independent compound, and is said to be a constituent of the high molecular compound (A) involved in the present invention. That is to say, as one embodiment of the present invention, it is also preferable that the high molecular compound (A) further contain a repeating unit having a group of capable of generating an acid upon irradiation with the actinic rays or radiation on the side chain thereof, and a compound which provides the repeating unit be the same as the aforementioned compound (B).

The examples of the repeating unit having a photoacid generating group include the repeating units described in JP1997-325497A (JP-H9-325497A), paragraph [0028], and the repeating units described in JP2009-93137A, paragraphs [0038] to [0041]. Additionally, in this case, this repeating unit having a photoacid generating group can be considered to correspond to the compound (B) generating an acid upon irradiation with actinic rays or radiation.

Next, the specific examples of the monomer corresponding to the repeating unit having a photoacid generating group (which are illustrated as the structure of the acid generated by the exposure to EB or EUV) are illustrated.

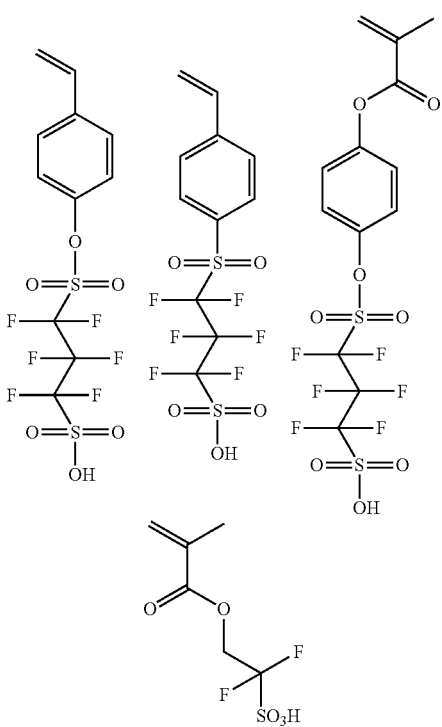

In a case where the high molecular compound contains the repeating unit having a photoacid generating group, the content of the repeating unit having the photoacid generating group is preferably 1 to 40 mol %, more preferably 5 to 35 mol %, and still more preferably 5 to 30 mol %, based on all repeating units in the high molecular compound (A).

The examples of the polymerizable monomer for forming a repeating unit other than the repeating units described above in the high molecular compound (A) include styrene, alkyl substituted styrene, alkoxy substituted styrene, O-alkylated styrene, O-acylated styrene, hydrogenated hydroxystyrene, maleic anhydride, acrylic acid derivatives (acrylic acid, acrylic acid ester, and the like), methacrylic acid derivatives (methacrylic acid, methacrylic acid ester, and the like), N-substituted maleimide, acrylonitrile, methacrylonitrile, vinyl naphthalene, vinyl anthracene, indene which may have a substituent, a polymerizable monomer having an alcoholic hydroxyl group wherein α-position is substituted with a fluoroalkyl group, and the like. As the substituted styrene, 4-(1-naphthylmethoxy)styrene, 4-benzyloxy styrene, 4-(4-cholorobenzyloxy)styrene, 3-(1-naphthyl methoxy)styrene, 3-benzyloxy styrene, 3-(4-cholorobenzyloxy)styrene, and the like are preferable.

While the high molecular compound (A) may contain or may not contain the repeating units other than these repeating unit, in a case of containing the repeating units, the content of these other repeating units in the high molecular compound (A) is generally 1 to 20 mol % and preferably 2 to 10 mol %, based on all repeating units constituting the high molecular compound (A).

The high molecular compound (A) used in the present invention can be synthesized, for example by subjecting an unsaturated monomer corresponding to each repeating unit to a radical, cationic or anionic polymerization. In addition, it can be also synthesized by using an unsaturated monomer corresponding to the precursor of each repeating unit to polymerize a polymer and thereafter, modifying the synthesized polymer with a low molecular compound to convert to a desired repeating unit. In either case, by using a living polymerization such as a living anionic polymerization, the molecular weight distribution of the obtained high molecular compound becomes uniform and thus both cases are preferable.

The weight-average molecular weight of the high molecular compound (A) used in the present invention is preferably 1000 to 200000, more preferably 2000 to 50000, and still more preferably 2000 to 15000. The preferable dispersity of the high molecular compound (A) (molecular weight distribution) (Mw/Mn) is, in view of sensitivity, from 1.0 to 1.7, more preferably 1.0 to 1.2. The weight-average molecular weight (Mw), number-average molecular weight (Mn), and dispersity (Mw/Mn) of the high molecular compound (A) are defined by GPC measurements (solvent: THF, column: available from TOSOH CORPORATION TSK gel Multipore HXL-M, column temperature: 40° C., flow rate: 1.0 mL/min, detector: RI) in terms of standard polystyrene.

Next, while specific examples of the high molecular compound (A) used in the present invention will be illustrated, the present invention is not limited thereto.

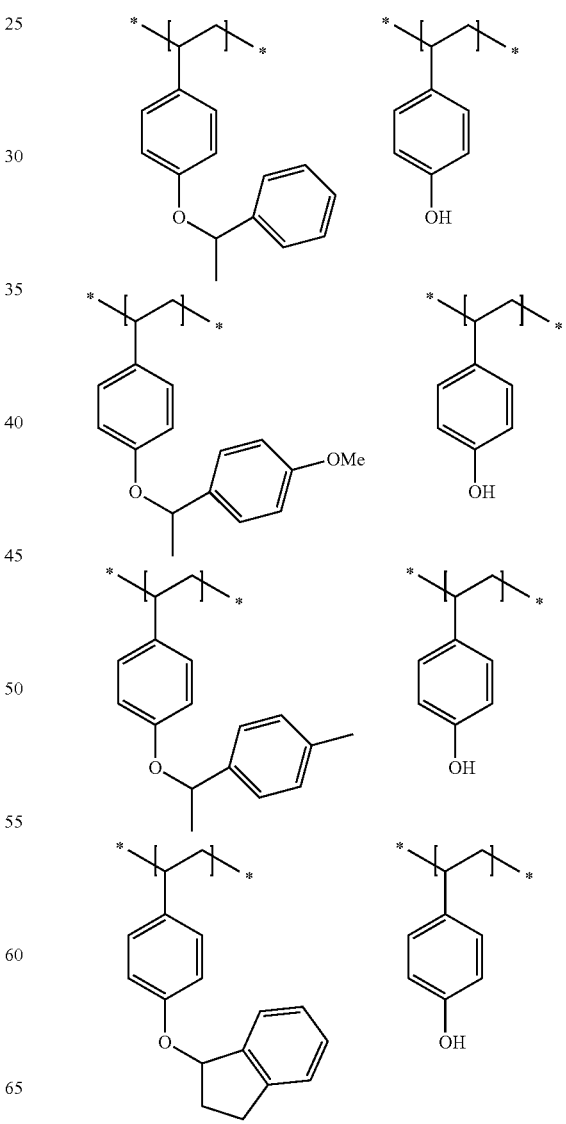

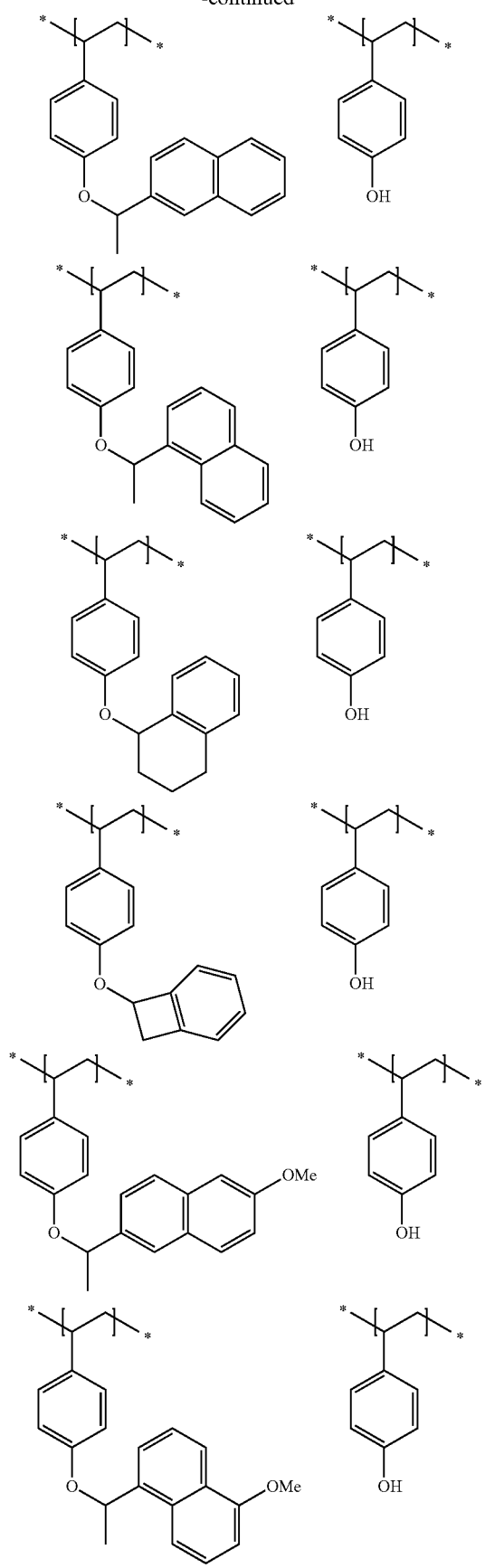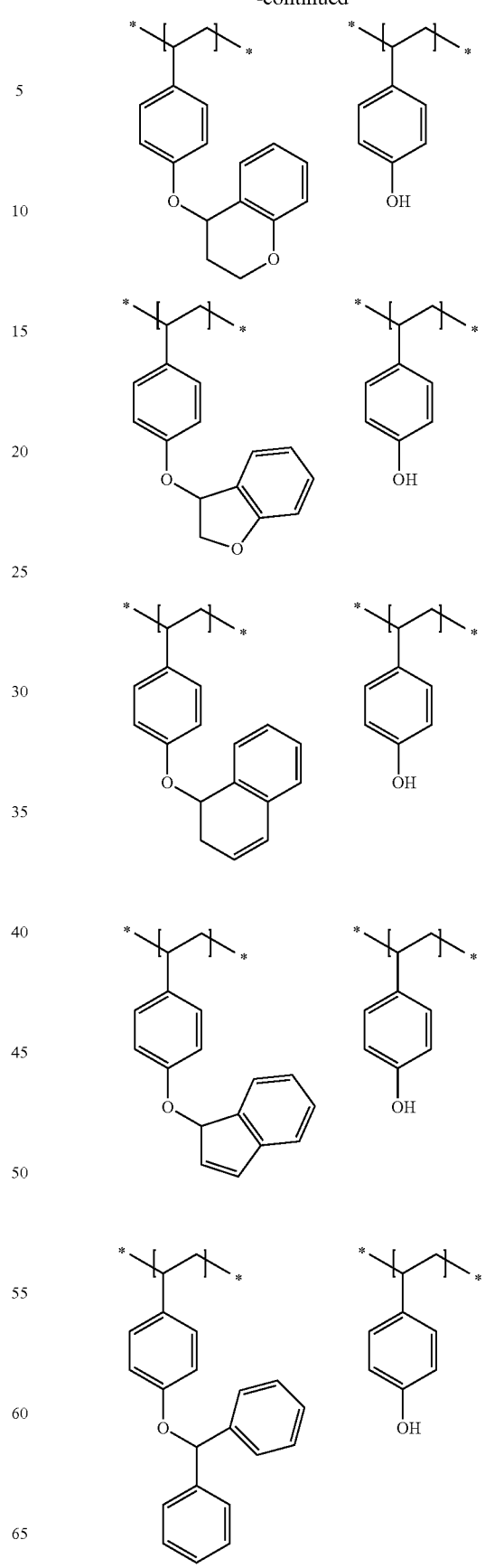

41
-continued
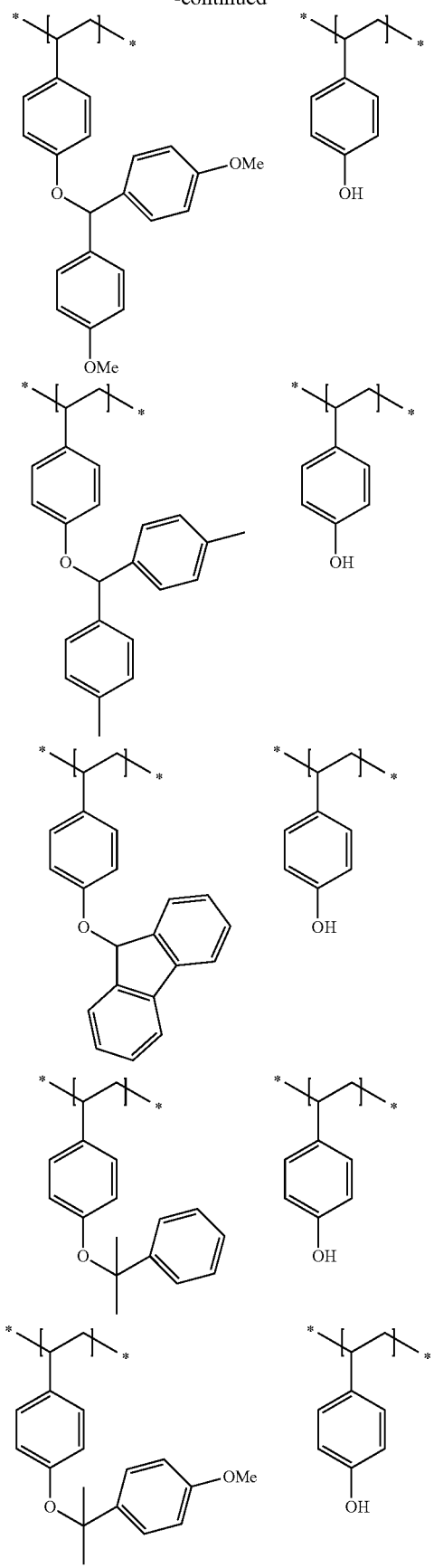
42
-continued
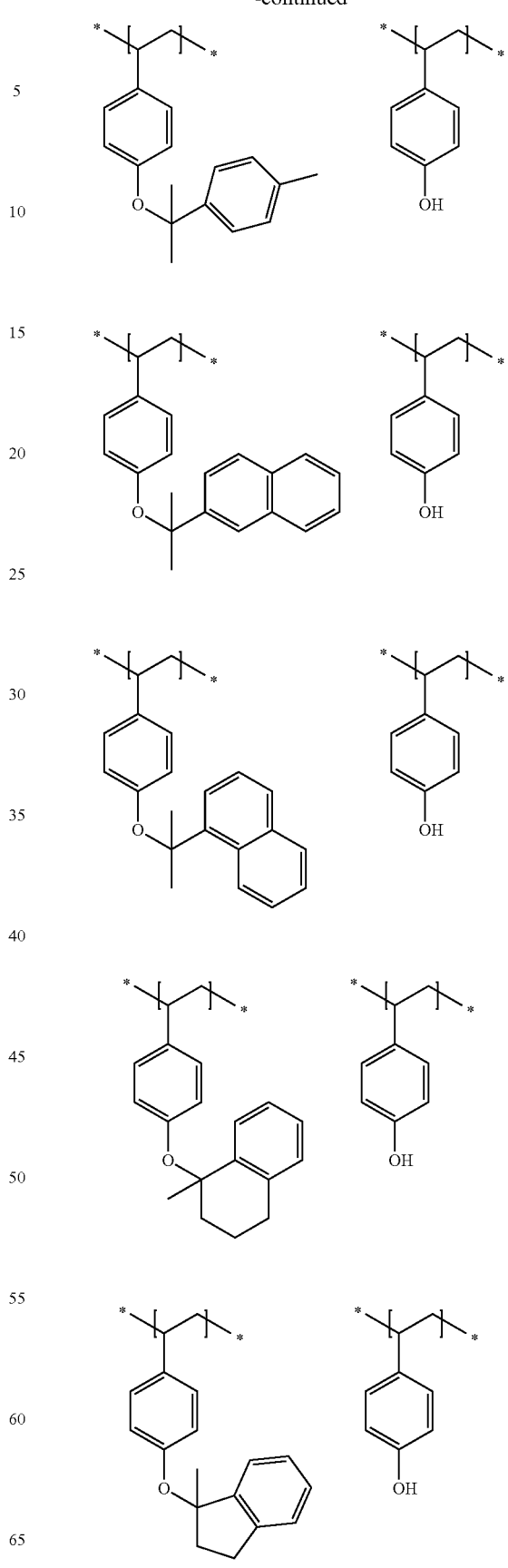

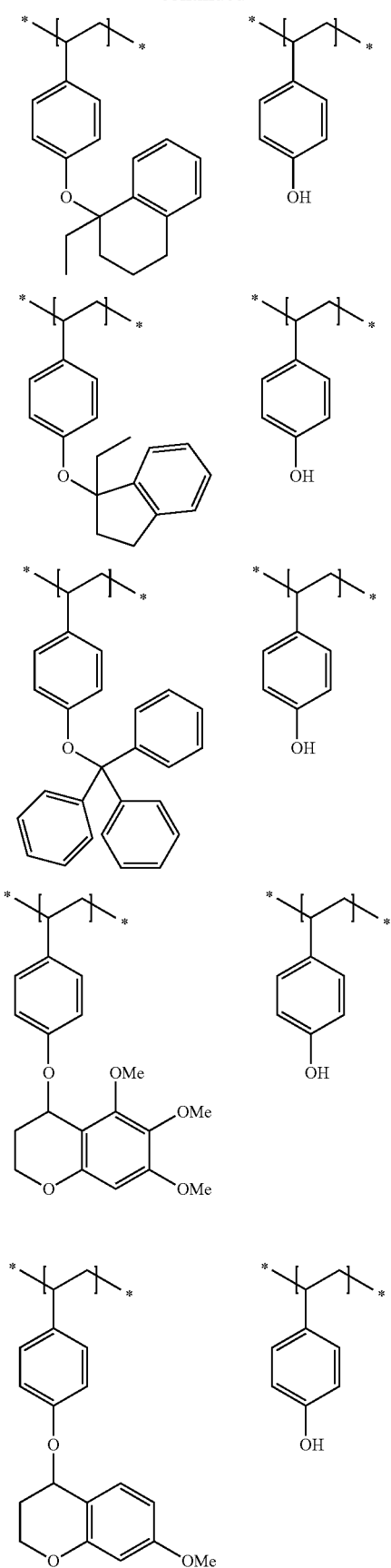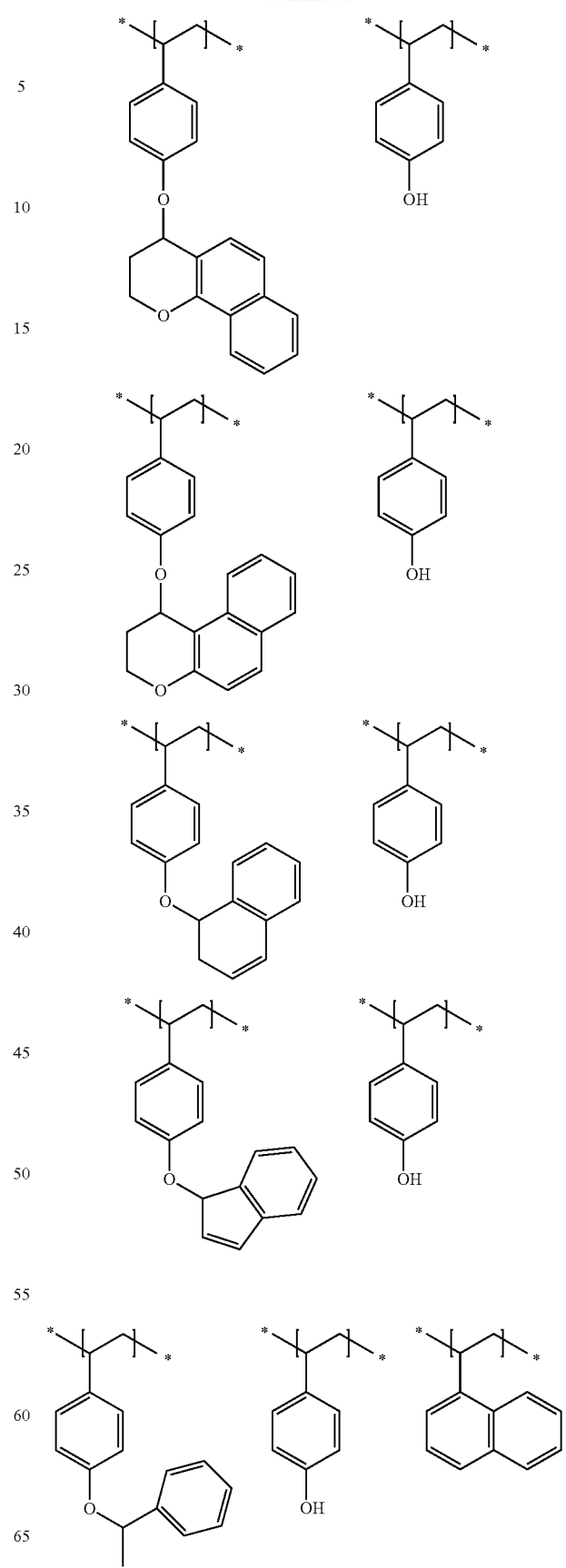

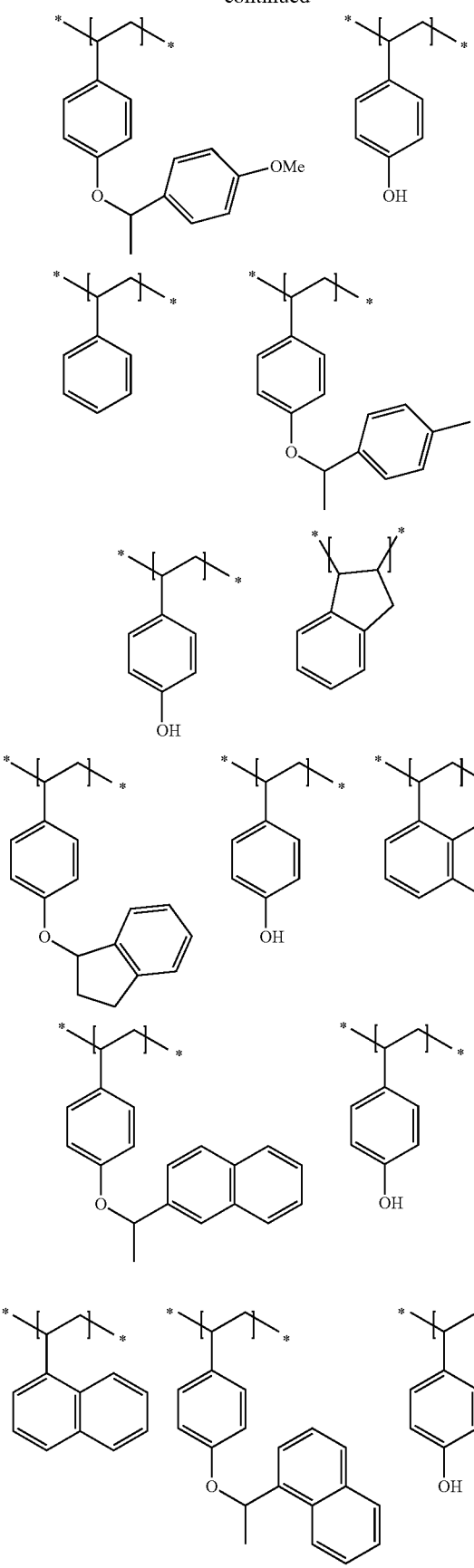
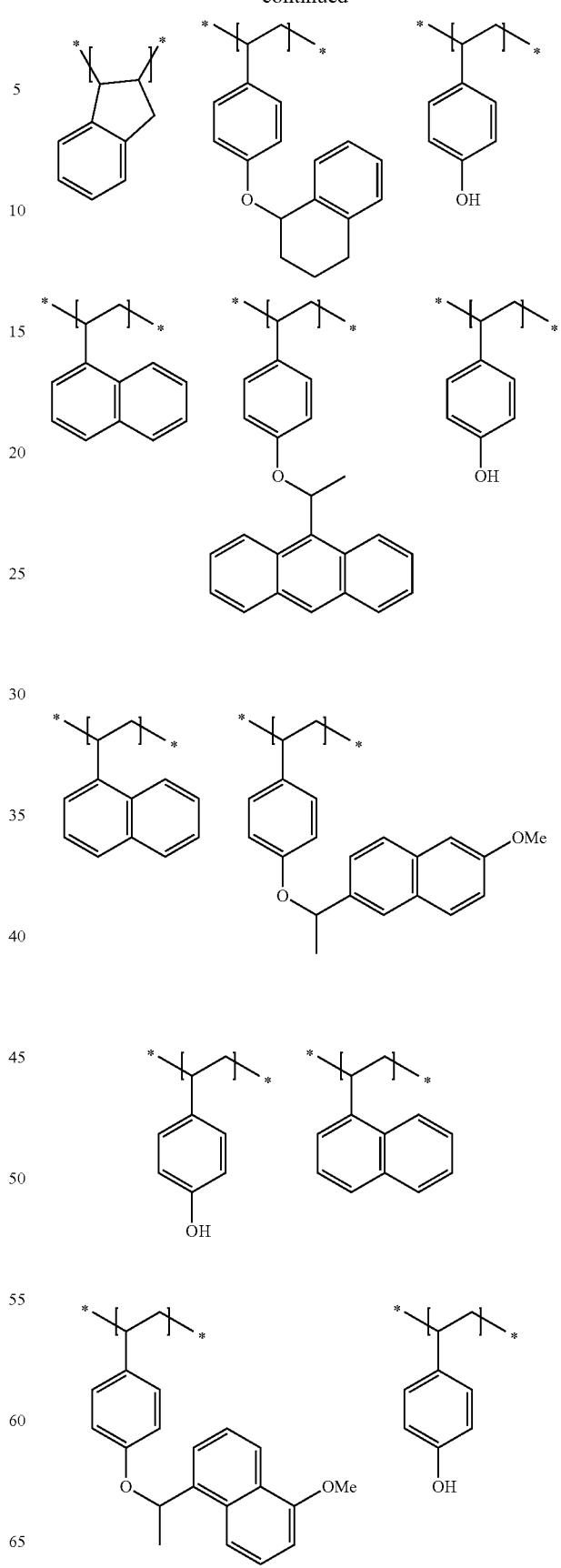

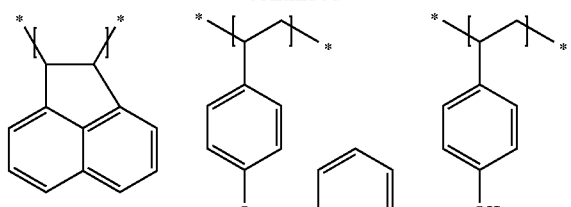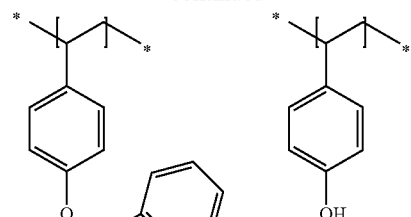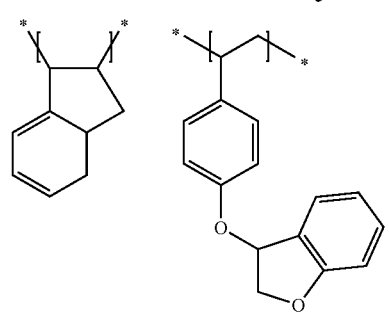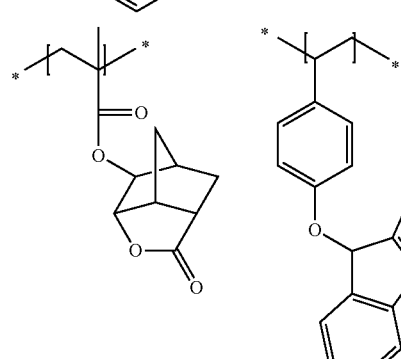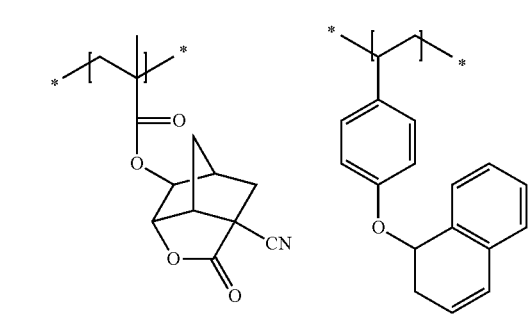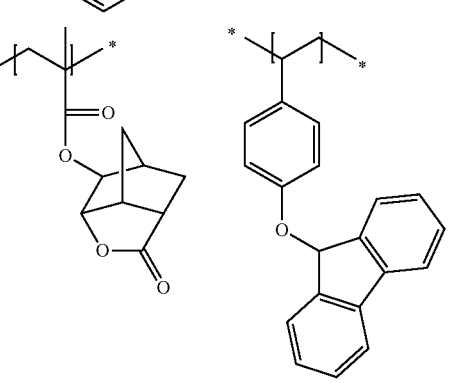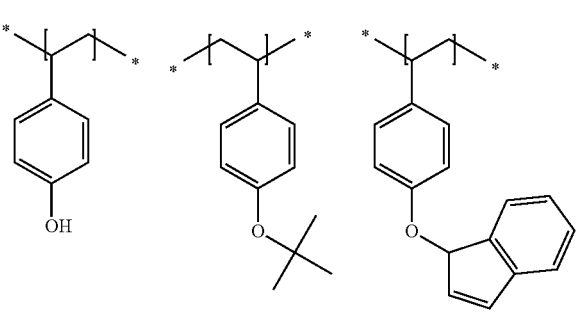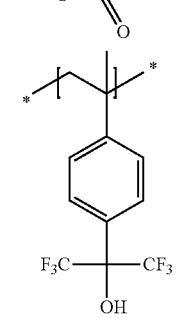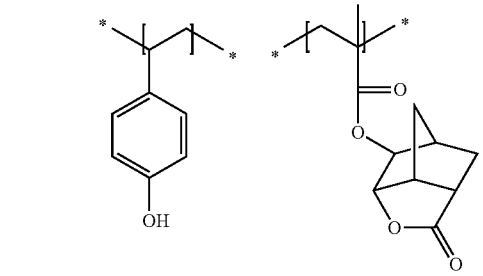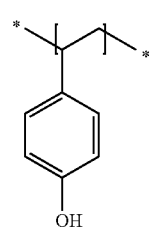

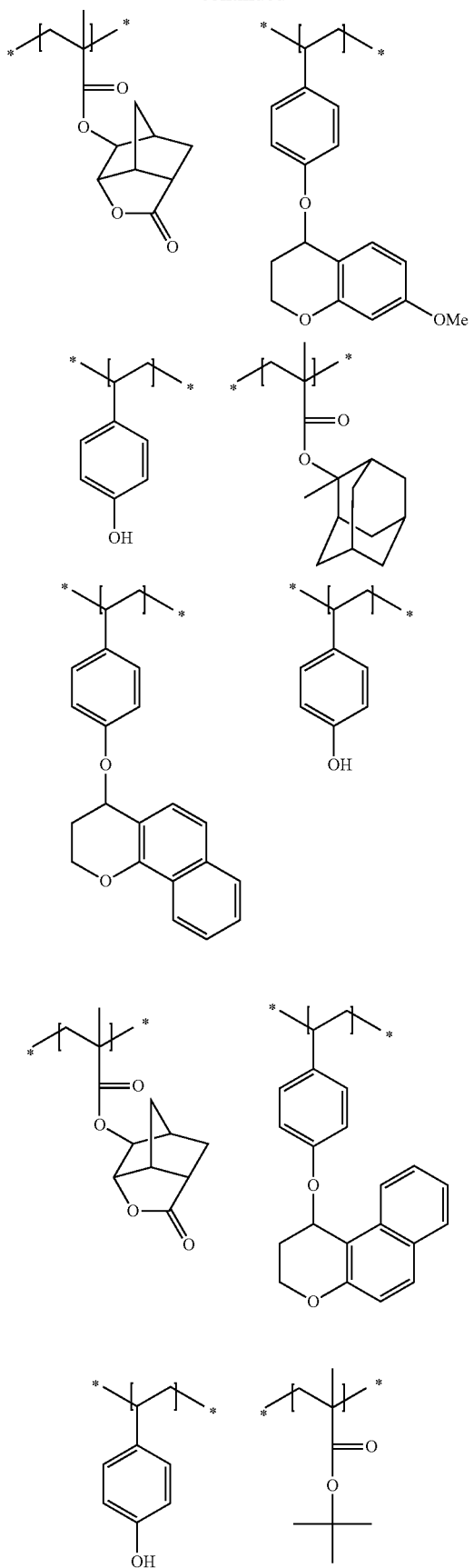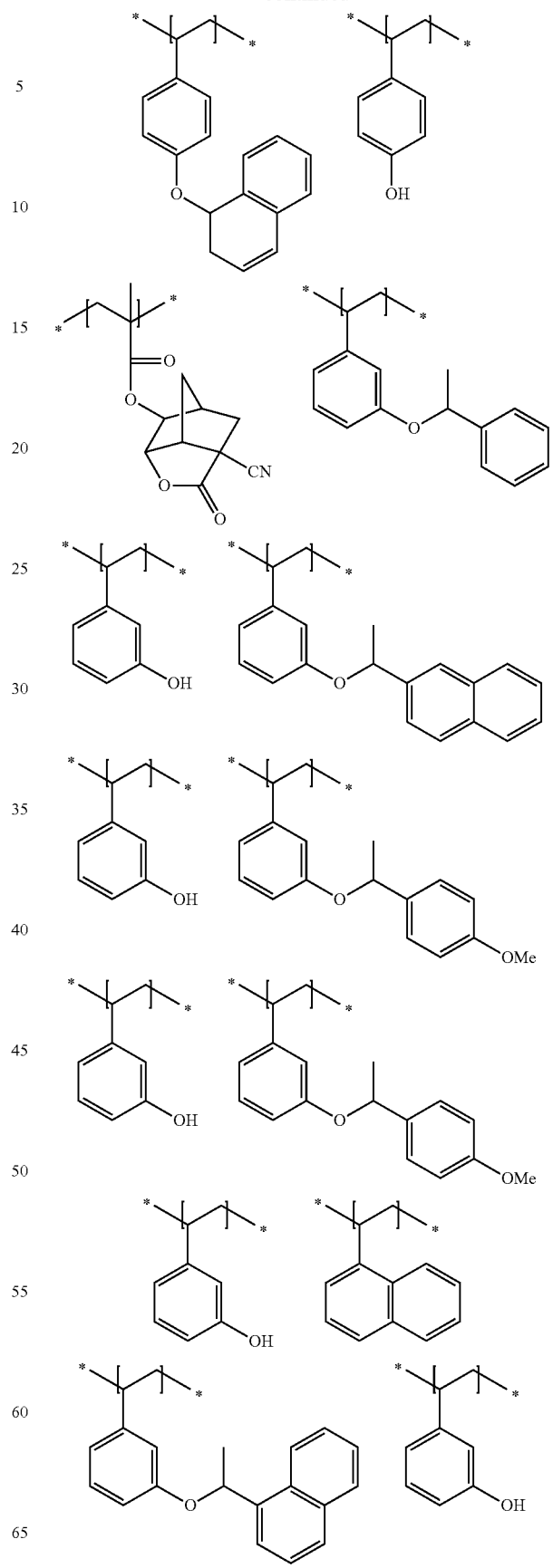

51
-continued
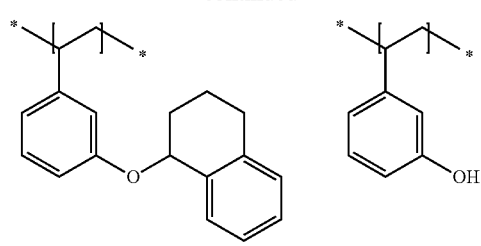
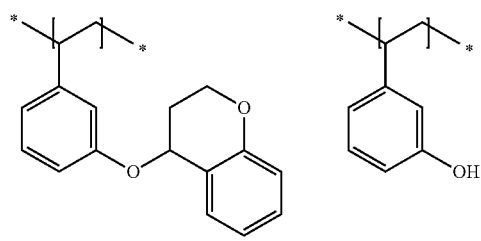
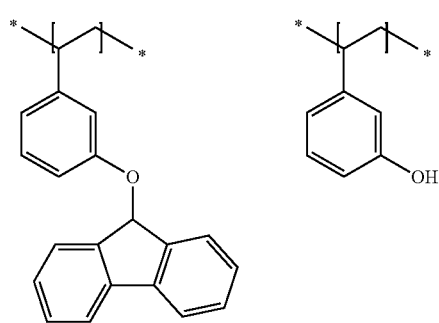
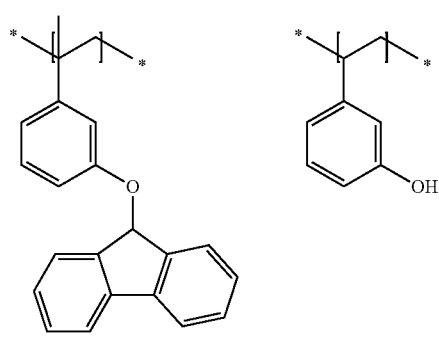
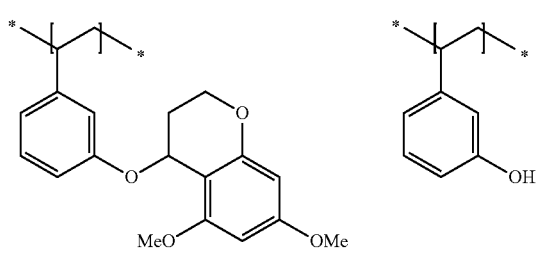
52
-continued
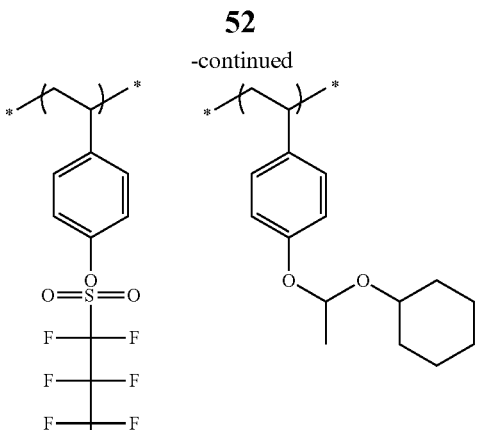
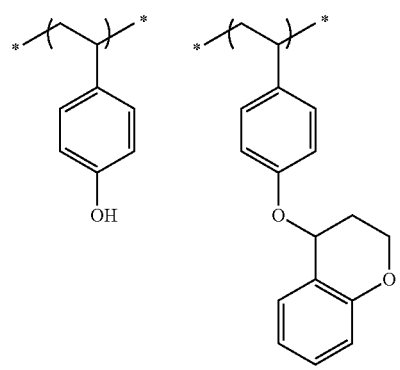
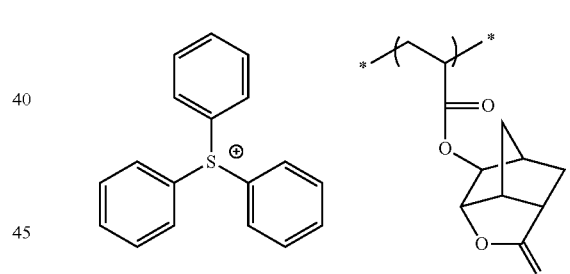
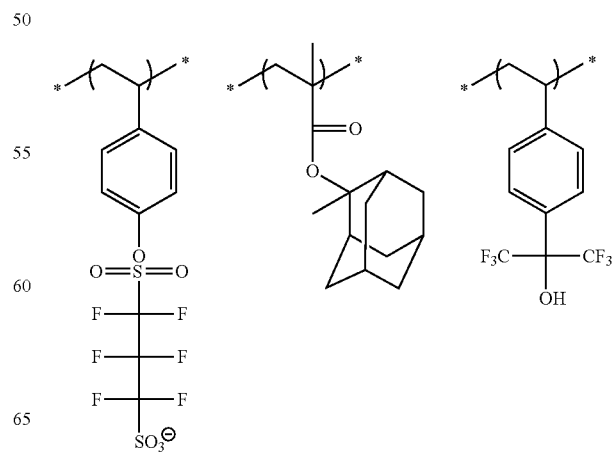

-continued

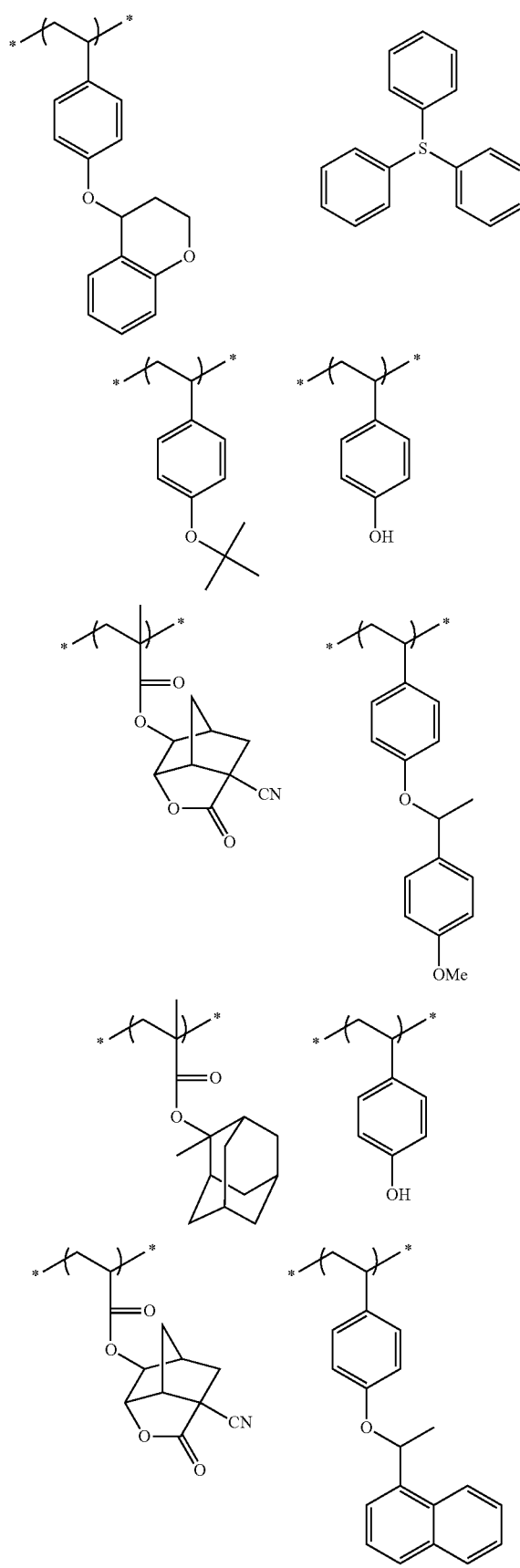
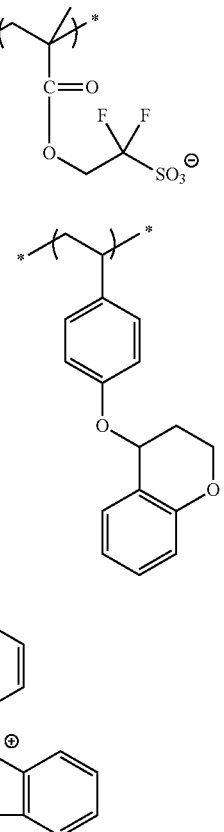

In addition, two or more of these high molecular compounds can be used in a combination.

The additive amount of the high molecular compound (A) used in the present invention is preferably 30 to 100% by mass, more preferably 50 to 99.7% by mass, and particularly preferably 70 to 99.5% by mass, based on total solid content of the composition.

[2] (B) A Compound Generating an Acid Upon Irradiation with Actinic Rays or Radiation.

The chemical amplification type resist composition of the present invention further contain, as an essential component, (B) a compound generating an acid upon irradiation with actinic rays or radiation (hereinafter, these compounds are sometimes referred to as an "acid generator"). In the present invention, (B) a compound generating an acid upon irradiation with actinic rays or radiation may be a low molecular acid generator generating an acid upon irradiation with an actinic ray or radiation (in particular, an electron beam or extreme ultraviolet rays) or may be a high molecular compound generating an acid. In addition, as described above, the compound (B) may be a constituent in the high molecular compound (A).

The preferable forms of the acid generator can include onium compounds. The examples of such onium compounds include sulfonium salts, iodonium salts and phosphonium salts, and the like.

In addition, another preferable forms of the acid generator can include, upon irradiation with the actinic rays or radiation, a compound generating sulfonic acids, imide acids or methide acids. The examples of the acid generator in this form can include sulfonium salts, iodonium salts, phosphonium salts, oxime sulfonates and imidosulfonates, and the like.

As the acid generator used in the present invention, in addition to a low molecular compound, a compound wherein a group generating an acid upon irradiation with the actinic rays or radiation has been introduced into the main chain or a side chain of the high molecular compound can also be used. As further described above, in a case where a group generating an acid upon irradiation with the actinic rays or radiation is present in the repeating units of the high molecular compound (A) used in the present invention, apart from the high molecular compound (A) of the present invention, it does not matter if the acid generator (B) is not present therein.

It is preferable that the acid generator be a compound generating an acid upon irradiation with an electron beam or extreme ultraviolet ray.

In the present invention, the examples of the preferable onium compounds can include a sulfonium compound represented by the following general formula (1), or an iodonium compound represented by the general formula (2).

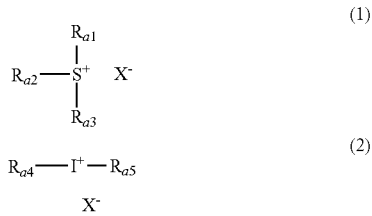

In the general formulae (1) and (2), each of $R_{a1}$, $R_{a2}$, $R_{a3}$, $R_{a4}$ and $R_{a5}$ represents an organic group.

$X^-$ represents an organic anion.

Next, the sulfonium compound represented by the general formula (1) and the iodonium compound represented by the general formula (2) will be further described.

While each of $R_{a1}$ to $R_{a3}$ of the general formula (1) and $R_{a4}$ and $R_{a5}$ of the general formula (2) represent an organic group, preferably at least one of $R_{a1}$ to $R_{a3}$, and at least one of $R_{a4}$ and $R_{a5}$ be an aryl group, respectively. As an aryl group, a phenyl group, and a naphthyl group are preferable, and further preferred is a phenyl group.

The examples of the organic anion of $X^-$ in the general formulae (1) and (2) include sulfonic acid anion, carboxylic acid anion, bis(alkylsulfonyl)amid anion, and tris(alkylsulfonyl)methide anion, and the like, and preferably an organic anion represented by the following general formulae (3), (4) or (5), more preferably an organic anion represented by the following general formula (3).

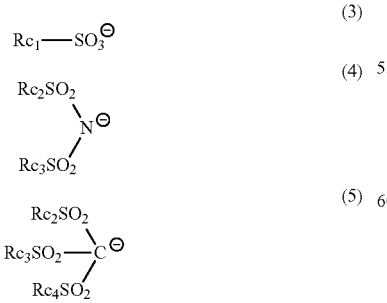

In the formulae (3), (4) and (5), $Rc_1$, $Rc_2$, $Rc_3$ and $Rc_4$ represents independently an organic group, respectively.

The organic anion of the above $X^-$ corresponds to sulfonic acid, imide acid and methide acid, and the like, which are an acid generating upon irradiation with the actinic rays or radiation such as an electron beam or extreme ultraviolet ray.

The examples of the organic groups of the above $R_{c1}$ to $R_{c4}$ can include an alkyl group, an aryl group, or a group in which a plurality thereof are connected to one another. Among these organic groups, more preferred is an alkyl group of which 1-position is substituted with a fluorine atom or with a fluoroalkyl group, and a phenyl group of which the position is substituted with a fluorine atom or with a fluoroalkyl group. By having a fluorine atom or a fluoroalkyl group, the acidity of the acid generated by the light irradiation increases, and the sensitivity rises. However, it is preferable that the terminal group do not have a fluorine atom as a substituent.

In the present invention, in view of suppressing the diffusion of the acid generated by the exposure toward the unexposed area and improving resolution or pattern profile, the aforementioned acid generator (B) is preferably a compound generating an acid having a size of 130 Å³ or more in volume (more preferably sulfonic acid), more preferably a compound generating an acid having a size of 190 Å³ or more in volume (more preferably sulfonic acid), still more preferably a compound generating an acid having a size of 270 Å³ or more in volume (more preferably sulfonic acid), and particularly preferably a compound generating an acid having a size of 400 Å³ or more in volume (more preferably sulfonic acid). However, in view of the sensitivity or the solubility in the coating solvent, the above-described volume is preferably 2000 Å³ or less, further preferably 1500 Å³ or less. This volume value is determined by using "WinMOPAC" available from FUJITSU LIMITED. That is to say, first, the chemical structure of the acid according to each example was input, and then, using this structure as an initial structure, the most stable conformation of each acid was determined by molecular force field calculation using the MM3 method, and thereafter, with respect to these most stable conformation, molecular orbital calculation using the PM3 method was performed, which enables to compute the "accessible volume" of each acid.

The particular preferable acid generators for use in the present invention are illustrated below. Incidentally, the computed volume value is affixed to a part of these examples (unit Å³). In addition, the computed value obtained here is the volume value of an acid wherein a proton is attached to an anion part.

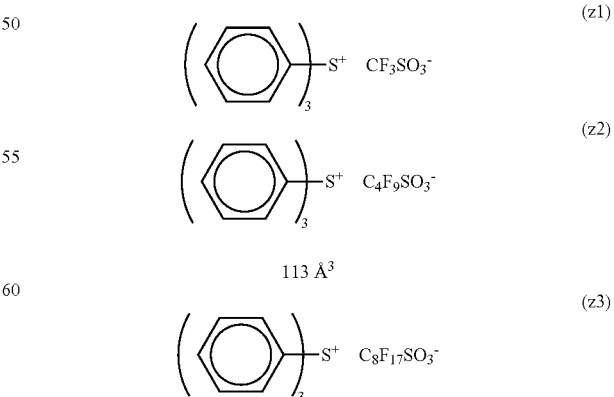

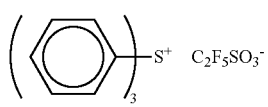
(z4)
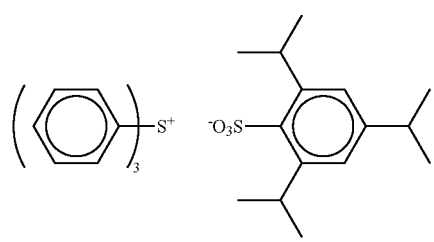
(z5)
303 Å³
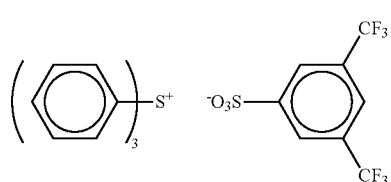
(z6)
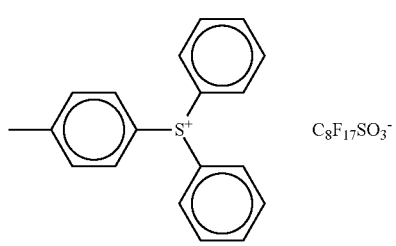
(z7)
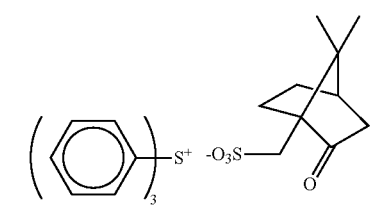
(z8)
216 Å³
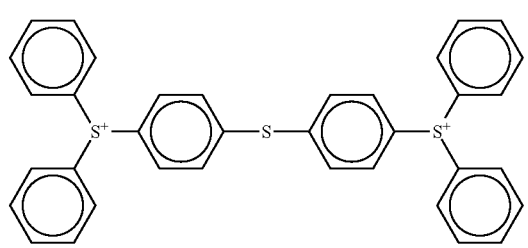
(z9)
127 Å³
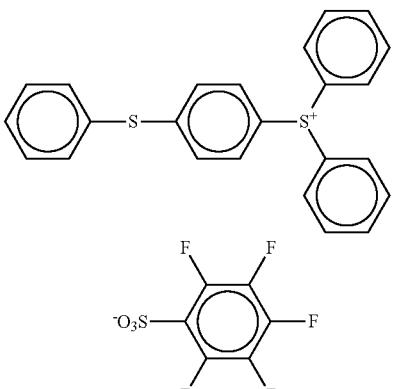
(z10)
127 Å³
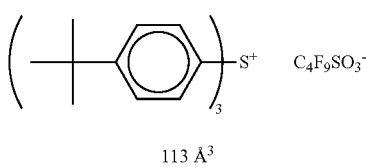
(z11)
113 Å³
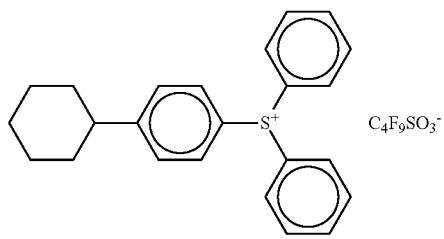
(z12)
113 Å³
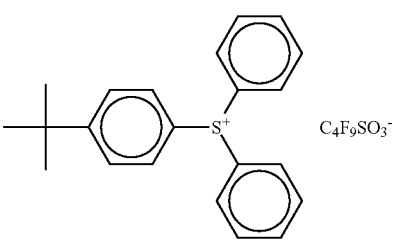
(z13)
113 Å³
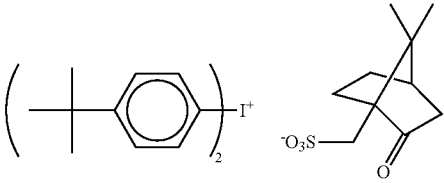
(z14)
216 Å³
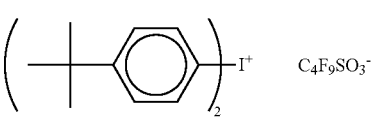
(z15)
113 Å³

(z16)
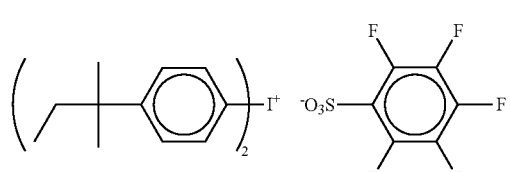
127 Å³
(z17)
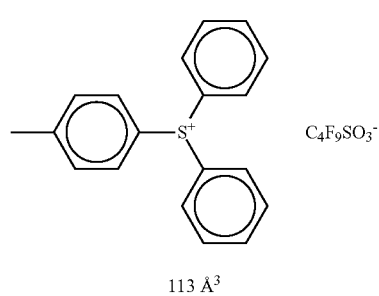
113 Å³
(z18)
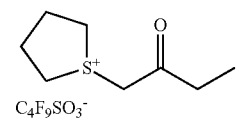
113 Å³
(z19)
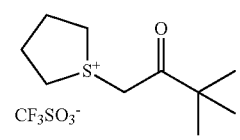
113 Å³
(z20)
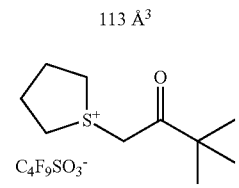
113 Å³
(z21)
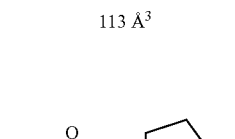
113 Å³
(z22)
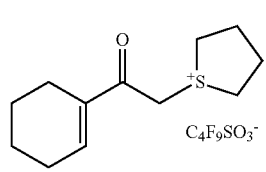
113 Å³
(z23)
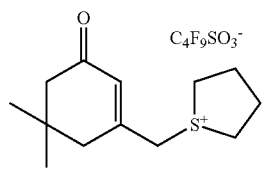
113 Å³
(z24)
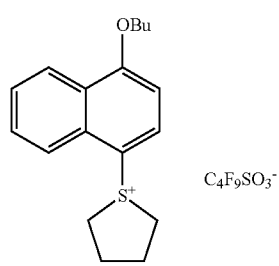
113 Å³
(z25)
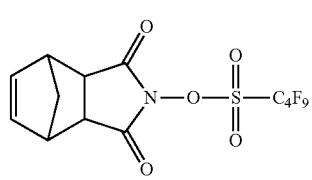
113 Å³
(z26)
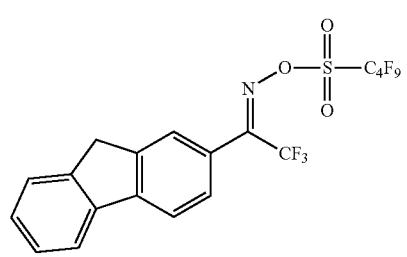
113 Å³
(z27)
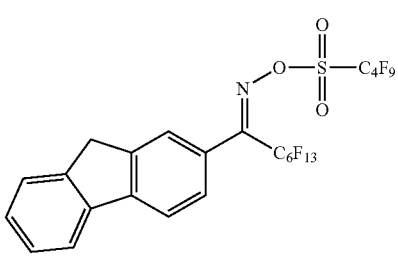
113 Å³
(z28)
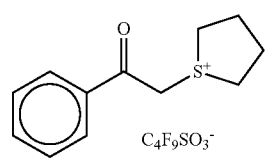
113 Å³

(z29)
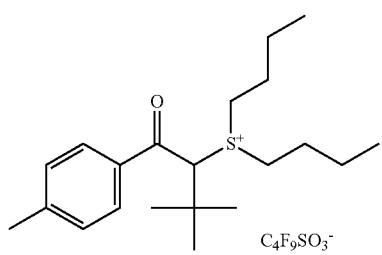
113 Å³
(z30)
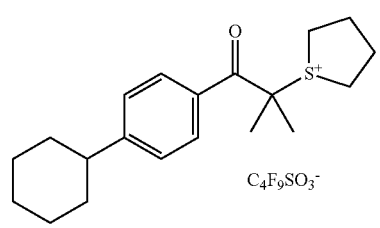
113 Å³
(z31)
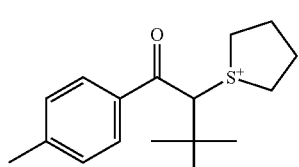
113 Å³
(z32)
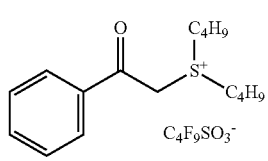
113 Å³
(z33)
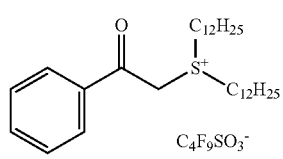
113 Å³
(z34)
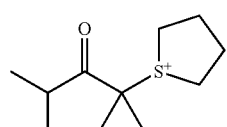
113 Å³
(z35)
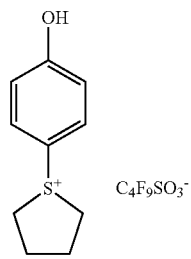
113 Å³
(z36)
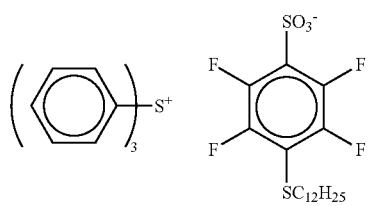
393 Å³
(z37)
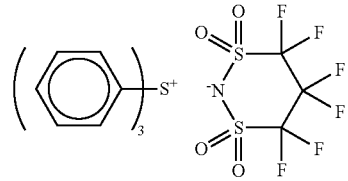
136 Å³
(z38)
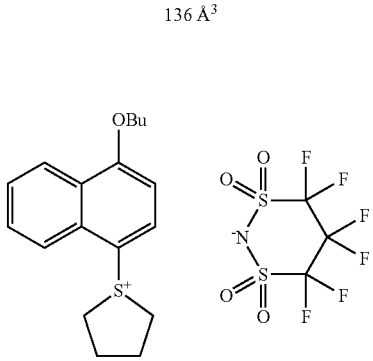
136 Å³
(z39)
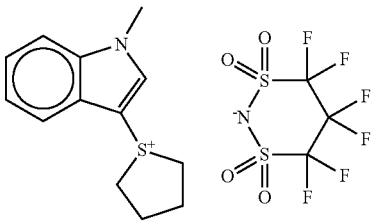
136 Å³

(z40)
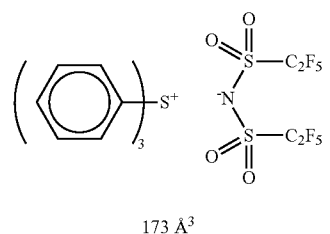
173 Å³
(z41)
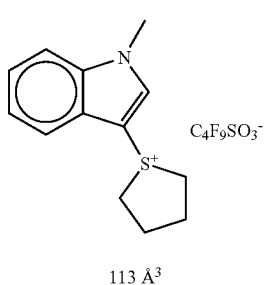
113 Å³
(z42)
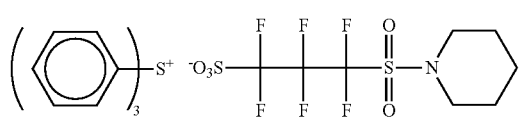
224 Å³
(z43)
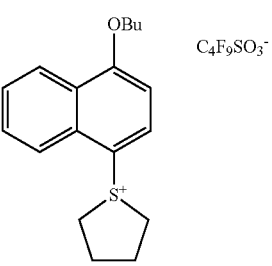
113 Å³
(z44)
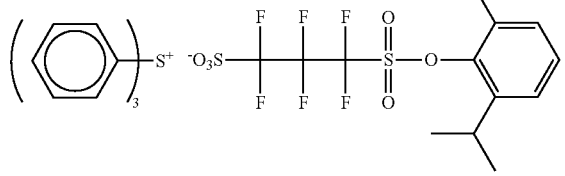
347 Å³
(z45)
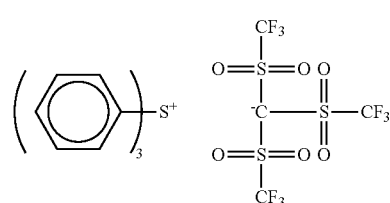
189 Å³
(Z46)
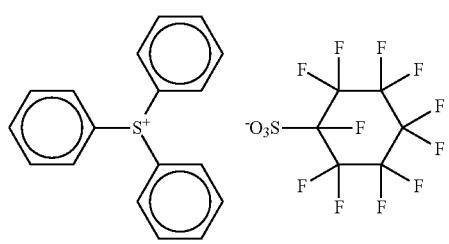
136 Å³
(z47)
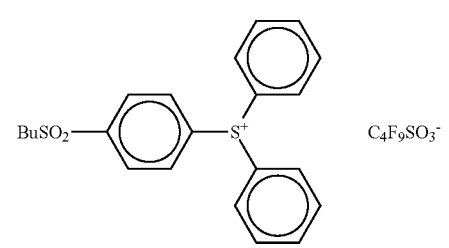
113 Å³
(z48)
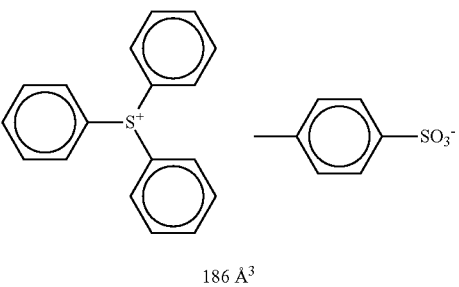
186 Å³
(z49)
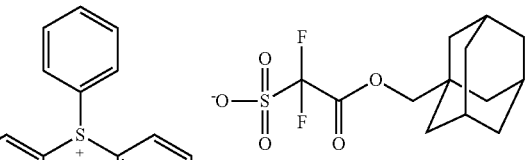
271 Å³
(z50)
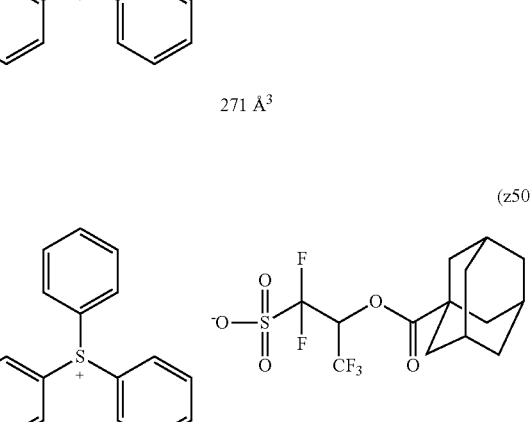
291 Å³

-continued
(z51)
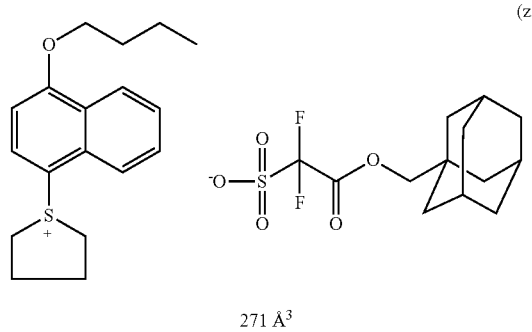
271 Å³
(z52)
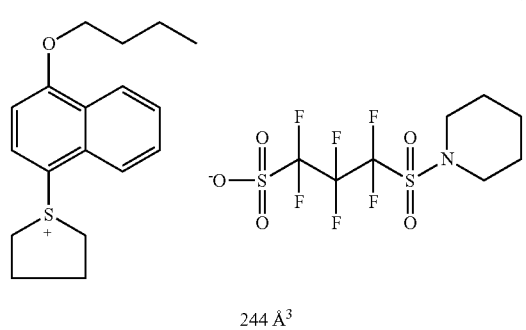
244 Å³
(z53)
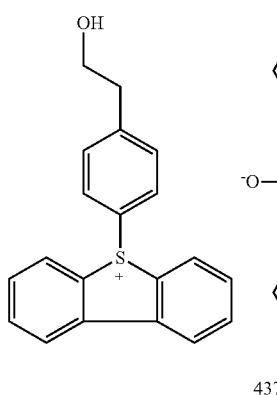
437 Å³
(z54)
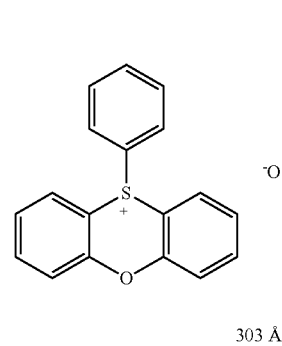
303 Å³
-continued
(z55)
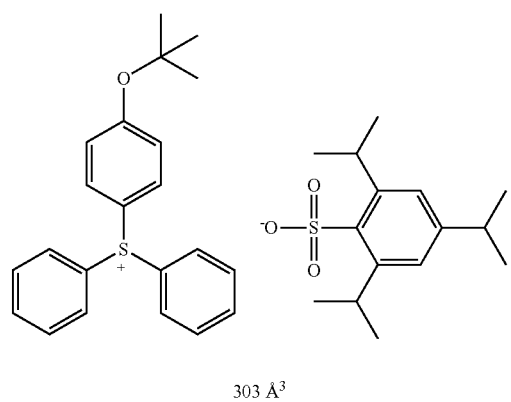
303 Å³
(z56)
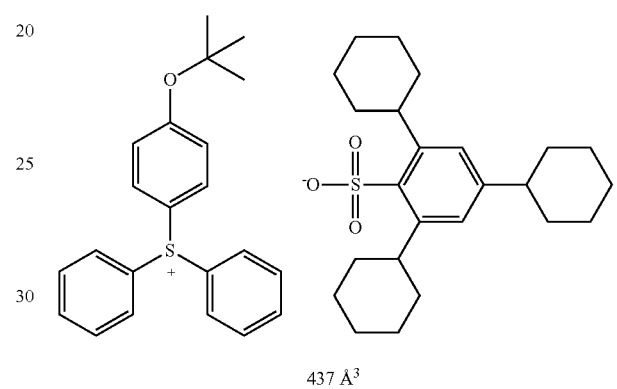
437 Å³
(z57)
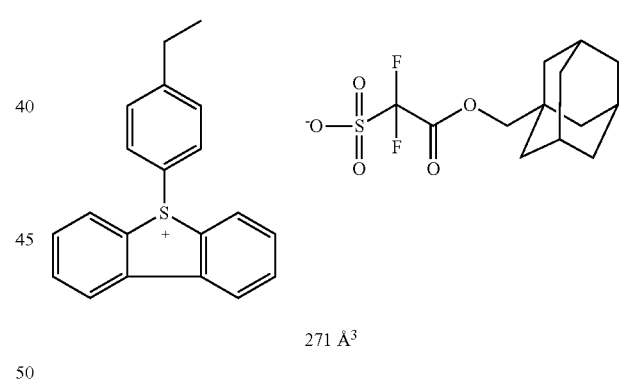
271 Å³
(z58)
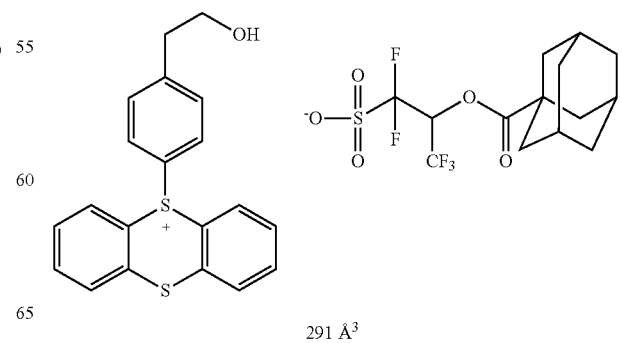
291 Å³

(z59)
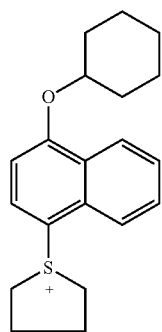 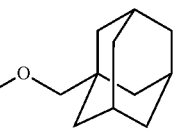
271 Å³
(z60)
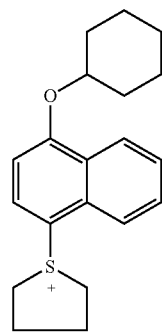 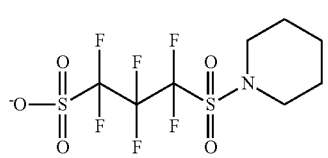
244 Å³
(z61)
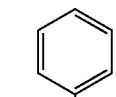
311 Å³
(z62)
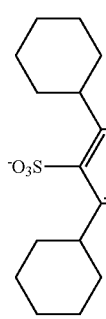 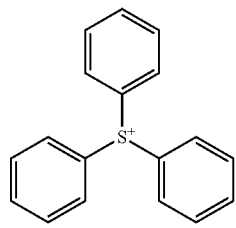
437 Å³
(z63)
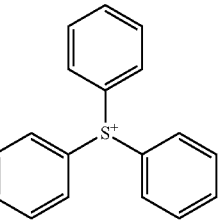
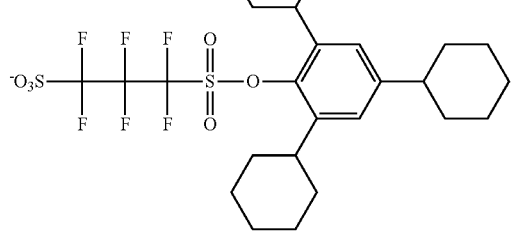
535 Å³
(z64)
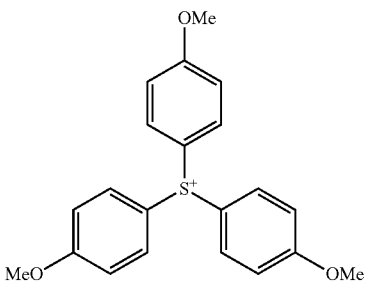
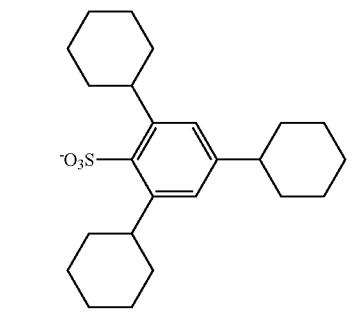
437 Å³
(z65)
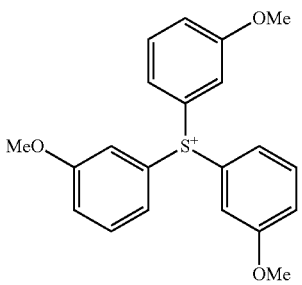

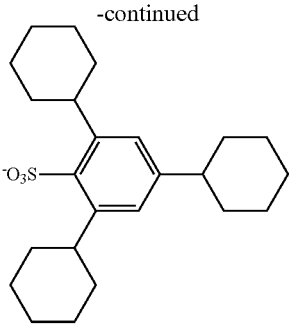

437 Å³

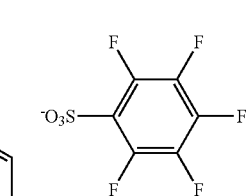

(z66)

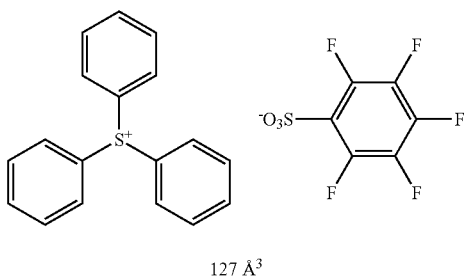

127 Å³

In addition, as the acid generator used in the present invention (preferably onium compound), a high molecular-type acid generator where a group generating an acid upon irradiation with the actinic rays or radiation (a photoacid generating group) has been introduced in the main chain or the side chain of the high molecular compound can be used, which has been described in the description of the aforementioned high molecular compound (A), as a repeating unit having a photoacid generating group.

The content of the acid generator in the composition is preferably 0.1 to 25% by mass, more preferably 0.5 to 20% by mass, and still more preferably 1 to 18% by mass, based on total solid content in the resist composition.

One of the acid generator can be used alone or two or more kinds thereof can be used in a combination.

[3] A Compound Having at Least Two of Hydroxymethyl Groups or Alkoxylmethyl Groups in the Molecule In a case where the chemical amplification type resist composition of the present invention is used as a negative chemical amplification type resist composition, it is preferable that the chemical amplification type resist composition contain, as a cross-linking agent, (C) compound having at least two of hydroxymethyl groups or alkoxylmethyl groups in the molecule (hereinafter, sometimes referred to as "acid cross-linking agent" or simply a "cross-linking agent").

The examples of the preferable cross-linking agent include hydroxymethylated or alkoxymethylated phenol compounds, alkoxymethylated melamine compounds, alkoxymethyl glycoluril-based compounds and alkoxymethylated urea compounds. The examples of the compound (C) as the particularly preferable cross-linking agent include a phenol derivative which contains, in the molecule thereof, 3 to 5 benzene rings and also at least two groups selected from a hydroxymethyl group and an alkoxymethyl group, and has a molecular weight of 1,200 or less, a melamine-formaldehyde derivative having at least two free N-hydroxymethyl groups, or an alkoxymethyl glycoluril derivative.

As an alkoxymethyl group, methoxymethyl group and ethoxymethyl group are preferable.

Among the aforementioned cross-linking agents, a phenol derivative having hydroxy methyl groups can be obtained by reacting a phenol compound not having the corresponding hydroxymethyl group with formaldehyde under a base catalyst. In addition, a phenol derivative having alkoxymethyl groups can be obtained by reacting a phenol derivative having the corresponding hydroxymethyl groups with an alcohol under an acid catalyst.

Among the phenol derivatives synthesized in this way, the phenol derivative having alkoxymethyl groups is particularly preferable in view of sensitivity and preservation stability.

The another preferred examples of cross-linking agent further include a compound having N-hydroxymethyl group or N-alkoxymethyl group, such as, alkoxymethylated melamine compounds, alkoxymethyl glycoluril-based compounds and alkoxymethylated urea compounds.

The examples of these compound include hexamethoxymethyl melamine, hexaethoxymethyl melamine, tetramethoxymethyl glycoluril, 1,3-bismethoxymethyl-4,5-bismethoxyethyl urea, and bismethoxymethyl urea, and the like, which are disclosed in European Patent unexamined publication EP0133216A, DE3634671B, DE3711264B, and EP0212482A.

Among these cross-linking agents, particularly preferred are those as illustrated below.

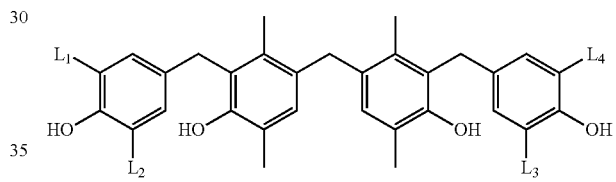

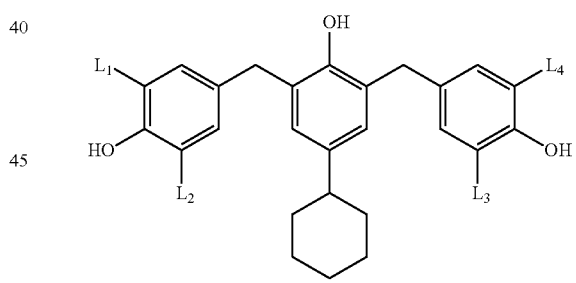

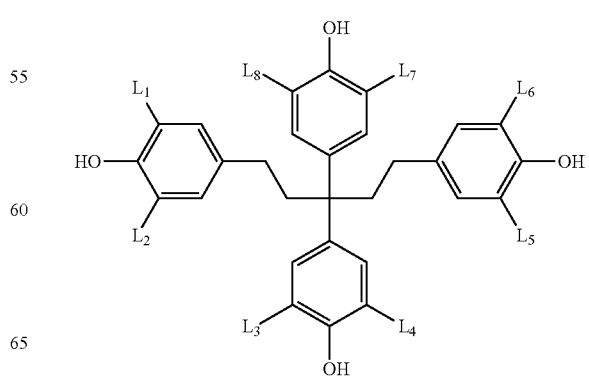

-continued

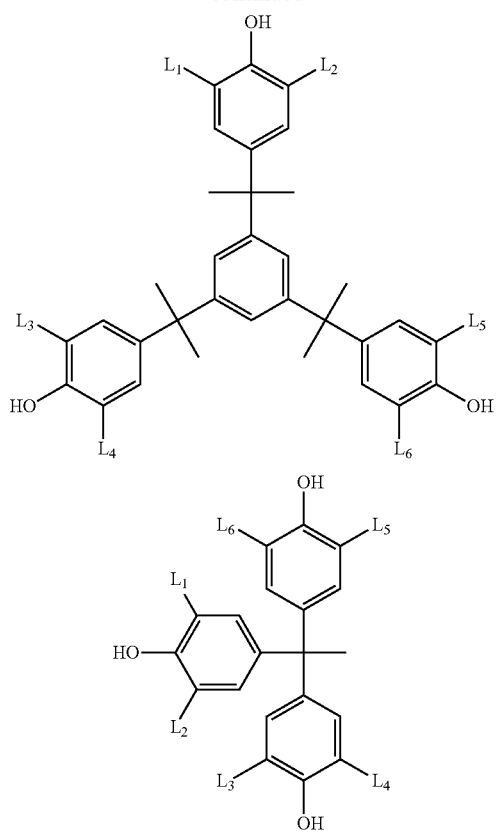

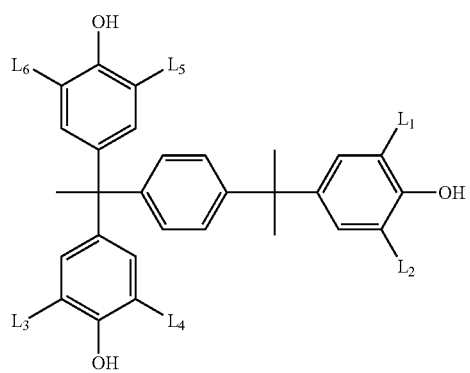

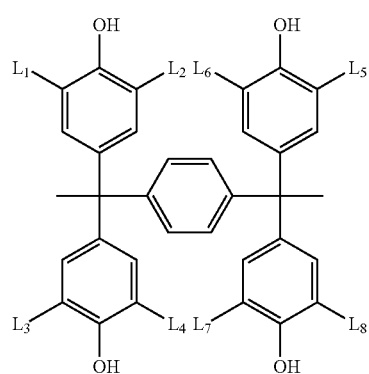

-continued

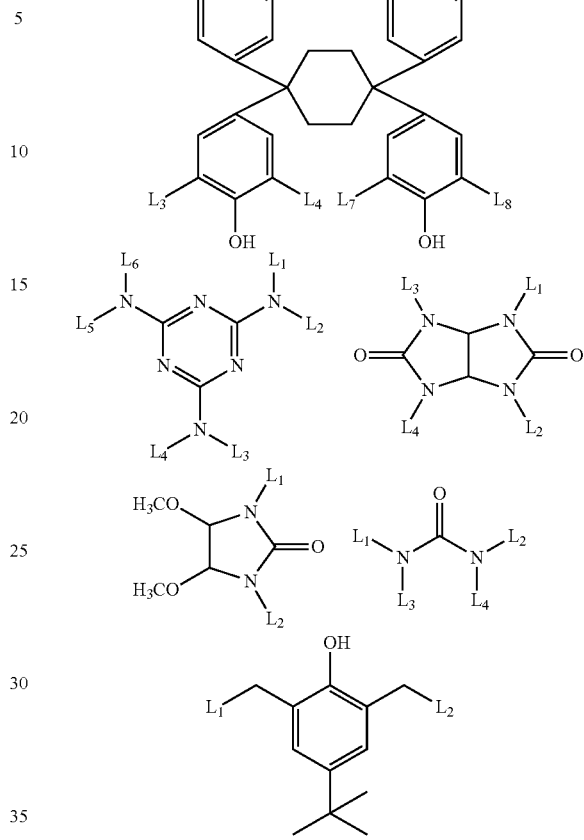

Wherein, each of $L_1$ to $L_8$ represents independently a hydrogen atom, hydroxymethyl group, methoxymethyl group, ethoxymethyl group or an alkyl group having a carbon number of 1 to 6.

The cross-linking agent in the present invention is used in an additive amount of 3 to 65% by mass, preferably 5 to 50% by mass, base on the solid content of the negative resist composition. By using the amount of cross-linking agent added with 3 to 65% by mass, the decreases of a residual film rate and a resolving power can be prevented, and also the stability at the time of preserving a resist solution can be preserved well.

In the present invention, the cross-linking agents may be used alone or may be used in a combination of two or more thereof, and in view of patterning profile, it is preferable that two or more thereof can be used in a combination.

For example, in addition to the aforementioned phenol derivatives, in a case where other cross-linking agents, for examples, the compound having N-alkoxymethyl group, and the like described above are used together, the proportion of the aforementioned phenol derivatives and other cross-linking agents are, as a molar ratio, 100/0 to 20/80, preferably 90/10 to 40/60, and more preferably 80/20 to 50/50.

(D) A Basic Compound

It is preferable that the chemical amplification type resist composition of the present invention preferably contain a basic compound as an acid scavenger, in addition to the aforementioned components. By using the basic compound, the performance change with time from exposure to post-exposure baking can be decreased. As such basic compound, an organic basic compound is preferred, and more specific examples thereof include aliphatic amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxylphenyl group, alcoholic nitrogen-containing compounds, amide derivatives and imide derivatives, and the like. Amine oxide compounds (disclosed in JP2008-102383A), and ammonium salts (preferred is hydroxide or carboxylate. More specifically, tetraalkyl ammonium hydroxides represented by tetrabutyl ammonium hydroxide are preferable in view of LER.) can also be suitably used. Further, compounds of which the basicity increase by the action of an acid can also be used as one kind of basic compound.

Specific examples of the amines include tri-n-butylamine, tri-n-pentylamine, tri-n-octylamine, tri-n-decyl amine, triisodecylamine, dicyclohexylmethyl amine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethyl aniline, tris(methoxyethoxyethyl)amine, and compounds illustrated in U.S. Pat. No. 6,040,112A, column 3, line 60 et seq., 2-[2-{2-(2,2-dimethoxy-phenoxyethoxy)ethyl}-bis-(2-methoxyethyl)]-amine, and Compounds (C1-1) to (C3-3) illustrated in paragraph [0066] of US2007/0224539A1, and the like.

The examples of compounds having a nitrogen-containing heterocyclic structure include 2-phenylbenzimidazole, 2,4,5,-triphenylimidazole, N-hydroxyethylpiperidine, bis(1,2,2,6,6-pentamethyl-4-piperidyl)sebacate, 4-dimethylaminopyridine, antipyrine, hydroxyantipyrine, 1,5-diazabicyclo[4.3.0]non-5-ene and 1,8-diazabicyclo[5.4.0]-undec-7-ene, and the like. As an ammonium salt, tetrabutylammonium hydroxide is preferable.

In addition, photodegradable-basic compounds (compounds wherein originally, a basic nitrogen atom acts as a base and has a basicity, but decomposes upon irradiation of actinic rays or radiation to generate a zwitterionic compound which has both a basic nitrogen atom and an organic acid site, and then they are neutralized in the molecule, thereby the basicity thereof decreases or disappears therefrom, for example onium salts disclosed in JP3577743B, JP 2001-215689A, JP2001-166476A, and JP2008-102383A) and photobase generators (for example, the compounds disclosed in JP2010-243773A) can suitably used.

Among these basic compounds, inter alia, ammonium salts are preferable in view of the improvement of resolution.

The content of the basis compound used in the present invention is preferably 0.01 to 10% by mass, more preferably 0.03 to 5% by mass, and particularly preferably 0.05 to 3% by mass, based on solid content in the entire resist composition.

[5] Surfactant

The chemical amplification type resist composition of the present invention can further contain a surfactant for improving coating properties. The examples of the surfactant include nonionic surfactants such as polyoxyethylene alkyl ethers and polyoxyethylene alkylaryl ethers, polyoxyethylene polyoxypropylene block copolymers, sorbitan fatty acid esters and polyoxyethylene sorbitan fatty acid esters, fluorine-based surfactants such as Florad FC 430 (available from Sumitomo 3M Limited) or Surfynol E 1004 (available from ASAHI GLASS CO., LTD.), PF656 and PF6320 available from OMNOVA Solutions Inc, and organosiloxane polymers.

In a case where the resist composition contain the surfactant, the amount of the surfactant used is preferably from 0.0001 to 2% by mass, and more preferably from 0.0005 to 1% by mass, based on the total amount of the resist composition (except for the solvent).

[6] An Organic Carboxylic Acid

It is preferable that the chemical amplification type resist composition of the present invention, in addition to the aforementioned components, contain an organic carboxylic acid. The examples of such organic carboxylic acid include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, phthalic acid, terephthalic acid, isophthalic acid, 2-naphthoic acid, 1-hydroxy-2-naphthoic acid and 2-hydroxy-3-naphthoic acid, and the like; however, in a case where the exposure to an electron beam is performed in vacuum, since there is a risk that the acids volatize from the surface of the resist film and contaminate the inside of the lithography chamber, as the preferable compounds, an aromatic organic carboxylic acid, inter alia, for example benzoic acid, 1-hydroxy-2-naphthoic acid and 2-hydroxy-3-naphthoic acid are suitable.

The amount of the organic carboxylic acid combined is preferably within the range of from 0.01 to 10 part by mass, more preferably 0.01 to 5 part by mass, and still more preferably 0.01 to 3 part by mass, based on 100 part by mass of the high molecular compound (A).

The chemical amplification type resist composition of the present invention can further contain, as necessary, dyes, plasticizers, photodegradable basic compounds, photobase generators, and the like. With regard to all of these compounds, respective compounds disclosed in JP2002-6500A can be mentioned.

In addition, the preferable examples of the organic solvent used in the resist composition of the present invention include ethylene glycol monoethyl ether acetate, cyclohexanone, 2-heptanone, propylene glycol monomethyl ether (PGME, also called 1-methoxy-2-propanol), propylene glycol monomethyl ether acetate (PGMEA, also called 1-methoxy-2-acetoxypropane), propylene glycol monomethyl ether propionate, propylene glycol monoethyl ether acetate, methyl 3-methoxypropionate, ethyl 3-ethoxypropionate, methyl 13-methoxy isobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethyl formamide, γ-butyrolactone, N,N-dimethyl acetamide, propylene carbonate, ethylene carbonate, and the like. These solvents may be used alone, or two or more thereof may be used in combination.

The solid content of the resist composition is dissolved in the above-described solvent and the solid content concentrations become from 1 to 40% by mass, more preferably from 1 to 30% by mass, and still more preferably is 3 to 20% by mass. This range of the solid content concentration enables the attainment of the aforementioned film thickness.

The present invention includes a resist film which is formed by using the chemical amplification type resist composition of the present invention, and having a film thickness of 10 to 200 nm. Such a resist film is, for example, formed by applying a resist composition having, solid content concentration as described above to a support such a substrate. The chemical amplification type resist composition of the present invention is applied to the substrate by an appropriate coating method such as spin coating, roller coating, flow coating, dip coating, spray coating, doctor coating, and pre-baked at 60 to 150° C., for 1 to 20 minutes, preferably at 80 to 120° C., for 1 to 10 minutes to form a thin film. The thickness of this coated film is 10 to 200 nm and the thickness of 20 to 150 nm is preferable.

The substrate suitable for the present invention is silicon substrate, a substrate provided with a metal-vapor deposited film or a metal-containing film, more suitably a substrate provided with a vapor-deposited film by Cr, MoSi, TaSi, or the oxide or the nitride thereof on the surface.

In addition, the present invention includes resist coated mask blanks having the resist film obtained as described above. The examples of the transparent substrate used for obtaining such resist coated mask blanks can include transparent substrates such as quartz and calcium fluoride, and the like. Generally, on the substrate, the intended one from the functional films called a light-shielding film, an antireflection film, further a phase shift film, additionally an etching stopper film or an etching mask film is laminated. As the functional film, a film containing transition metals such as silicon, chrome, molybdenum, zirconium, tantalum, tungsten, titanium, niobium is laminated thereon. In addition, the examples of the material used for an outermost layer include a material which has, as a main constituent material, a material containing silicon or silicon and oxygen and/or nitrogen; a silicon compound a material which has, as a main constituent material, a material further containing transition metals in addition thereto; and a transition metal compound material which has, as a main constituent material, transition metals, in particular, at least one selected from chrome, molybdenum, zirconium, tantalum, tungsten, titanium and niobium, and the like, or a material further containing at least one selected from oxygen, nitrogen and carbon in addition thereto.

While the light-shielding film may be monolayer, a multi-layer structure including the laminated plural materials is more preferable. In a case of the multilayer structure, while the film thickness per layer is not particularly limited, the thickness of 5 nm to 100 nm is preferable, and 10 nm to 80 nm is more preferable. While the thickness of the entire light-shielding film is not particularly limited, the thickness of 5 nm to 200 nm is preferable, and 10 nm to 150 nm is more preferable.

In general, in a case where a pattern forming is performed on the photomask blanks which have a material containing oxygen or nitrogen together with chrome on the outermost layer thereof, by using chemical amplification type resist composition, the obtained constricted pattern is formed near the substrate, so-called undercut shape is likely to produced, whereas in a case where the composition of the present invention is used, as compared with those of the prior art, the problem of undercut can be improved.

Then, the actinic rays or radiation (an electron beam, and the like) is irradiated to this resist film, and preferably the baking (usually 80 to 150 C.°, more preferably 90 to 130 C.°) is performed and thereafter is developed. By this, good pattern can be obtained. Additionally, using this pattern as a mask, an appropriate etching treatment and ion implantation and the like are performed to construct semiconductor microcircuits and a mold structure for imprint, and the like.

In addition, with regard to the process of a case of producing the mold for imprint by using the composition of the present invention, it is disclosed in for example JP4109085B, JP 2008-162101A and, "The Basis and the Technological Development and the Deployment of Application of Nanoimprint—the Fundamental Technology and the Latest Deployment of Technology of Nanoimprint—Editor: Yoshihiko HIRAI, Publisher: Frontier".

The usage types of the chemical amplification type resist composition and a method of forming a resist pattern according to the present invention are then described.

The present invention also embraces a method of forming a resist pattern which includes exposing the resist film or the resist coated mask blanks, and developing the exposed resist film or the resist coated mask blanks. In the present invention, it is preferable that the exposure be performed by using an electron beam or extreme ultraviolet ray. In addition, the present invention also includes a chemical amplification type resist composition which is used in the resist pattern forming method.

In the production of precision integrated circuit element, and the like, as for the exposure onto the resist film (a pattern forming process), first, it is preferable that the irradiation with an electron beam or extreme ultraviolet ray (EUV) onto the resist film of the present invention be performed in a pattern profile. The exposure amount is, in a case of an electron beam, approximately 0.1 to 20 $\mu C/cm^2$, preferably approximately 3 to 15 $\mu C/cm^2$, and in a case of an extreme ultraviolet ray, approximately 0.1 to 20 $mJ/cm^2$, preferably approximately 3 to 15 $mJ/cm^2$. Then, on hot plates, at 60 to 150° C. for 1 to 20 minutes, preferably 80 to 120° C. for 1 to 10 minutes, the heating after the exposure (post exposure baking) is performed, and subsequently, developing, rinsing and drying are performed to form a resist pattern. A developing solution is preferably 0.1 to 5% by mass, more preferably 2 to 3% by mass an alkaline aqueous solution of, such as tetramethyl ammonium hydroxide (TMAH) and tetrabutyl ammonium hydroxide (TBAH), and preferably for 0.1 to 3 minutes, more preferably for 0.5 to 2 minutes, the developing is performed by a conventional method such as dip method, puddle method, and spray method. To the alkaline developing solution, alcohols and/or surfactants may be added in an appropriate amount. Thus, in a case where the chemical amplification type resist composition of the present invention is a negative type, the unexposed portions of the resist film are dissolved, and the exposed portions thereof are cross-linked by the high molecular compound, and thus become insoluble in the developing solution, thereby forming a pattern on the substrate. In a case where the chemical amplification type resist composition of the present invention is a positive type, the exposed portions of the resist film are dissolved in the developing solution, and the unexposed portions thereof become insoluble in the developing solution, thereby forming the desired pattern on the substrate.

EXAMPLES

Next, the present invention is described in detail by referring to Examples, but the present invention should not be construed as being limited thereto.

(I) Example as a Positive Chemical Amplification Resist (Electron Beam)

1. Synthesis Examples of High Molecular Compound (A) ((A) Component)

Synthesis Example 1

Synthesis of High Molecular Compound (P1)

At first, 20 g of poly(p-hydroxystyrene), available from Nippon Soda K.K. (VP8000) was dissolved in 120 mL of acetone, 10.2 g of 1-chloro-2,3-dihydro-1H-indene, 11.5 g of potassium carbonate and 250 mg of sodium iodide were added thereto, and the mixture was stirred at 50° C. for 8 hours. The resulting reaction solution was left standing at room temperature and then 100 mL of ethyl acetate and 100 mL of distilled water were added thereto, and while stirring the reaction solution in ice water, 1N aqueous solution of HCl was added dropwise to the reaction solution to neutralize the solution. The reaction solution was transferred to a separated funnel, and 100 mL of ethyl acetate and 100 mL of distilled water were further added thereto, the mixture was stirred, and then an aqueous layer was removed. Thereafter, an organic layer was washed with 200 mL of distilled water 5 times and then the organic layer was concentrated. The resulting concentrate was dropped into 3 L of hexane, and the reactant was precipitated. The resulting precipitate was separated by filtration, and dried under vacuum to obtain 10.6 g of High Molecular Compound (P1).

In addition, High Molecular compounds (P2) to (P7), (P11), and Comparative High Molecular Compounds (P1) and (P2) were synthesized in the same manner as in High Molecular Compound (P1).

With regard to the obtained high molecular compound, the compositional ratio (molar ratio) of the high molecular compound was determined by $^1$H-NMR measurement. In addition, the weight-average molecular weight (Mw: in terms of polystyrene), the number-average molecular weight (Mn: in terms of polystyrene) and the dispersity (Mw/Mn, hereinafter, also referred to as "PDI") of the high molecular compound were determined by GPC (solvent: THF) measurement. The weight-average molecular weight and the dispersity are shown below in Tables 2, and 3, together with the chemical formula and the compositional ratio of the high molecular compound.

Synthesis Example 2

Synthesis of High Molecular Compound (P10)

<<Synthesis of Monomer>>
(Synthesis of p-hydroxystyene (A))

First, 100.00 part by mass of p-acetoxystyrene was dissolved in 400 part by mass of ethyl acetate, the resulting solution was cooled at 0° C., 47.60 part by mass of sodium methoxide (28% by mass of methanol solution) was dropped thereto over 30 minutes, and stirred at room temperature for 5 hours. Ethyl acetate added to the resulting reaction solution, the organic layer was washed with distilled water 3 times, and thereafter, dried with anhydrous sodium sulfate, and then the solvent was removed to obtain 131.70 part by mass of p-hydroxystyene (54% by mass of ethyl acetate solution).

(Synthesis of Compound (X))

First, 100.00 g of the following Compound (5) was dissolved in 400 g of ethyl acetate. The resulting solution was cooled to 0° C., 47.60 part by mass of sodium methoxide (28% by mass of methanol solution) was dropped thereto over 30 minutes. Thereafter, this was stirred at room temperature over 5 hours. Ethyl acetate was added to the resulting reaction solution, the organic layer was washed with distilled water 3 times, and thereafter, dried with anhydrous sodium sulfate, and then the solvent was removed. Thus, 131.70 g of the following Compound (6) (54% by mass of ethyl acetate solution) was obtained.

Second, To 18.52 g of the Compound (6) (54% by mass of ethyl acetate solution), 56.00 g of ethyl acetate was added. Thereto, 31.58 g of 1,1,2,2,3,3-hexafluoropropane-1,3-disulfonyl difluoride was added, and the solution was cooled to 0° C. To the resulting reaction solution, a solution of 12.63 g of triethyleneamine dissolved in 25.00 g of ethyl acetate was dropped over 30 minutes, and this was stirred over 4 hours while maintaining the solution temperature of 0° C. Ethyl acetate was added thereto, the organic layer was washed with a saturated saline solution 3 times, and thereafter, dried with anhydrous sodium sulfate, and then the solvent was removed. Thus, 32.90 g of the following Compound (7) was obtained.

Third, 35.00 g of the Compound (7) was dissolved in 315 g of methanol, the solution was cooled to 0° C., and 245 g of 1N an aqueous solution of sodium hydroxide was added thereto, and the mixture was stirred at room temperature for 2 hours. After the removal of the solvent from the resulting reaction solution, ethyl acetate was added thereto, and the organic layer was washed with a saturated saline solution 3 times. The washed solution was dried with anhydrous sodium sulfate, and then the solvent was removed. Thus, 34.46 g of the following Compound (8) was obtained.

Fourth, 28.25 g of the Compound (8) was dissolved in 254.25 g of methanol, 23.34 g of triphenylsulfonium bromide was added thereto, and the mixture was stirred at room temperature for 3 hours. The solvent was removed from the resulting reaction solution, distilled water was added thereto, and the reaction mixture was extracted with chloroform 3 times. The resulting organic layer was washed with distilled water 3 times, and then the solvent was removed. Thus, 42.07 g of the following Compound (X) was obtained.

The structures of Compounds (5) to (8), and Compound (X) are shown below.

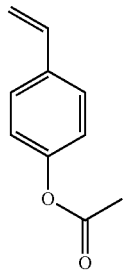

5

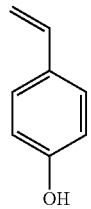

6

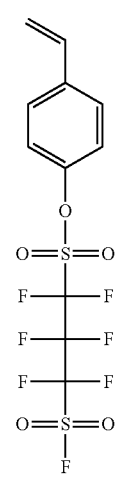

7

-continued

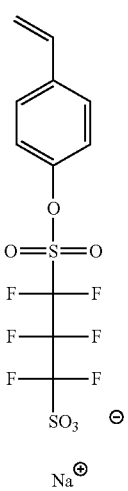

8

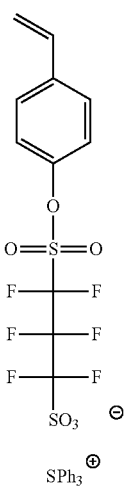

X

<<Synthesis of High Molecular Compound (P10)>>

First, 9.01 g of p-hydroxystyrene (A) (53.1% by mass of propylene glycol monomethyl ether solution), 4.86 g of Compound (B), 10.15 g of Compound (X), 10.15 g of Compound (C), and 2.42 g of polymerization initiator V-601 (available from Wako Pure Chemical Industries, Ltd.) were dissolved in 48.4 g of propylene glycol monomethyl ether (PGME). The reaction vessel to which 12.1 g of PGME had been introduced was heated to 85° C., and then the resulting dissolved solution was dropped thereto over 2 hours under nitrogen atmosphere. The reaction solution was heated and stirred over 4 hours, and then this was cooled to room temperature.

The resulting reaction solution was diluted by adding 33 g of acetone. The diluted solution was dropped into 1000 g of hexane/ethyl acetate (mass ratio of 8/2) to precipitate the polymer and filter off the precipitate. Subsequently, 250 g of hexane/ethyl acetate (mass ratio of 8/2) was used to perform the washing over the filtered solid. The resulting solid was dissolved in 33 g of acetone, and the solution was dropped into 600 g of methanol/distilled water (mass ratio of 1/9) to precipitate the polymer and filter off the precipitate. Then, 150 g of methanol/distilled water (mass ratio of 1/9) was used to perform the washing over the filtered solid. Thereafter, the washed solid was dried under reduced pressure to obtain 11.31 g of High Molecular Compound (P 10).

The structures of the monomers used in the synthesis of High Molecular Compound (P10) of Synthesis Example 2 are shown in Table 1.

Each of High Molecular Compounds (P8) and (P9) were synthesized in the same manner as in Synthesis Example 2 except for using each monomer having a structure shown in Table 1.

With regard to the obtained High Molecular Compounds (P8) to (P10), the compositional ratios (molar ratios) of the high molecular compounds were determined by $^1$H-NMR measurement. In addition, the weight-average molecular weights (Mw: in terms of polystyrene), the number-average molecular weights (Mn: in terms of polystyrene) and the dispersities (Mw/Mn, hereinafter, also referred to as "PDI") of the high molecular compounds were determined by GPC (solvent: THF) measurement. The weight-average molecular weights and the dispersities are shown below in Tables 2, and 3, together with the chemical formulae and the compositional ratios of the high molecular compounds.

TABLE 1

| High Molecular Compound | Monomer | | | | Prepared Molar Ratio |
|---|---|---|---|---|---|
| High Molecular Compound (P10) | 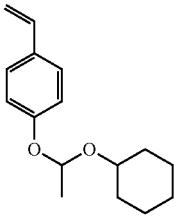 X | 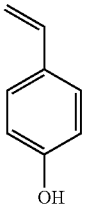 B | 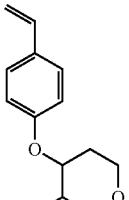 A | 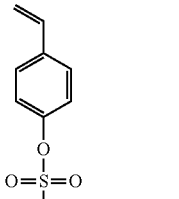 C | 10/20/50/20 |

TABLE 1-continued
| High Molecular Compound | Monomer | Prepared Molar Ratio |
|---|---|---|
| High Molecular Compound (P8) | 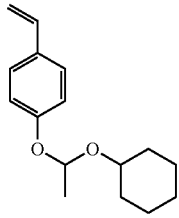 [SMILES: C=Cc1ccc(OC(C)OC2CCCCC2)cc1] | 10/70/10/10 |
| High Molecular Compound (P9) | 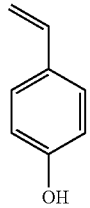 | 20/50/20/10 |
TABLE 2
| High Molecular Compound | Chemical Formula | Compositional Ratio (Molar Ratio) | Weight-Average Molecular Weight | Dispersity |
|---|---|---|---|---|
| High Molecular Compound (P1) | 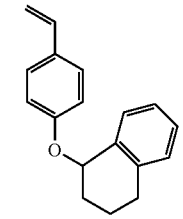 [SMILES: C=Cc1ccc(OC2CCCc3ccccc32)cc1] | 25/75 | 9100 | 1.1 |
| High Molecular Compound (P2) | 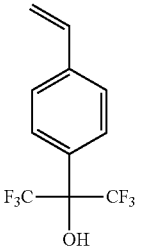 [SMILES: C=Cc1ccc(C(O)(C(F)(F)F)C(F)(F)F)cc1] | 30/70 | 9200 | 1.1 |

TABLE 2-continued

| High Molecular Compound | Chemical Formula | | | Compositional Ratio (Molar Ratio) | Weight-Average Molecular Weight | Dispersity |
|---|---|---|---|---|---|---|
| High Molecular Compound (P3) | [styrene with p-O-chroman-4-yl substituent] | [p-hydroxystyrene] | | 25/75 | 4000 | 1.1 |
| High Molecular Compound (P4) | [styrene with p-O-CH(CH₃)-phenyl substituent] | [p-hydroxystyrene] | | 30/70 | 9300 | 1.1 |
| High Molecular Compound (P5) | [styrene with p-O-(7-methoxychroman-4-yl) substituent] | [p-hydroxystyrene] | | 20/80 | 9200 | 1.1 |
| High Molecular Compound (P6) | [styrene with m-O-CH(CH₃)-(4-methoxyphenyl) substituent] | [m-hydroxystyrene] | [1-naphthyl ethylene] | 20/70/10 | 9100 | 1.1 |
| High Molecular Compound (P7) | [styrene with m-O-CH(CH₃)-(4-methoxyphenyl) substituent] | [m-hydroxystyrene] | | 30/70 | 6000 | 1.1 |

TABLE 2-continued

| High Molecular Compound | Chemical Formula | Compositional Ratio (Molar Ratio) | Weight-Average Molecular Weight | Dispersity |
|---|---|---|---|---|
| High Molecular Compound (P8) | (structures shown) | 10/70/10/10 | 8000 | 1.5 |

TABLE 3

| High Molecular Compound | Chemical Formula | Compositional Ratio (Molar Ratio) | Weight-Average Molecular Weight | Dispersity |
|---|---|---|---|---|
| High Molecular Compound (P9) | (structures shown) | 20/50/20/10 | 5000 | 1.5 |
| High Molecular Compound (P10) | (structures shown) | 10/20/50/20 | 9900 | 1.5 |

TABLE 3-continued

| High Molecular Compound | Chemical Formula | | Compositional Ratio (Molar Ratio) | Weight-Average Molecular Weight | Dispersity |
|---|---|---|---|---|---|
| High Molecular Compound (P11) | (p-hydroxystyrene unit) | (styrene with 3-methyl-2,3-dihydrobenzofuran-3-yloxy substituent) | 70/30 | 5000 | 1.5 |
| High Molecular Compound (P12) | (styrene with 1-(naphthalen-1-yl)ethoxy substituent) | (p-hydroxystyrene unit) | 30/70 | 5000 | 1.1 |
| High Molecular Compound (P1) | (p-hydroxystyrene unit) | (styrene with 1-ethoxyethoxy substituent) | 40/60 | 8800 | 1.1 |
| High Molecular Compound (P2) | (p-hydroxystyrene unit) | (acrylate with indanyl ester) | 40/60 | 9100 | 1.1 |

2. Example

Example 1P

(1) Preparation of Support

A 6-inch wafer on which chromium oxide had been vapor-deposited (wafer which has been subjected to the shielding film treatment used for the conventional photomask) was prepared.

(2) Preparation of Resist Coating Solution (Composition of Positive Resist Composition P1)

| | |
|---|---|
| High Molecular Compound (P1) | 0.60 g |
| Photoacid Generator (z42) (formula thereof is described below) | 0.12 g |
| Tetrabutylammonium hydroxide (B1: Basic Compound) | 0.002 g |
| Surfactant PF6320 (available from OMNOVA Solutions Inc) | 0.001 g |
| Propylene glycol monomethyl ether acetate (S1: Solvent) | 9.0 g |

The mixture of the above-described each component was subjected to the microfiltration through a membrane filter having a pore size of 0.04 μm to obtain a resist coating solution.

(3) Production of Resist Film

The resist coating solution was coated on the 6-inch wafer using a spin coater, Mark 8 available from Tokyo Electron Ltd., and dried on a hot plate at 110° C. for 90 seconds to obtain a resist film having a film thickness of 100 nm. That is to say, resist coated mask blanks was obtained.

(4) Production of Positive Resist Pattern

This resist film was pattern-irradiated with electron beams by using an electron beam lithography apparatus (HL750, available from Hitachi Ltd., accelerating voltage: 50 KeV). After the irradiation, the resist film was heated on a hot plate at 120° C. for 90 seconds, dipped for 60 seconds using 2.38% by mass of an aqueous solution of tetramethylammonium hydroxide (TMAH), and then rinsed with water for 30 seconds and dried.

(5) Evaluation of Resist Pattern

The sensitivity, resolution, pattern profile, line edge roughness (LER) and dry etching resistance of the obtained pattern were evaluated by the following methods.

[Sensitivity]

The cross-sectional profile of the obtained pattern was observed using a scanning electron microscope (S-4300, available from Hitachi Ltd.). The exposure amount (electron beam irradiation amount) in a case of resolving a resist pattern having a 100 nm line width (line:space=1:1) was defined as the sensitivity. The smaller this value, the higher the sensitivity.

[Evaluation of Resolving Power (LS)]

The limiting resolving power (the minimum line width when the line and the space (line:space=1:1) were separated and resolved) in the irradiation amount showing the aforementioned sensitivity (electron beam irradiation amount) was defined as LS resolving power.

[Evaluation of Resolving Power (IL)]

The limiting resolving power (the minimum line width when the line and the space (line:space=1:>100) were separated and resolved) in the minimum exposure amount in a case of resolving an independent line pattern having a 100 nm line width (line:space=1:>100) was defined as IL resolving power (nm).

[Pattern Profile]

The cross-sectional profile of a line pattern having a 100 nm line width (L/S=1/1) in the exposure amount showing the aforementioned sensitivity (electron beam irradiation amount) was observed using a scanning electron microscope (S-4300, available from Hitachi Ltd.). In the cross-sectional profile of the line pattern, when the ratio represented by "the line width in the bottom part of the line pattern (bottom)/the lined width in the middle part of the line pattern (half height position of the height of the line pattern)" is 1.5 or more, it is evaluated as "tapered"; when the ratio is at least 1.2 less than 1.5, it is evaluated as "slightly tapered"; and when the ratio is less than 1.2, it is evaluated as "rectangular".

[Line Edge Roughness (LER)]

The line pattern having a 100 nm line width (L/S=1/1) was formed in the irradiation amount showing the aforementioned sensitivity (electron beam irradiation amount). And, with respect to the region of 50 μm in the longitudinal direction of thereof, the distance from a reference line where the edge should be present was measured at arbitrary 30 points by a scanning electron microscope (S-9220, available from Hitachi, Ltd.). In addition, the standard deviation of the distance was determined, and 36 was computed. It is shown that the smaller the value, the performance is better.

[Evaluation of Dry Etching Resistance]

An unexposed resist film was subjected to dry etching using an Ar/C$_4$F$_6$/O$_2$ gas (a mixed gas having a volume ratio 100/4/2) for 30 seconds with HITACHI U-621. Thereafter, the residual film rate of the resist was measured and this value is used as an index of evaluating dry etching resistance.

Very good: 95% or more of residual film rate

Good: at least 90% less than 95%

Poor: less than 90%

Example 2P to Example 22P, Comparative Example 1P, and Comparative Example 2P

Except for the components listed in the following Table 4, in the same manner as in Example 1P, the preparation of the resist coating solutions (Positive Resist Compositions P2 to P22, Positive Resist Comparative Compositions P1 and P2), the production of positive resist patterns, and the evaluation thereof were performed.

TABLE 4

(Exposure to Electron Beam: Positive Type)

| Composition | High Molecular Compound | Photoacid Generator | Basic Compound | Solvent |
|---|---|---|---|---|
| P1 | P1 (0.6 g) | z42 (0.12 g) | B1 (0.002 g) | S1 (9.0 g) |
| P2 | P2 (0.6 g) | z42 (0.12 g) | B1 (0.002 g) | S2/S1 (5.0 g/4.0 g) |
| P3 | P3 (0.6 g) | z42 (0.12 g) | B1 (0.002 g) | S2/S3 (5.0 g/4.0 g) |
| P4 | P4 (0.6 g) | z42 (0.12 g) | B1 (0.002 g) | S2/S1 (5.0 g/4.0 g) |
| P5 | P5 (0.6 g) | z42 (0.12 g) | B1 (0.002 g) | S2/S1 (5.0 g/4.0 g) |
| P6 | P6 (0.6 g) | z42 (0.12 g) | B1 (0.002 g) | S2/S4 (5.0 g/4.0 g) |
| P7 | P7 (0.6 g) | z42 (0.12 g) | B1 (0.002 g) | S2/S5 (5.0 g/4.0 g) |
| P8 | P8 (0.6 g) | z42 (0.12 g) | B1 (0.002 g) | S2/S1 (5.0 g/4.0 g) |
| P9 | P9 (0.6 g) | z42 (0.12 g) | B1 (0.002 g) | S2/S3 (5.0 g/4.0 g) |
| P10 | P10 (0.72 g) | None | B1 (0.002 g) | S1/S3 (5.0 g/4.0 g) |
| P11 | P11 (0.6) | z42 (0.12 g) | B1 (0.001 g) | S2/S3 (5.0 g/4.0 g) |
| P12 | P3 (0.6) | z2 (0.12 g) | B2 (0.008 g) | S2/S7 (5.0 g/4.0 g) |
| P13 | P3/P5 (0.3 g/0.3 g) | z37 (0.12 g) | B4 (0.002 g) | S2/S1 (5.0 g/4.0 g) |
| P14 | P3 (0.6 g) | z45 (0.12 g) | B5 (0.002 g) | S2/S1 (5.0 g/4.0 g) |
| P15 | P3 (0.6 g) | z49/z58 (0.06 g/0.06 g) | B6 (0.002 g) | S2/S1 (5.0 g/4.0 g) |
| P16 | P3 (0.6 g) | z61 (0.12 g) | B3 (0.002 g) | S2/S1 (5.0 g/4.0 g) |
| P17 | P3 (0.6 g) | z63 (0.12 g) | B1 (0.002 g) | S2/S1 (5.0 g/4.0 g) |

TABLE 4-continued (Exposure to Electron Beam: Positive Type)

| Composition | High Molecular Compound | Photoacid Generator | Basic Compound | Solvent |
|---|---|---|---|---|
| P18 | P3 (0.6 g) | z65 (0.12 g) | B1 (0.002 g) | S2/S1 (5.0 g/4.0 g) |
| P19 | P3 (0.6 g) | z5 (0.12 g) | B1 (0.002 g) | S2/S1 (5.0 g/4.0 g) |
| P20 | P3 (0.6 g) | z8 (0.12 g) | B1/B6 (0.001 g/0.001 g) | S2/S1 (5.0 g/4.0 g) |
| P21 | P3 (0.6 g) | z66 (0.12 g) | B1 (0.002 g) | S2/S1 (5.0 g/4.0 g) |
| P22 | P12 (0.6 g) | z42 (0.12 g) | B1 (0.002 g) | S1 (9.0 g) |

TABLE 5

(Exposure to Electron Beam: Positive Type)

| Composition | High Molecular Compound | Photoacid Generator | Basic Compound | Solvent |
|---|---|---|---|---|
| Comparative Composition P1 | Comparative High Molecular Compound (P1) (0.6 g) | z2 (0.12 g) | B2 (0.002 g) | S1 (9.0 g) |
| Comparative Composition P2 | Comparative High Molecular Compound (P2) (0.6 g) | z2 (0.12 g) | B2 (0.002 g) | S1 (9.0 g) |

The abbreviations of each of the components used in the above and the following Examples/Comparative Examples are listed below.

Photoacid Generator (Compound (B))]

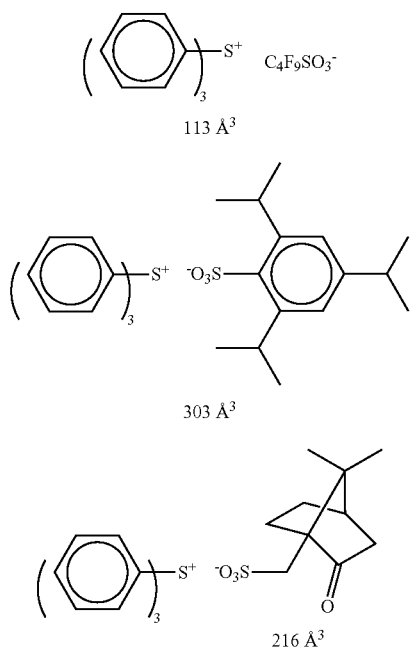

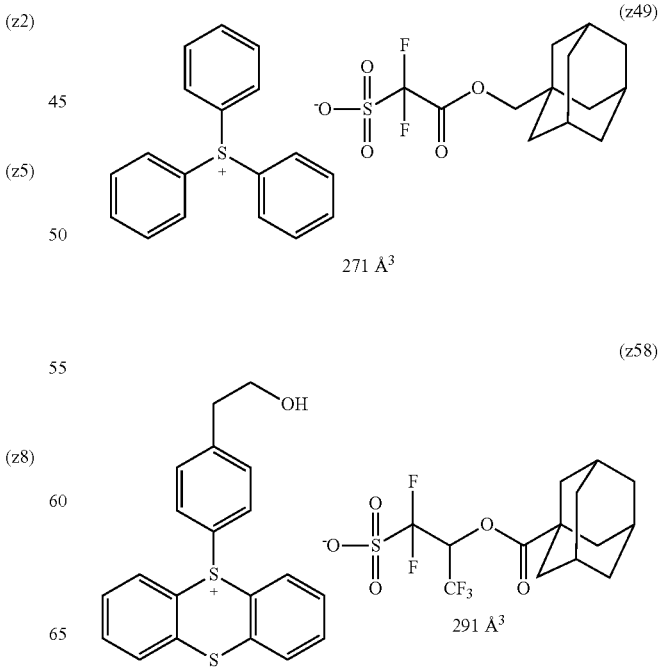

-continued (z61)
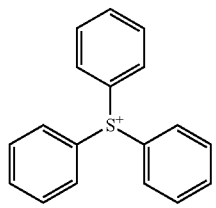
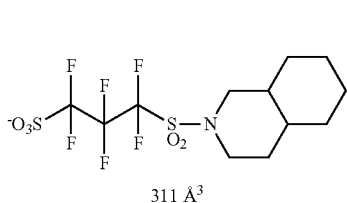
311 Å³

(z63)
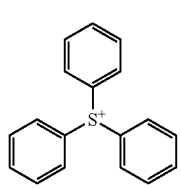
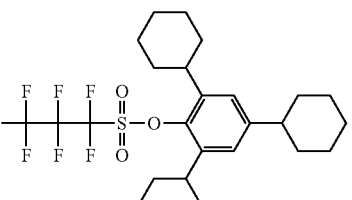
535 Å³

(z65)
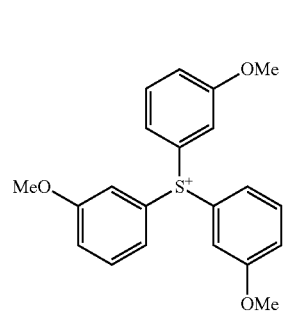
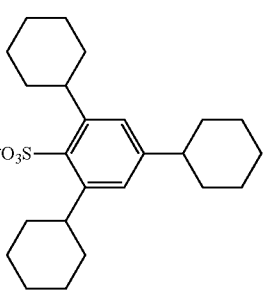
437 Å³

(z66)
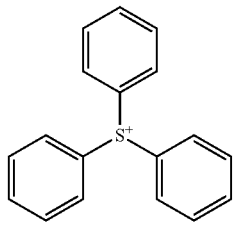
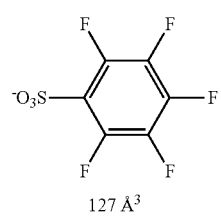
127 Å³

[Basic Compound]
B1: Tetrabutylammonium hydroxide
B2: Tri(n-octyl)amine
B3: 2,4,5-triphenyl imidazole B4:
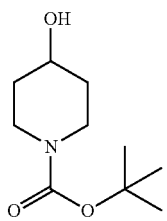

B5:
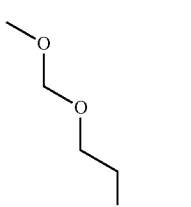
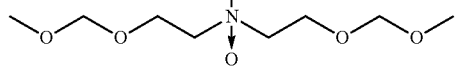

B6:
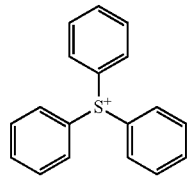
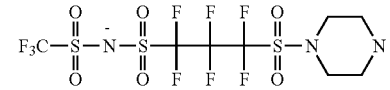

[Solvent]
S1: Propylene glycol monomethyl ether acetate (1-methoxy-2-acetoxy propane)
S2: Propylene glycol monomethyl ether (1-methoxy-2-propanol)
S3: 2-Heptanone
S4: Ethyl lactate
S5: Cyclohexanone
S6: γ-Butyrolactone
S7: Propylene carbonate The results of the evaluation are shown in Table 6.

TABLE 6

(Exposure to Electron Beam: Positive Type)

| Example | Composition | Sensitivity ($\mu$C/cm²) | LS Resolving Power (nm) | IL Resolving Power (nm) | Pattern Profile | LER (nm) | Dry Etching Resistance |
|---|---|---|---|---|---|---|---|
| 1P | P1 | 10.8 | 50 | 45 | rectangular | 4.5 | very good |
| 2P | P2 | 10.8 | 50 | 45 | rectangular | 4.5 | good |
| 3P | P3 | 10.8 | 50 | 45 | rectangular | 4.5 | very good |
| 4P | P4 | 10.7 | 50 | 45 | rectangular | 4.5 | good |
| 5P | P5 | 10.8 | 50 | 45 | rectangular | 4.5 | very good |
| 6P | P6 | 10.8 | 50 | 45 | rectangular | 4.5 | good |
| 7P | P7 | 10.7 | 50 | 45 | rectangular | 4.5 | good |
| 8P | P8 | 11.8 | 50 | 45 | rectangular | 4.5 | very good |
| 9P | P9 | 11.9 | 50 | 45 | rectangular | 4.5 | very good |

TABLE 6-continued (Exposure to Electron Beam: Positive Type)

| Example | Composition | Sensitivity ($\mu C/cm^2$) | LS Resolving Power (nm) | IL Resolving Power (nm) | Pattern Profile | LER (nm) | Dry Etching Resistance |
|---|---|---|---|---|---|---|---|
| 10P | P10 | 11.8 | 50 | 45 | rectangular | 4.5 | very good |
| 11P | P11 | 11.8 | 50 | 45 | rectangular | 4.5 | very good |
| 12P | P12 | 10.8 | 55 | 55 | rectangular | 5.0 | very good |
| 13P | P13 | 10.7 | 55 | 55 | rectangular | 5.0 | very good |
| 14P | P14 | 10.8 | 55 | 55 | rectangular | 5.0 | very good |
| 15P | P15 | 10.8 | 50 | 45 | rectangular | 5.0 | very good |
| 16P | P16 | 10.6 | 50 | 45 | rectangular | 5.0 | very good |
| 17P | P17 | 10.8 | 50 | 45 | rectangular | 4.5 | very good |
| 18P | P18 | 10.6 | 50 | 45 | rectangular | 4.5 | very good |
| 19P | P19 | 10.5 | 50 | 45 | rectangular | 4.5 | very good |
| 20P | P20 | 10.5 | 55 | 50 | rectangular | 4.5 | very good |
| 21P | P21 | 10.5 | 55 | 55 | rectangular | 4.5 | very good |
| 22P | P22 | 10.8 | 50 | 45 | rectangular | 4.5 | good |
| Comparative Example 1P | Comparative Composition P1 | 12.9 | 70 | 80 | tapered | 6.5 | poor |
| Comparative Example 2P | Comparative Composition P2 | 12.9 | 70 | 80 | slightly tapered | 6.0 | poor |

From the results shown in Table 6, it can be seen that the composition according to the present invention have a good sensitivity, resolving power, pattern profile, LER and dry etching resistance.

(II) Example as a Positive Chemical Amplification Resist (EUV)

Examples 1Q to 8Q, and, Comparative Examples 1Q and 2Q

Preparation of Resist Coating Solution

The positive resist compositions shown in the following Table 7 were filtered through a polytetrafluoroethylene filter having a pore size of 0.04 μm to obtain positive resist coating solutions.

Evaluation of Resist Pattern

The prepared positive resist coating solution was uniformly coated on a hexamethyldisilazane-treated silicon substrate by using a spin coater and dried by heating on a hot plate at 100° C. for 60 seconds to obtain a resist film having a film thickness of 0.05 μm.

The sensitivity, resolving power, pattern profile, line edge roughness (LER) and dry etching resistance of the obtained resist film were evaluated by the following methods.

[Sensitivity]

As for the obtained resist film, an exposure was performed using EUV ray (13 nm of wavelength), while varying the exposure amount, within a range of from 0 to 20.0 mJ/cm$^2$ in increment of 0.1 mJ/cm$^2$, via 6% halftone mask with a 100 nm line width having a line and space pattern of 1:1, and thereafter, baking was conducted at 110° C. for 90 seconds. Thereafter, the film was developed using 2.38% by mass of an aqueous solution of tetramethylammonium hydroxide (TMAH).

The exposure amount reproducing mask pattern having a line and space of 100 nm line width (L/S=1/1) was defined as the sensitivity. The smaller this value, the higher the sensitivity.

[Resolving Power (LS)]

The limiting resolving power (the minimum line width when the line and the space (line:space=1:1) were separated and resolved) in the exposure amount showing the aforementioned sensitivity was defined as LS resolving power (nm).

[Evaluation of Pattern Profile]

The cross-sectional profile of a line pattern having a 100 nm line width (L/S=1/1) in the exposure amount showing the aforementioned sensitivity was observed using a scanning electron microscope (S-4300, available from Hitachi Ltd.). In the cross-sectional profile, when the ratio represented by "the line width in the bottom part of the line pattern (bottom)/the line width in the middle part of the line pattern (half height position of the height of the line pattern)" is 1.5 or more, it is evaluated as "tapered"; when the ratio is at least 1.2 less than 1.5, it is evaluated as "slightly tapered"; and when the ratio is less than 1.2, it is evaluated as "rectangular".

[Line Edge Roughness (LER)]

With respect to the region of 50 μm in the longitudinal direction of a line pattern having a 100 nm line width (L/S=1/1) in the exposure amount showing the aforementioned sensitivity, the distance from a reference line where the edge should be present was measured at arbitrary 30 points by a scanning electron microscope (S-9220, available from Hitachi, Ltd.), and the standard deviation was determined, and 3σ was computed. It is shown that the smaller the value, the performance is better.

[Evaluation of Dry Etching Resistance]

An unexposed resist film was subjected to dry etching using an Ar/C$_4$F$_6$/O$_2$=gas (a mixed gas having a volume ratio 100/4/2) for 30 seconds with HITACHI U-621. Thereafter, the residual film rate of the resist was measured and this value is used as an index of evaluating dry etching resistance.

Very good: 95% or more of residual film rate

Good: at least 90% less than 95%

Poor: less than 90%

The results of the evaluation described above are shown in Table 7.

TABLE 7

(Exposure to EUV: Positive Type)

| Example | Composition | Sensitivity ($\mu C/cm^2$) | Resolving Power (nm) | Pattern Profile | LER (nm) | Dry Etching Resistance |
|---|---|---|---|---|---|---|
| 1Q | P1 | 10.8 | 45 | rectangular | 4.5 | very good |
| 2Q | P2 | 10.8 | 45 | rectangular | 4.5 | good |
| 3Q | P3 | 10.8 | 45 | rectangular | 4.5 | very good |
| 4Q | P10 | 11.5 | 45 | rectangular | 4.5 | very good |
| 5Q | P12 | 10.8 | 50 | rectangular | 5.0 | very good |
| 6Q | P15 | 10.8 | 45 | rectangular | 5.0 | very good |
| 7Q | P16 | 10.7 | 45 | rectangular | 5.0 | very good |
| 8Q | P17 | 10.8 | 45 | rectangular | 4.5 | very good |
| Comparative Example 1Q | Comparative Composition P1 | 12.9 | 70 | tapered | 6.5 | poor |
| Comparative Example 2Q | Comparative Composition P2 | 12.9 | 70 | slightly tapered | 6.0 | poor |

From the results shown in Table 7, it can be seen that the composition according to the present invention have a good sensitivity, resolving power, pattern profile, line edge roughness (LER) and dry etching resistance.

(III) Example as a Negative Chemical Amplification Resist (Electron Beam)

1. Synthesis Examples of High Molecular Compound (A) ((A) Component)

Synthesis Example 4

Synthesis of High Molecular Compound (A1)

First, 20 g of poly(p-hydroxystyrene), available from Nippon Soda K.K. (VP8000) was dissolved in 120 mL of acetone, 10.2 g of 1-chloro-2,3-dihydro-1H-indene, 6.1 g of potassium carbonate and 250 mg of sodium iodide were added thereto, and the mixture was stirred at 50° C. for 8 hours. The resulting reaction solution was left standing at room temperature and then 100 mL of ethyl acetate and 100 mL of distilled water were added thereto, and while stirring the reaction solution in ice water, 1N aqueous solution of HCl was added dropwise to the reaction solution to neutralize the solution. The reaction solution was transferred to a separated funnel, and 100 mL of ethyl acetate and 100 mL of distilled water were further added thereto, the mixture was stirred, and then an aqueous layer was removed. Thereafter, an organic layer was washed with 200 mL of distilled water 5 times and then the organic layer was concentrated. The resulting concentrate was dropped into 3 L of hexane, and the reactant was precipitated. The resulting precipitate was separated by filtration, and dried under vacuum to obtain 7.6 g of High Molecular Compound (A1).

In addition, other high molecular compounds were synthesized in the same manner as in High Molecular Compound (A1).

With regard to the obtained high molecular compound, the compositional ratio (molar ratio) of the high molecular compound was determined by $^1$H-NMR measurement. In addition, the weight-average molecular weight (Mw: in terms of polystyrene), the number-average molecular weight (Mn: in terms of polystyrene) and the dispersity (Mw/Mn, hereinafter, also referred to as "PDI") of the high molecular compound were determined by GPC (solvent: THF) measurement. The weight-average molecular weight and the dispersity are shown in the following tables, together with the chemical formula and the compositional ratio of the high molecular compound.

TABLE 8

| High Molecular Compound | Chemical Formula | Compositional Ratio (Molar Ratio) | Weight-Average Molecular Weight | Dispersity |
|---|---|---|---|---|
| High Molecular Compound (A1) | (structure with p-substituted phenyl-O-indanyl and p-hydroxyphenyl repeat units) | 15/85 | 3500 | 1.1 |

TABLE 8-continued
| High Molecular Compound | Chemical Formula | | Compositional Ratio (Molar Ratio) | Weight-Average Molecular Weight | Dispersity |
|---|---|---|---|---|---|
| High Molecular Compound (A2) | 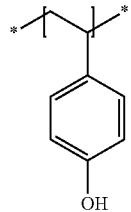 | | 90/10 | 3400 | 1.1 |
| High Molecular Compound (A3) | 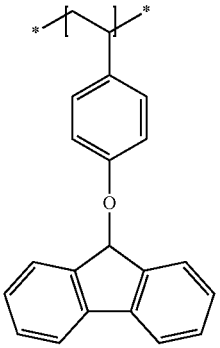 | | 10/90 | 5500 | 1.1 |
| High Molecular Compound (A4) | 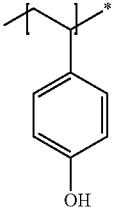 | | 90/10 | 3400 | 1.5 |
| High Molecular Compound (A5) | 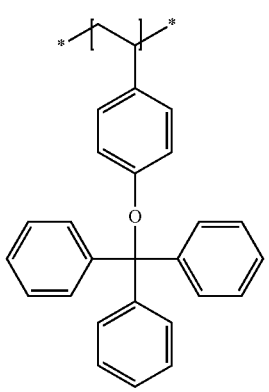 | | 90/10 | 3500 | 1.1 |

TABLE 8-continued

| High Molecular Compound | Chemical Formula | Compositional Ratio (Molar Ratio) | Weight-Average Molecular Weight | Dispersity |
|---|---|---|---|---|
| High Molecular Compound (P7) | 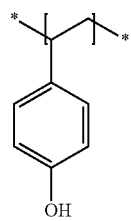 | 100 | 8200 | 1.1 |
| High Molecular Compound (P8) | 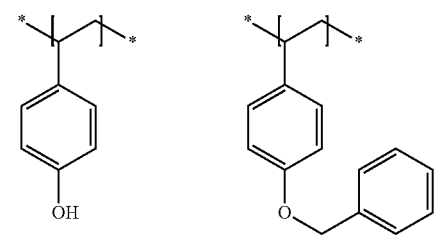 | 85/15 | 8500 | 1.1 |

2. Example

Example 1E (1) Preparation of Support

A 6-inch wafer on which cromium oxide had been vapor-deposited (wafer which has been subjected to the shielding film treatment used for the conventional photomask) was prepared.

(2) Preparation of Resist Coating Solution (Composition of Negative Resist Composition N1)

| | |
|---|---|
| High Molecular Compound (A1) | 0.60 g |
| Photoacid Generator (z42) (formula thereof is described above) | 0.12 g |
| Cross-linking agent CL-1 (formula thereof is described below) | 0.08 g |
| Cross-linking agent CL-5 (formula thereof is described below) | 0.04 g |
| Tetrabutylammonium hydroxide (B1:Basic Compound) | 0.002 g |
| 2-hydroxy-3-naphthoic acid (Organic carboxylic acid) | 0.012 g |
| Surfactant PF6320 (available from OMNOVA Solutions Inc) | 0.001 g |
| Propylene glycol monomethyl ether acetate (S1: Solvent) | 4.0 g |
| Propylene glycol monomethyl ether (S2: Solvent) | 5.0 g |

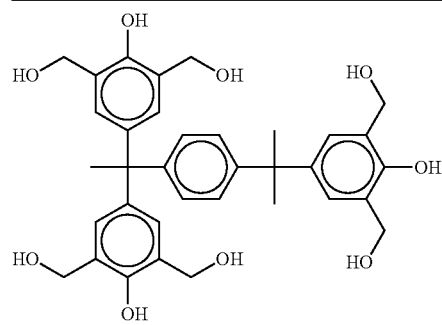

CL-1

-continued

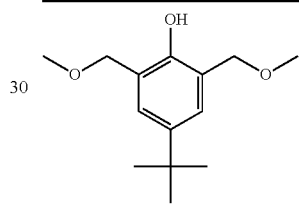

CL-5

The mixture of the above-described each component was subjected to the microfiltration through a membrane filter having a pore size of 0.04 μm to obtain a resist coating solution.

(3) Production of Resist Film

The resist coating solution was coated on the 6-inch wafer using a spin coater, Mark 8 available from Tokyo Electron Ltd., and dried on a hot plate at 110° C. for 90 seconds to obtain a resist film having a film thickness of 100 nm. That is to say, resist coated mask blanks was obtained.

(4) Production of Negative Resist Pattern

A pattern irradiation to this resist film was performed with electron beams by using an electron beam lithography apparatus (HL750, available from Hitachi Ltd., accelerating voltage: 50 KeV). After the irradiation, the resist film was heated on a hot plate at 120° C. for 90 seconds, dipped for 60 seconds using 2.38% by mass an aqueous solution of tetramethylammonium hydroxide (TMAH), and then rinsed with water for 30 seconds and dried.

(5) Evaluation of Resist Pattern

The sensitivity, resolution, pattern profile, line edge roughness (LER) and dry etching resistance of the obtained pattern were evaluated by the following methods.

[Sensitivity]

The cross-sectional profile of the obtained pattern was observed using a scanning electron microscope (S-4300, available from Hitachi Ltd.). The exposure amount (electron beam irradiation amount) in a case of resolving a resist pattern having a 100 nm line width (line:space=1:1) was defined as the sensitivity. The smaller this value, the higher the sensitivity.

[Resolving Power (LS)]

The limiting resolving power (the minimum line width when the line and the space (line:space=1:1) were separated and resolved) in the exposure amount showing the aforementioned sensitivity (electron beam irradiation amount) was defined as LS resolving power (nm).

[Resolving Power (IS)]

The limiting resolving power (the minimum space width when the space and the line (space:line=1:>100) were separated and resolved) in the minimum irradiation amount in a case of resolving an independent space pattern having a 100 nm space width (space:line=1:>100) was defined as IS resolving power (nm).

[Pattern Profile]

The cross-sectional profile of a line pattern having a 100 nm line width (L/S=1/1) in the exposure amount showing the aforementioned sensitivity (electron beam irradiation amount) was observed using a scanning electron microscope (S-4300, available from Hitachi Ltd.). In the cross-sectional profile of the line pattern, when the ratio represented by "the line width in the top part of the line pattern (surface part)/the line width in the middle part of the line pattern (half height position of the height of the line pattern)" is 1.5 or more, it is evaluated as "reverse tapered"; when the ratio is at least 1.2 less than 1.5, it is evaluated as "slightly reverse tapered"; and when the ratio is less than 1.2, it is evaluated as "rectangular".

[Line Edge Roughness (LER)]

The line pattern having a 100 nm line width (L/S=1/1) was formed in the irradiation amount showing the aforementioned sensitivity (electron beam irradiation amount). And, with respect to the region of 50 μm in the longitudinal direction of thereof, the distance from a reference line where the edge should be present was measured at 30 arbitrary points by a scanning electron microscope (S-9220, available from Hitachi, Ltd.). In addition, the standard deviation of the distance was determined, and 3σ was computed. It is shown that the smaller the value, the performance is better.

[Dry Etching Resistance]

The resist film formed by the entire exposure in the exposure amount (electron beam irradiation amount) showing the aforementioned sensitivity subjected to dry etching using an $Ar/C_4F_6/O_2$ gas (a mixed gas having a volume ratio 100/4/2) for 30 seconds with HITACHI U-621. Thereafter, the residual film rate was measured and this value is used as an index of evaluating dry etching resistance.

Very good: 95% or more of residual film rate
Good: at least 90% less than 95%
Poor: less than 90%

Example 2E to Example 12E, Comparative Example 1E, and Comparative Example 2E

In the preparation of the resist solutions, except for the components listed in the following Table 9, in the same manner as in Example 1E, the preparation of the resist solutions (Negative Resist Compositions N2 to N12, Negative Resist Comparative Compositions N1 and N2), the production of negative resist patterns, and the evaluation thereof were performed. The results of the evaluation are shown in Table 10.

TABLE 9

| Composition | High Molecular compound | Photoacid Generator | Basic Compound | Cross-linking agent | Solvent |
|---|---|---|---|---|---|
| N1 | A1 (0.6 g) | z42 (0.12 g) | B1 (0.002 g) | CL-1/CL-5 (0.08 g/0.04 g) | S2/S1 (5.0 g/4.0 g) |
| N2 | A2 (0.6 g) | z42 (0.12 g) | B1 (0.002 g) | CL-1/CL-5 (0.08 g/0.04 g) | S1/S3 (5.0 g/4.0 g) |
| N3 | A3 (0.6 g) | z42 (0.12 g) | B1 (0.002 g) | CL-1/CL-5 (0.08 g/0.04 g) | S2/S3 (5.0 g/4.0 g) |
| N4 | A4 (0.6 g) | z42 (0.12 g) | B1 (0.002 g) | CL-1/CL-5 (0.08 g/0.04 g) | S2/S7 (5.0 g/4.0 g) |
| N5 | A5 (0.6 g) | z42 (0.12 g) | B1 (0.002 g) | CL-1/CL-5 (0.08 g/0.04 g) | S2/S1 (5.0 g/4.0 g) |
| N6 | A2 (0.6 g) | z2 (0.12 g) | B2 (0.002 g) | CL-1 (0.12 g) | S2/S1 (5.0 g/4.0 g) |
| N7 | A2 (0.6 g) | z45 (0.12 g) | B4 (0.008 g) | CL-3/CL-1 (0.08 g/0.04 g) | S1/S2/S6 (4.0 g/4.0 g/1.0 g) |
| N8 | A2 (0.6 g) | z61 (0.12 g) | B5 (0.002 g) | CL-4 (0.12 g) | S1/S2/S5 (4.0 g/4.0 g/1.0 g) |
| N9 | A2 (0.6 g) | z63 (0.12 g) | B6 (0.002 g) | CL-1/CL-4 (0.18 g/0.04 g) | S1/S2/S4 (4.0 g/4.0 g/1.0 g) |
| N10 | A2 (0.6 g) | z65 (0.12 g) | B1 (0.002 g) | CL-1/CL-3 (0.18 g/0.04 g) | S2/S1 (5.0 g/4.0 g) |
| N11 | A1/A2 (0.3 g/0.3 g) | z5 (0.12 g) | B1/B6 (0.001 g/0.001 g) | CL-2 (0.12 g) | S2/S1 (5.0 g/4.0 g) |
| N12 | A2 (0.6 g) | z5/z48 (0.06 g/0.06 g) | B1 (0.002 g) | CL-4 (0.12 g) | S2/S1 (5.0 g/4.0 g) |
| Comparative Composition N1 | Comparative High Molecular Compound (A1) (0.6 g) | z2 (0.12 g) | B2 (0.002 g) | CL-1 (0.12 g) | S1 (9.0 g) |
| Comparative Composition N2 | Comparative High Molecular Compound (A2) (0.6 g) | z2 (0.12 g) | B2 (0.002 g) | CL-1 (0.12 g) | S1 (9.0 g) |

The formulae of Cross-linking agents CL-2 to CL-4C are shown below.

[Cross-Linking Agent]

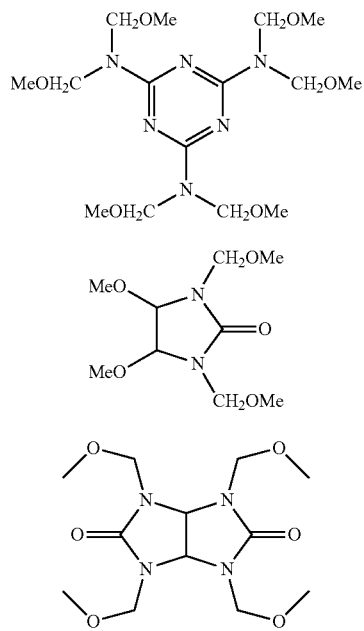

The results of the evaluation are shown in Table 10.

(IV) Example as a Negative Chemical Amplification Resist (EUV)

Examples 1F to 6F, and, Comparative Examples 1F and 2F

Preparation of Resist Coating Solution

The negative resist compositions shown in the following Table 11 were filtered through a polytetrafluoroethylene filter having a pore size of 0.04 μm to obtain negative resist coating solutions.

Evaluation of Resist

The prepared negative resist coating solution was uniformly coated on a hexamethyldisilazane-treated silicon substrate by using a spin coater and dried by heating on a hot plate at 100° C. for 60 seconds to obtain a resist film having a film thickness of 0.05 μm.

The sensitivity, resolving power, pattern profile, line edge roughness (LER) and dry etching resistance of the obtained resist film were evaluated by the following methods.

[Sensitivity]

As for the obtained resist film, an exposure was performed using EUV ray (13 nm of wavelength), while varying the exposure amount, within a range of from 0 to 20.0 mJ/cm$^2$ in increment of 0.1 mJ/cm$^2$, via 6% halftone mask with a pattern having a 100 nm line width having a line and space of 1:1, and thereafter, baking was conducted at 110° C. for 90 seconds. Thereafter, the film was developed using 2.38% by mass of an aqueous solution of tetramethylammonium hydroxide (TMAH).

TABLE 10

| | | | LS Resolving | IL Resolving | | | Dry |
| Example | Composition | Sensitivity (μC/cm$^2$) | Power (nm) | Power (nm) | Pattern Profile | LER (nm) | Etching Resistance |
| --- | --- | --- | --- | --- | --- | --- | --- |
| (Exposure to Electron Beam: Negative Type) | | | | | | | |
| 1E | N1 | 10.2 | 50 | 50 | rectangular | 4.5 | very good |
| 2E | N2 | 10.0 | 50 | 50 | rectangular | 4.5 | very good |
| 3E | N3 | 10.2 | 50 | 50 | rectangular | 4.5 | very good |
| 4E | N4 | 11.2 | 50 | 50 | rectangular | 4.5 | good |
| 5E | N5 | 10.2 | 50 | 50 | rectangular | 4.5 | good |
| 6E | N6 | 10.2 | 55 | 55 | slightly reverse tapered | 5.0 | good |
| 7E | N7 | 10.3 | 55 | 55 | rectangular | 5.0 | good |
| 8E | N8 | 10.2 | 50 | 50 | slightly reverse tapered | 5.0 | very good |
| 9E | N9 | 10.3 | 50 | 50 | rectangular | 5.0 | very good |
| 10E | N10 | 10.3 | 50 | 50 | rectangular | 4.5 | very good |
| 11E | N11 | 10.3 | 50 | 50 | slightly reverse tapered | 4.2 | very good |
| 12E | N12 | 10.2 | 55 | 55 | slightly reverse tapered | 4.5 | very good |
| Comparative Example 1E | Comparative Composition N1 | 12.8 | 70 | 80 | reverse tapered | 6.5 | poor |
| Comparative Example 2E | Comparative Composition N2 | 12.8 | 70 | 80 | reverse tapered | 6.0 | poor |

From the results shown in Table 10, it can be seen that the composition according to the present invention have a good sensitivity, resolving power, pattern profile, line edge roughness (LER) and dry etching resistance.

The exposure amount reproducing mask pattern having a line and space of a 100 nm line width (L/S=1/1) was defined as the sensitivity. The smaller this value, the higher the sensitivity.

[Resolving Power (LS)]

The limiting resolving power (the minimum line width when the line and the space (line:space=1:1) were separated and resolved) in the exposure amount showing the aforementioned sensitivity was defined as LS resolving power (nm).

[Pattern Profile]

The cross-sectional profile of a line pattern having a 100 nm line width (L/S=1/1) in the exposure amount showing the aforementioned sensitivity was observed using a scanning electron microscope (S-4300, available from Hitachi Ltd.). In the cross-sectional profile of the line pattern, when the ratio represented by "the line width in the top part of the line pattern (surface part)/the line width in the middle part of the line pattern (half height position of the height of the line pattern)" is 1.5 or more, it is evaluated as "reverse tapered"; when the ratio is at least 1.2 less than 1.5, it is evaluated as "slightly reverse tapered"; and when the ratio is less than 1.2, it is evaluated as "rectangular".

[Line Edge Roughness (LER)]

The line pattern having a 100 nm line width (L/S=1/1) was formed in the exposure amount showing the aforementioned sensitivity. And, with respect to the region of 50 μm in the longitudinal direction of thereof, the distance from a reference line where the edge should be present was measured at arbitrary 30 points by a scanning electron microscope (S-9220, available from Hitachi, Ltd.). In addition, the standard deviation of the distance was determined, and 3σ was computed. It is shown that the smaller the value, the performance is better.

[Dry Etching Resistance]

The resist film formed by the entire exposure in the exposure amount showing the aforementioned sensitivity was subjected to dry etching using an $Ar/C_4F_6/O_2$ gas (a mixed gas having a volume ratio 100/4/2) for 30 seconds with HITACHI U-621. Thereafter, residual film rate was measured and this value is used as an index of evaluating dry etching resistance.
Very good: 95% or more of residual film rate
Good: at least 90% less than 95%
Poor: less than 90%

The results of the evaluation described above are shown in Table 11.

From the results shown in Table 11, it can be seen that the composition according to the present invention have a good sensitivity, resolving power, pattern profile, line edge roughness (LER) and dry etching resistance.

What is claimed is:

1. A resist film formed by using a chemical amplification type resist composition comprising:

(A) a high molecular compound having a structure wherein a hydrogen atom of a phenolic hydroxyl group is substituted by a group represented by the following general formula (I);

(B) a compound generating an acid upon irradiation with actinic rays or radiation; and (C) an organic solvent, and the film thickness is 10 to 200 nm,

wherein, $R_1$ represents a hydrocarbon group, $R_2$ represents a hydrogen atom or a hydrocarbon group, and Ar represents an aryl group, provided that $R_1$ may also bind to Ar to form a ring which may also contain a heteroatom, and * represents a binding position with an oxygen atom of the phenolic hydroxyl group.

2. The resist film according to claim 1 used for an exposure to an electron beam or extreme ultraviolet rays.

3. The resist film according to claim 1, wherein the high molecular compound (A) contains a repeating unit represented by the following general formula (II):

TABLE 11

(Exposure to EUV: Negative Type)

| Example | Composition | Sensitivity (μC/cm²) | Resolving Power (nm) | Pattern Profile | LER (nm) | Dry Etching Resistance |
|---|---|---|---|---|---|---|
| 1F | N1 | 12.8 | 50 | rectangular | 4.5 | very good |
| 2F | N2 | 13.2 | 50 | rectangular | 4.5 | very good |
| 3F | N6 | 14.3 | 55 | slightly reverse tapered | 5.0 | very good |
| 4F | N7 | 13.1 | 55 | rectangular | 5.0 | very good |
| 5F | N8 | 14.0 | 50 | slightly reverse tapered | 5.0 | very good |
| 6F | N9 | 13.0 | 50 | rectangular | 5.0 | very good |
| Comparative Example 1F | Comparative Composition N1 | 15.8 | 70 | reverse tapered | 6.5 | poor |
| Comparative Example 2F | Comparative Composition N2 | 15.8 | 70 | reverse tapered | 6.0 | poor |

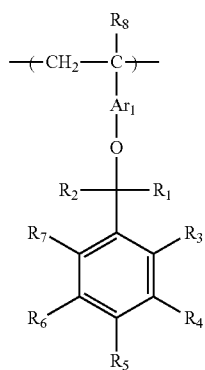

(II)

wherein, $Ar_1$ represents an arylene group, $R_1$ represents a hydrocarbon group, $R_2$ represents a hydrogen atom or a hydrocarbon group, each of $R_3$ to $R_7$ independently represents a hydrogen atom or a monovalent substituent, and $R_8$ represents a hydrogen atom or a hydrocarbon group, provided that $R_1$ may also bind to any of $R_3$ to $R_7$ to form a ring which may also contain a heteroatom.

4. The resist film according to claim 3, wherein the repeating unit represented by the general formula (II) is a repeating unit represented by the following general formula (V):

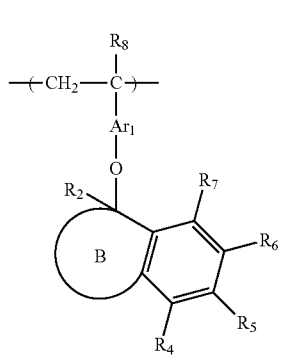

(V)

wherein, $Ar_1$ represents an arylene group, $R_2$ represents a hydrogen atom or a hydrocarbon group, each of $R_4$ to $R_7$ independently represents a hydrogen atom or a monovalent substituent, $R_8$ represents a hydrogen atom or a hydrocarbon group, and B represents an aliphatic hydrocarbon ring or an aliphatic hetero ring, which may be fused with an aromatic ring other than the benzene ring in the general formula (V).

5. The resist film according to claim 1, wherein the high molecular compound (A) further contains a repeating unit represented by the following general formula (III):

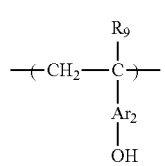

(III)

wherein $Ar_2$ represents an arylene group, and $R_9$ represents a hydrogen atom or a hydrocarbon group.

6. The resist film according to claim 1, wherein the acid generated from the compound (B) upon irradiation with actinic rays or radiation is an acid having a size of 130 Å³ or more in volume.

7. The resist film according to claim 1, wherein the high molecular compound (A) further contains a repeating unit which has a group generating an acid upon irradiation with actinic rays or radiation in a side chain thereof, and a compound which provides the repeating unit is the same as the compound (B).

8. The resist film according to claim 1, wherein the dispersity of the high molecular compound (A) is from 1.0 to 1.2.

9. The resist film according to claim 1, further comprising (D) a basic compound.

10. Resist coated mask blanks having the resist film according to claim 1.

11. A method of forming a resist pattern, comprising: exposing and developing the resist film according to claim 1.

12. A method of forming a resist pattern, comprising: exposing and developing the resist coated mask blanks according to claim 10.

13. The method of forming a resist pattern according to claim 11, wherein the exposing is performed by using an electron beam or extreme ultraviolet rays.

14. A chemical amplification type resist composition used in the method of forming a resist pattern according to claim 11.

15. The resist film according to claim 2, wherein the high molecular compound (A) contains a repeating unit represented by the following general formula (II):

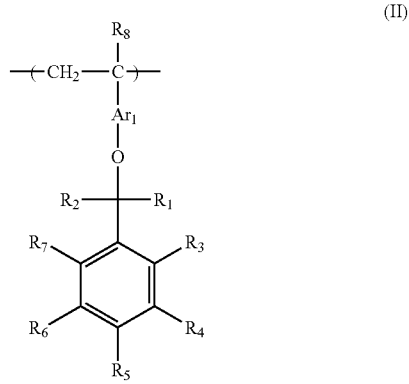

(II)

wherein, $Ar_1$ represents an arylene group, $R_1$ represents a hydrocarbon group, $R_2$ represents a hydrogen atom or a hydrocarbon group, each of $R_3$ to $R_7$ independently represents a hydrogen atom or a monovalent substituent, and $R_8$ represents a hydrogen atom or a hydrocarbon group, provided that $R_1$ may also bind to any of $R_3$ to $R_7$ to form a ring which may also contain a heteroatom.

16. The resist film according to claim 2, wherein the high molecular compound (A) further contains a repeating unit represented by the following general formula (III):

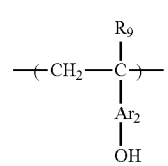

(III)

wherein $Ar_2$ represents an arylene group, and $R_9$ represents a hydrogen atom or a hydrocarbon group.

17. The resist film according to claim 2, wherein the acid generated from the compound (B) upon irradiation with actinic rays or radiation is an acid having a size of 130 $Å^3$ or more in volume.

18. The resist film according to claim 2, wherein the dispersity of the high molecular compound (A) is from 1.0 to 1.2.

19. The resist film according to claim 2, further comprising (D) a basic compound.

20. The method of forming a resist pattern according to claim 12, wherein the exposing is performed by using an electron beam or extreme ultraviolet rays.

* * * * *